(12) United States Patent
Yorikado et al.

(10) Patent No.: US 12,382,738 B2
(45) Date of Patent: Aug. 5, 2025

(54) LIGHT RECEIVING ELEMENT AND LIGHT RECEIVING DEVICE

(71) Applicant: SONY SEMICONDUCTOR SOLUTIONS CORPORATION, Kanagawa (JP)

(72) Inventors: Yuhi Yorikado, Kanagawa (JP);
Yoshiki Ebiko, Kanagawa (JP);
Suzunori Endo, Kanagawa (JP);
Nobuhiro Kawai, Kanagawa (JP);
Fumihiko Koga, Kanagawa (JP);
Nobuo Nakamura, Kanagawa (JP);
Sozo Yokogawa, Kanagawa (JP);
Hayato Wakabayashi, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 411 days.

(21) Appl. No.: 17/786,676

(22) PCT Filed: Dec. 14, 2020

(86) PCT No.: PCT/JP2020/046510
§ 371 (c)(1),
(2) Date: Jun. 17, 2022

(87) PCT Pub. No.: WO2021/131844
PCT Pub. Date: Jul. 1, 2021

(65) Prior Publication Data
US 2023/0013285 A1 Jan. 19, 2023

(30) Foreign Application Priority Data

Dec. 25, 2019 (JP) ................................. 2019-233694
Oct. 1, 2020 (JP) ................................. 2020-166685

(51) Int. Cl.
*H10F 39/00* (2025.01)
*G01S 7/4863* (2020.01)
*H10F 39/18* (2025.01)

(52) U.S. Cl.
CPC ...... *H10F 39/80373* (2025.01); *G01S 7/4863* (2013.01); *H10F 39/014* (2025.01);
(Continued)

(58) Field of Classification Search
CPC .... G01S 17/894; G01S 7/4863; G01S 7/4865; H04N 25/53; H10F 39/18
See application file for complete search history.

(56) References Cited

U.S. PATENT DOCUMENTS

2006/0084195 A1* 4/2006 Lyu .................. H01L 27/14603
257/E27.131
2009/0114919 A1 5/2009 Kawahito
(Continued)

FOREIGN PATENT DOCUMENTS

CN 105229790 A 1/2016
CN 110383480 A 10/2019
(Continued)

OTHER PUBLICATIONS

International Search Report and Written Opinion prepared by the Japan Patent Office on Feb. 25, 2021, for International Application No. PCT/JP2020/046510, 3 pgs.

*Primary Examiner* — Thanh Luu
(74) *Attorney, Agent, or Firm* — Sheridan Ross PC

(57) ABSTRACT

A light receiving element including: a semiconductor substrate; a photoelectric conversion unit (PD) in the semiconductor substrate that converts light into electric charges; a first electric charge accumulation unit (MEM) in the semiconductor substrate to which the electric charges are transferred from the photoelectric conversion unit; a first distri-
(Continued)

bution gate on a front surface of the semiconductor substrate that distributes the electric charges from the photoelectric conversion unit to the first electric charge accumulation unit; a second electric charge accumulation unit (MEM) in the semiconductor substrate to which the electric charges are transferred from the photoelectric conversion unit; and a second distribution gate on the front surface of the semiconductor substrate that distributes the electric charges from the photoelectric conversion unit to the second electric charge accumulation unit, in which the first and second distribution gates each have a pair of buried gate portions.

25 Claims, 32 Drawing Sheets

(52) U.S. Cl.
CPC .......... *H10F 39/18* (2025.01); *H10F 39/805* (2025.01); *H10F 39/8057* (2025.01); *H10F 39/8063* (2025.01); *H10F 39/807* (2025.01)

(56) References Cited

U.S. PATENT DOCUMENTS

| | | |
|---|---|---|
| 2009/0190017 A1 | 7/2009 | Ono |
| 2009/0290058 A1 | 11/2009 | Miyagawa |
| 2013/0076934 A1 | 3/2013 | Maeda |
| 2013/0214371 A1 | 8/2013 | Asatsuma |
| 2016/0112614 A1 | 4/2016 | Masuda et al. |
| 2016/0218138 A1 | 7/2016 | Oishi |
| 2016/0276612 A1* | 9/2016 | Gotanda ............... H10K 30/83 |
| 2016/0351606 A1 | 12/2016 | Azami et al. |
| 2017/0045618 A1* | 2/2017 | Mase ..................... H01L 31/12 |
| 2018/0012927 A1 | 1/2018 | Kido |
| 2018/0366504 A1 | 12/2018 | Jin |
| 2020/0135781 A1* | 4/2020 | Nakagawa ........ H01L 27/14603 |
| 2020/0185439 A1* | 6/2020 | Jin .................... H01L 27/14625 |

FOREIGN PATENT DOCUMENTS

| | | | |
|---|---|---|---|
| CN | 110546764 A | 12/2019 | |
| JP | 2005-347655 | 12/2005 | |
| JP | 2009-177092 | 8/2009 | |
| JP | 2009-283552 | 12/2009 | |
| JP | 2012-169530 | 9/2012 | |
| JP | 2013-069846 | 4/2013 | |
| JP | 2015-029054 | 2/2015 | |
| JP | 2015-153962 | 8/2015 | |
| JP | 2016-136584 | 7/2016 | |
| JP | 2019-004149 | 1/2019 | |
| KR | 20180136717 A | 12/2018 | |
| TW | I495095 B | 8/2015 | |
| TW | 201630173 A | 8/2016 | |
| WO | WO 2016/125601 | 8/2016 | |
| WO | WO 2018/198486 | 11/2018 | |
| WO | WO-2018198486 A1 * | 11/2018 | ........ H01L 27/14603 |
| WO | WO 2020/105634 | 5/2020 | |
| WO | WO 2020/241151 | 12/2020 | |

\* cited by examiner

LIGHT RECEIVING ELEMENT AND LIGHT RECEIVING DEVICE

CROSS REFERENCE TO RELATED APPLICATIONS

This application is a national stage application under 35 U.S.C. 371 and claims the benefit of PCT Application No. PCT/JP2020/046510, having an international filing date of 14 Dec. 2020, which designated the United States, which PCT application claimed the benefit of Japanese Patent Application Nos. 2019-233694, filed 25 Dec. 2019, and 2020-166685, filed 1 Oct. 2020, the entire disclosures of each of which are incorporated herein by reference.

FIELD

The present disclosure relates to a light receiving element and a light receiving device.

BACKGROUND

As a method for measuring a distance to a target object, a time of flight (ToF) sensor (light receiving device) has been known. For example, an indirect ToF sensor can measure a distance to a target object by irradiating the target object with irradiation light having a predetermined cycle and detecting a phase difference between the irradiation light and the reflected light. Then, in the ToF sensor, light reception is repeatedly performed a plurality of times at short intervals to increase a signal amount, such that a signal/noise (S/N) ratio can be increased, which enables highly accurate distance measurement.

CITATION LIST

Patent Literature

Patent Literature 1: JP 2019-4149 A

SUMMARY

Technical Problem

As described above, the ToF sensor (light receiving device) repeatedly performs light reception a plurality of times at short intervals in order to increase the S/N ratio. Therefore, electric charges generated by light reception in a photodiode built in the ToF sensor are required to be transferred at a high speed.

Therefore, in view of such a situation, the present disclosure proposes a light receiving element and a light receiving device capable of transferring electric charges at a high speed.

Solution to Problem

According to the present disclosure, a light receiving element is provided. The light receiving element includes: a semiconductor substrate; a photoelectric conversion unit which is provided in the semiconductor substrate and converts light into electric charges; a first electric charge accumulation unit which is provided in the semiconductor substrate and to which the electric charges are transferred from the photoelectric conversion unit; a first distribution gate which is provided on a front surface of the semiconductor substrate and distributes the electric charges from the photoelectric conversion unit to the first electric charge accumulation unit; a second electric charge accumulation unit which is provided in the semiconductor substrate and to which the electric charges are transferred from the photoelectric conversion unit; and a second distribution gate which is provided on the front surface of the semiconductor substrate and distributes the electric charges from the photoelectric conversion unit to the second electric charge accumulation unit. In the light receiving element, the first and second distribution gates each have a pair of buried gate portions buried in the semiconductor substrate.

Also, according to the present disclosure, a light receiving device is provided. The light receiving device includes one or more light receiving elements. In the light receiving device, the light receiving element includes: a semiconductor substrate; a photoelectric conversion unit which is provided in the semiconductor substrate and converts light into electric charges; a first electric charge accumulation unit which is provided in the semiconductor substrate and to which the electric charges are transferred from the photoelectric conversion unit; a first distribution gate which is provided on a front surface of the semiconductor substrate and distributes the electric charges from the photoelectric conversion unit to the first electric charge accumulation unit; a second electric charge accumulation unit which is provided in the semiconductor substrate and to which the electric charges are transferred from the photoelectric conversion unit; and a second distribution gate which is provided on the front surface of the semiconductor substrate and distributes the electric charges from the photoelectric conversion unit to the second electric charge accumulation unit. In the light receiving element, the first and second distribution gates each have a pair of buried gate portions buried in the semiconductor substrate.

DESCRIPTION OF EMBODIMENTS

Figure 1:
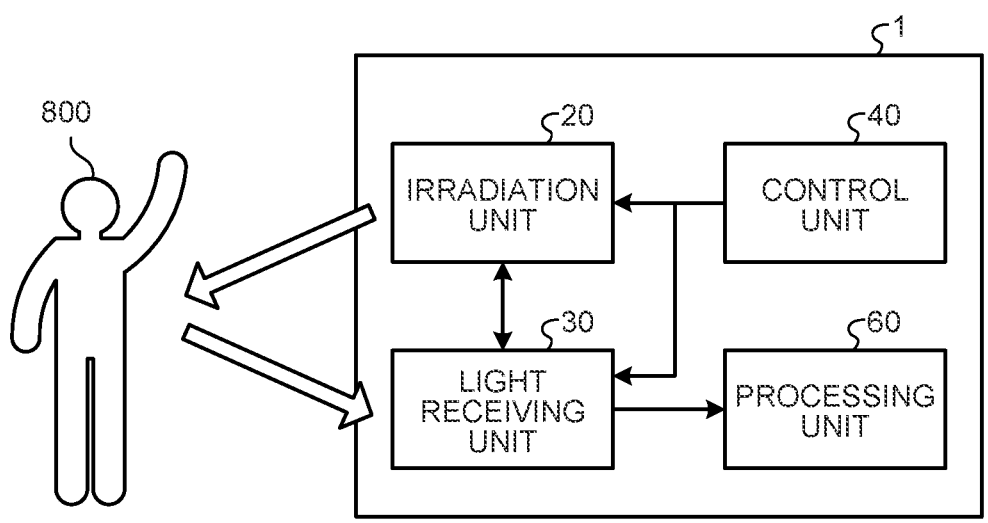
FIG. 1 is a block diagram illustrating a configuration example of a distance measurement module 1 according to an embodiment of the present disclosure.

Hereinafter, preferred embodiments of the present disclosure will be described in detail with reference to the appended drawings. Note that, in the present specification and the drawings, components having substantially the same functional configuration are provided with the same reference signs, so that an overlapping description of these components is omitted.

Further, in the present specification and the drawings, a plurality of components having substantially the same or similar functional configuration may be distinguished by adding different numbers or alphabets after the same reference sign. However, in a case where it is not particularly necessary to distinguish each of the plurality of components having substantially the same or similar functional configuration, only the same reference sign is given. In addition, similar components of different embodiments may be distinguished by adding different alphabets after the same reference sign. However, in a case where it is not necessary to particularly distinguish each of similar components, only the same reference sign is assigned.

In addition, the drawings referred to in the following description are drawings for promoting a description of the embodiments of the present disclosure and understanding thereof, and shapes, dimensions, ratios, and the like illustrated in the drawings may be different from actual ones for the sake of clarity. Furthermore, elements and components included in the devices illustrated in the drawings can be appropriately modified in design in consideration of the following description and known technologies.

Furthermore, in the following description, a case where an embodiment of the present disclosure is applied to a back-side irradiation-type light receiving device will be described as an example. In the light receiving device, light is incident from a back surface side of a substrate. In the following description, a front surface of the substrate is a surface opposite to the back surface in a case where the back surface is on a side where the light is incident.

Specific lengths and shapes in the following description do not mean only the same values as mathematically defined numerical values or geometrically defined shapes. Specifically, a description of the specific lengths and shapes in the following description includes a case where there is an allowable difference (error/strain) in element, manufacturing process thereof, and use/operation thereof, and shapes similar to the shape. For example, in the following description, the expression "circular shape" or "substantially circular shape" means that the shape is not limited to a perfect circle but includes a shape similar to a perfect circle such as an elliptical shape.

Furthermore, in the following description of a circuit (electrical connection), unless otherwise specified, the expression "electrical connection" means that a plurality of elements are connected to each other in such a manner that electricity (signal) conducts. In addition, the expression "electrical connection" in the following description includes not only a case of directly and electrically connecting a plurality of elements but also a case of indirectly and electrically connecting a plurality of elements via other elements.

In addition, in the following description, the expression "sharing" means that another element is provided so as to be shared by a plurality of one elements, in other words, the other element is shared by a predetermined number of same elements, unless otherwise specified.

Note that the description will be provided in the following order.

1. Configuration Example of Distance Measurement Module 1 According to Embodiment of Present Disclosure
2. Configuration Example of Light Receiving Unit 30 According to Embodiment of Present Disclosure
3. Equivalent Circuit of Light Receiving Element 10 According to Embodiment of Present Disclosure
4. Principle of Distance Calculation Method Using Distance Measurement Module 1 According to Embodiment of Present Disclosure
5. Background to Creation of Present Embodiment
6. First Embodiment
7. Second Embodiment
8. Third Embodiment
9. Fourth Embodiment
10. Conclusion
11. Configuration Example of Electronic Device
12. Example of Application to Endoscopic Surgery System
13. Example of Application to Moving Body
14. Supplementary Description

1. Configuration Example of Distance Measurement Module 1 According to Embodiment of Present Disclosure First, a schematic configuration of a distance measurement module 1 according to an embodiment of the present disclosure will be described with reference to FIG. 1. FIG. 1 is a block diagram illustrating a configuration example of the distance measurement module 1 according to the embodiment of the present disclosure. Specifically, as illustrated in FIG. 1, the distance measurement module 1 can mainly include an irradiation unit 20, a light receiving unit 30, a control unit (irradiation control unit) 40, and a processing unit 60. Hereinafter, each functional block included in the distance measurement module 1 according to the present embodiment will be described.
(Irradiation Unit 20)

The irradiation unit 20 includes a light emitting diode (LED) light source (not illustrated) and an optical element (not illustrated). A wavelength of emitted light can be changed by appropriately selecting the LED light source. Note that, in the present embodiment, it is assumed that the irradiation unit 20 emits infrared light having a wavelength in a range of 780 nm to 1000 nm, for example, but in the present embodiment, light emitted by the irradiation unit is not limited to such infrared light. Furthermore, the irradiation unit 20 can irradiate a target object 800 with irradiation light of which brightness is periodically changed in synchronization with a periodic signal such as a rectangular signal supplied from the control unit 40 as described later.
(Light Receiving Unit 30)

The light receiving unit 30 receives reflected light reflected from the target object 800. The light receiving unit 30 includes a condenser lens (not illustrated) and a plurality of light receiving elements 10 to be described later. The condenser lens has a function of collecting received light to each light receiving element 10. In addition, the light receiving element 10 generates electric charges (for example, electrons) based on intensity of the received light, synchronizes the generated electric charges with the periodic signal such as the rectangular signal supplied from the control unit 40 to be described later, and drives a built-in transistor (distribution transistor VG (see FIG. 3)) to transfer the electric charges to an electric charge accumulation unit MEM (see FIG. 3). Furthermore, the electric charges transferred to the electric charge accumulation unit MEM are converted into a signal and finally transferred to the processing unit 60. Note that details of the light receiving element 10 will be described later.
(Control Unit 40)

The control unit 40 supplies the periodic signal to the irradiation unit 20 and the light receiving unit 30, and controls an irradiation timing of the irradiation light and a drive timing of the transistor. A frequency of the signal can be, for example, 5 to 20 megahertz (MHz), but is not limited to such a frequency in the present embodiment. In addition, the control unit 40 controls the transistors (distribution transistors VG (see FIG. 3)) to be operated at different timings, for example, a differential operation.
(Processing Unit 60)

The processing unit 60 can acquire the signal from the light receiving unit 30 and acquire a distance to the target object 800 by, for example, an indirect ToF (iToF) method based on the acquired signal. Note that a distance calculation method will be described later.

Figure 2A:
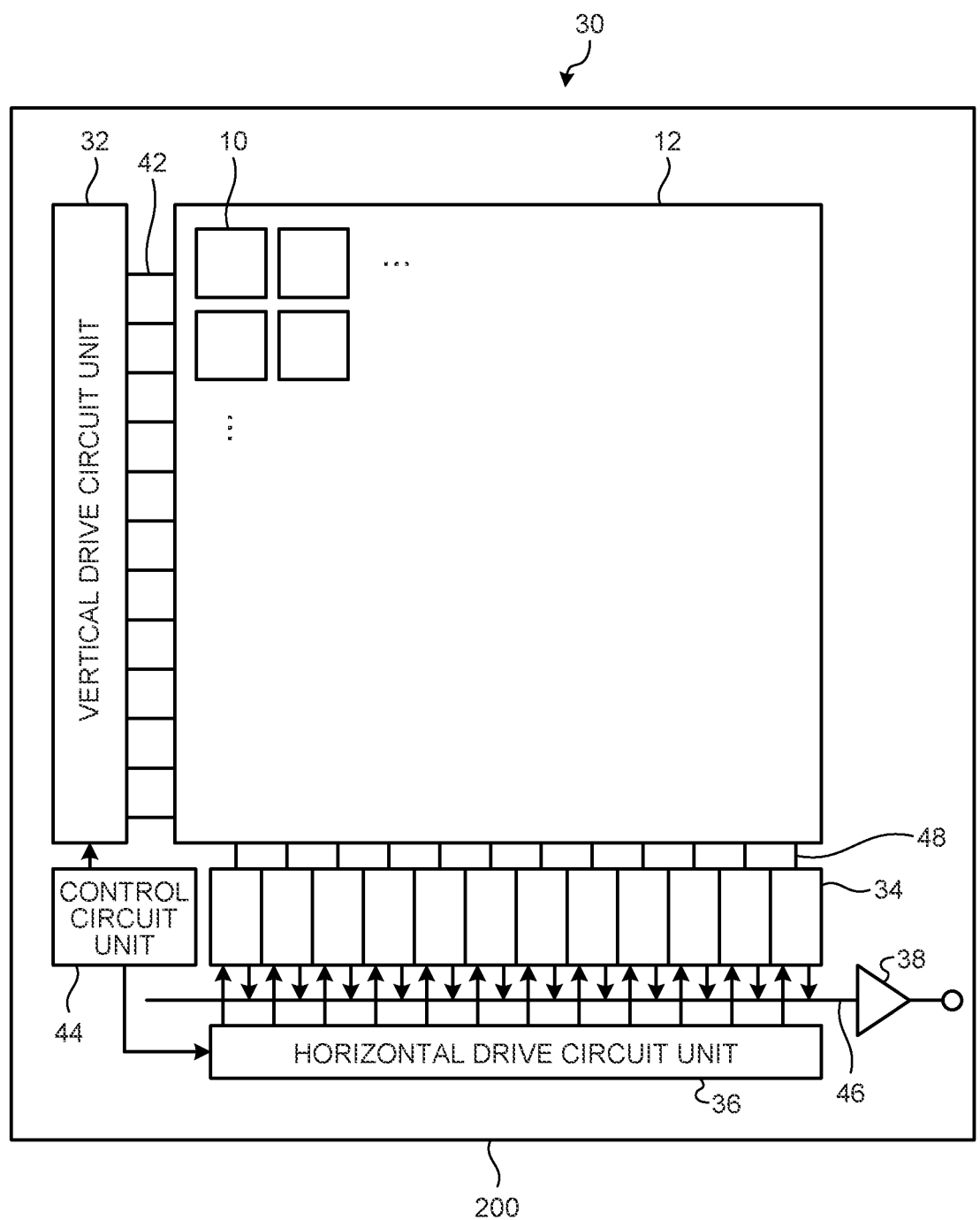
FIG. 2A is an explanatory diagram (part 1) illustrating a planar configuration example of a light receiving unit 30 according to the embodiment of the present disclosure.
Figure 2B:
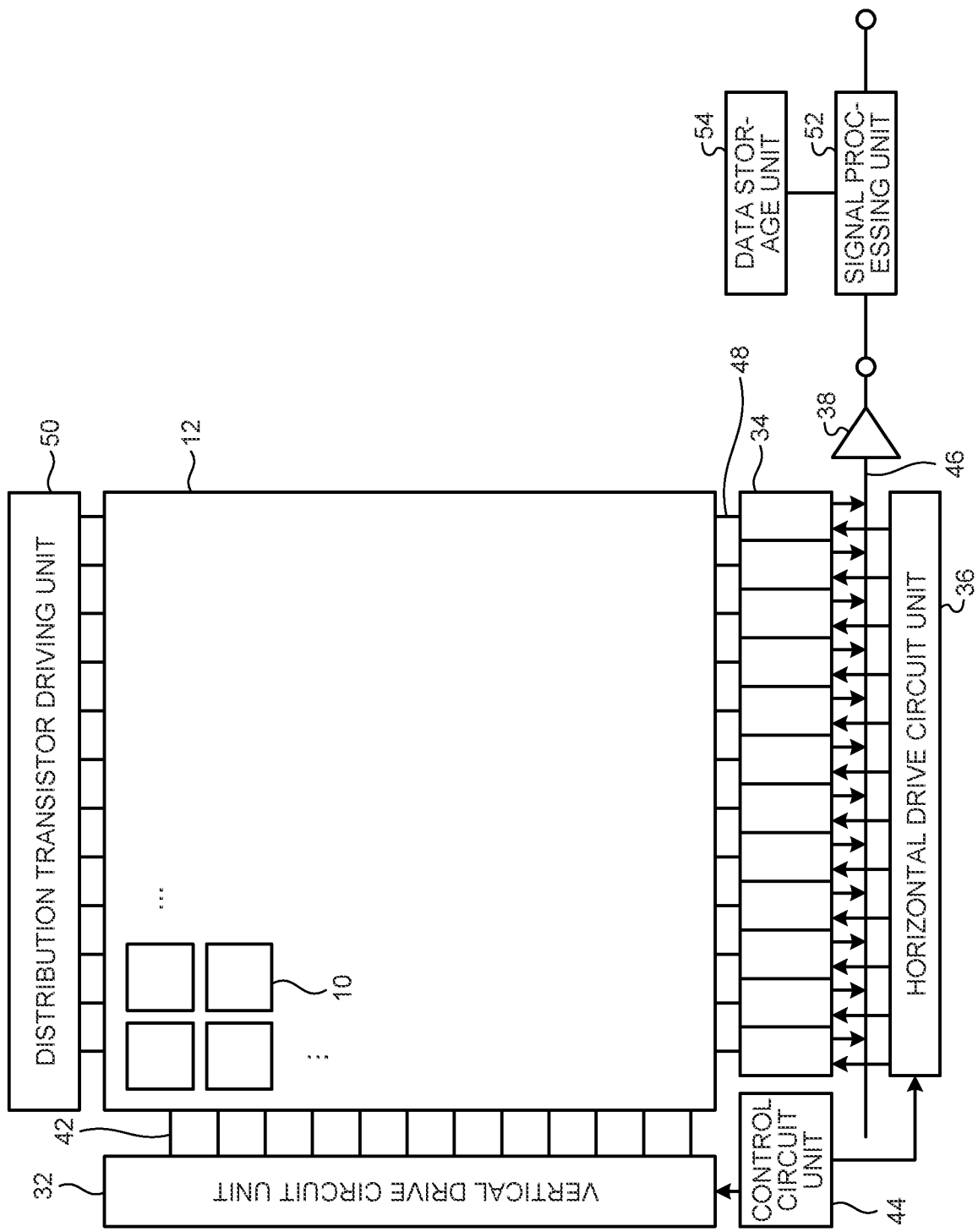
FIG. 2B is an explanatory diagram (part 2) illustrating the planar configuration example of the light receiving unit 30 according to the embodiment of the present disclosure.
Figure 2C:
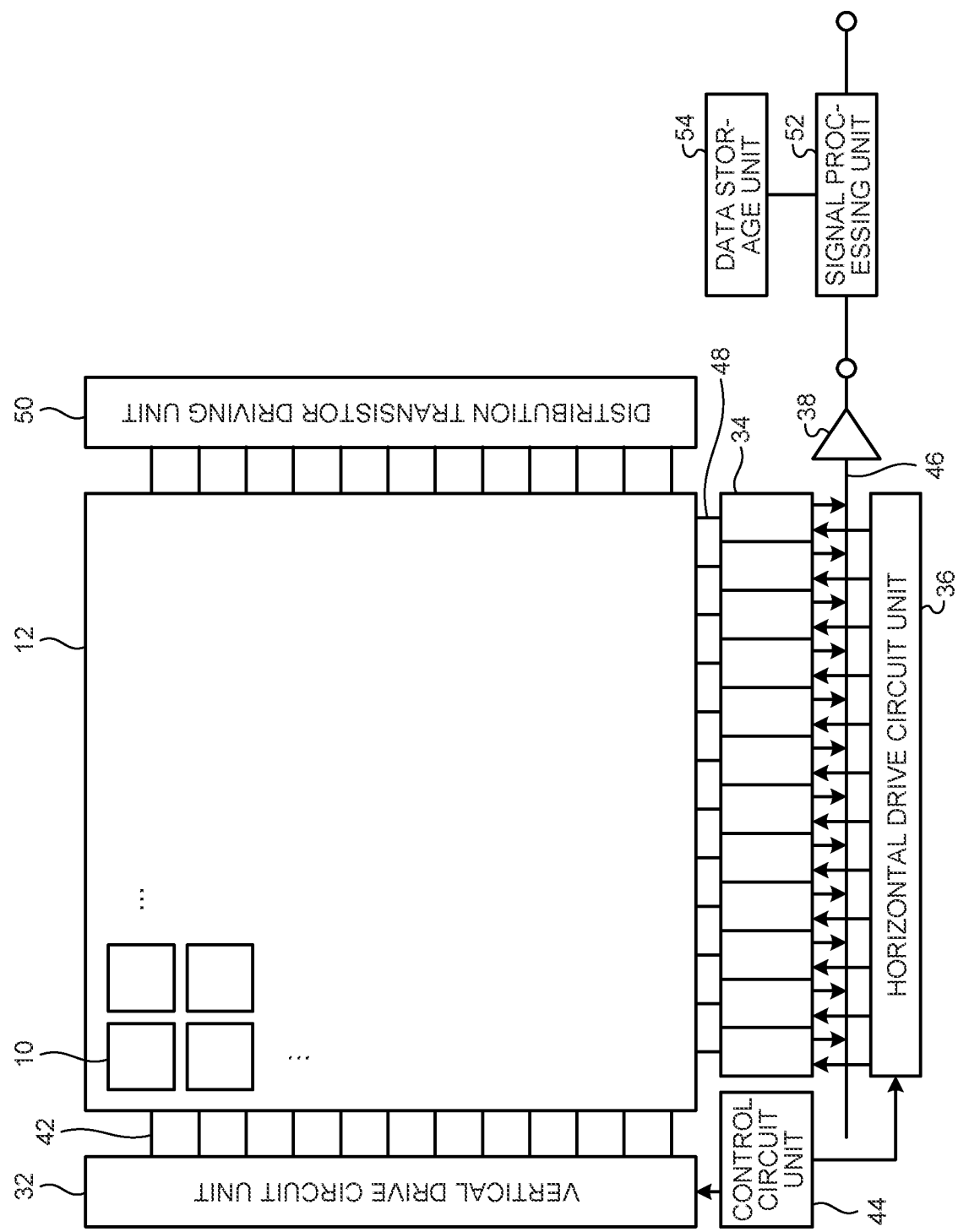
FIG. 2C is an explanatory diagram (part 3) illustrating the planar configuration example of the light receiving unit 30 according to the embodiment of the present disclosure.

2. Configuration Example of Light Receiving Unit 30 According to Embodiment of Present Disclosure Next, a planar configuration example of the light receiving unit 30 according to the embodiment of the present disclosure will be described with reference to FIGS. 2A to 2C. FIGS. 2A to 2C are explanatory diagrams illustrating a planar configuration example of the light receiving unit 30 according to the embodiment of the present disclosure. Specifically, as illustrated in FIG. 2A, the light receiving unit 30 according to the present embodiment includes, for example, a pixel array unit 12, a vertical drive circuit unit 32, a column signal processing circuit unit 34, a horizontal drive circuit unit 36, an output circuit unit 38, a control circuit unit 44, and the like provided on a semiconductor substrate 200 formed of silicon. Hereinafter, details of each block of the light receiving unit 30 according to the present embodiment will be described.
(Pixel Array Unit 12)

The pixel array unit 12 includes a plurality of light receiving elements 10 two-dimensionally arranged in a matrix form (a matrix form in a row direction and a column direction) on the semiconductor substrate 200. Each light receiving element 10 includes a photoelectric conversion unit (photodiode PD) (not illustrated) that converts light into electric charges (for example, electrons), a plurality of pixel transistors (for example, metal-oxide-semiconductor (MOS) transistors) (not illustrated), and the like. In other words, the pixel array unit 12 includes a plurality of pixels that photoelectrically converts incident light and outputs a signal according to electric charges obtained as a result of the photoelectrical conversion. Then, the pixel transistor can include, for example, transistors having various functions such as a transfer transistor, a selection transistor, a reset transistor, and an amplification transistor. Note that details of an equivalent circuit and the like of the light receiving element 10 will be described later.

Here, the row direction refers to an arrangement direction of the light receiving elements 10 in a horizontal direction, and the column direction refers to an arrangement direction of the light receiving elements 10 in a vertical direction. The row direction is a left-right direction in FIG. 2A, and the column direction is a top-bottom direction in FIG. 2A. In the pixel array unit 12, a pixel drive wiring 42 is wired along the row direction for each row and a vertical signal line 48 is wired along the column direction for each column with respect to an array of the light receiving elements 10 in the matrix form. For example, the pixel drive wiring 42 transmits a drive signal for performing driving when reading a signal from the light receiving element 10.

(Vertical Drive Circuit Unit 32)

The vertical drive circuit unit 32 is formed by, for example, a shift register, an address decoder, or the like, selects the pixel drive wiring 42, supplies a pulse for driving the light receiving elements 10 to the selected pixel drive wiring 42, and drives all the light receiving elements 10 at the same time or drive the light receiving elements 10 in units of rows. For example, the vertical drive circuit unit 32 selectively scans the respective light receiving elements 10 of the pixel array unit 12 sequentially in the vertical direction (the top-bottom direction in FIG. 2A) in units of rows, and supplies, to a column signal processing circuit unit 34 to be described later through the vertical signal line 48, a pixel signal based on electric charges generated according to the amount of light received by the photodiode PD of each light receiving element 10.

(Column Signal Processing Circuit Unit 34)

The column signal processing circuit unit 34 is arranged for each column of the light receiving elements 10, and performs signal processing such as noise removal for each column on the signals output from the light receiving elements 10 of one row. For example, the column signal processing circuit unit 34 performs signal processing such as correlated double sampling (CDS) and analog-digital (AD) conversion in order to remove fixed pattern noise unique to the light receiving element 10.

(Horizontal Drive Circuit Unit 36)

The horizontal drive circuit unit 36 is formed by, for example, a shift register, an address decoder, or the like, can sequentially select the respective column signal processing circuit units 34 described above by sequentially outputting horizontal scanning pulses, and can cause each column signal processing circuit unit 34 to output a signal to a horizontal signal line 46.

(Output Circuit Unit 38)

The output circuit unit 38 can perform signal processing on the signals sequentially supplied from the respective column signal processing circuit units 34 through the horizontal signal line 46 and output the processed signals. The output circuit unit 38 may function as, for example, a functional unit that performs buffering, or may perform processing such as column variation correction and various digital signal processing. Note that the buffering refers to temporarily storing a signal in order to compensate for a difference in processing speed or transfer speed when the signal is transmitted and received.

(Control Circuit Unit 44)

The control circuit unit 44 can receive an input clock and data instructing an operation mode and the like, and can output data such as internal information of the light receiving element 10. That is, the control circuit unit 44 generates a clock signal or a control signal serving as a reference of operations of the vertical drive circuit unit 32, the column signal processing circuit unit 34, the horizontal drive circuit unit 36, and the like based on a vertical synchronization signal, a horizontal synchronization signal, and a master clock. Then, the control circuit unit 44 outputs the generated clock signal or control signal to the vertical drive circuit unit 32, the column signal processing circuit unit 34, the horizontal drive circuit unit 36, and the like.

(Distribution Transistor Driving Unit 50, Signal Processing Unit 52, and Data Storage Unit 54)

As illustrated in FIGS. 2B and 2C, the light receiving element 10 may be provided with a distribution transistor driving unit 50, a signal processing unit 52, and a data storage unit 54. That is, the distribution transistor driving unit 50, the signal processing unit 52, and the data storage unit 54 may be provided on the semiconductor substrate 200. However, the present embodiment is not limited thereto, and the distribution transistor driving unit 50, the signal processing unit 52, and the data storage unit 54 may be provided on another semiconductor substrate (not illustrated). First, the distribution transistor driving unit 50 controls an operation of the distribution transistor VG (see FIG. 3) to be described later. For example, the distribution transistor driving unit 50 may be provided so as to be adjacent to the pixel array unit 12 in the column direction as illustrated in FIG. 2B, or may be provided so as to be adjacent to the pixel array unit 12 in the row direction as illustrated in FIG. 2C, and is not particularly limited in the present embodiment. Furthermore, the signal processing unit 52 has at least an arithmetic processing function, and performs various signal processing such as arithmetic processing based on the signal output from the output circuit unit 38. The data storage unit 54 temporarily stores data necessary for signal processing of the signal processing unit 52.

Note that the planar configuration example of the light receiving unit 30 according to the present embodiment is not limited to the example illustrated in FIGS. 2A to 2C, may include, for example, other circuits and the like, and is not particularly limited.

Figure 3:
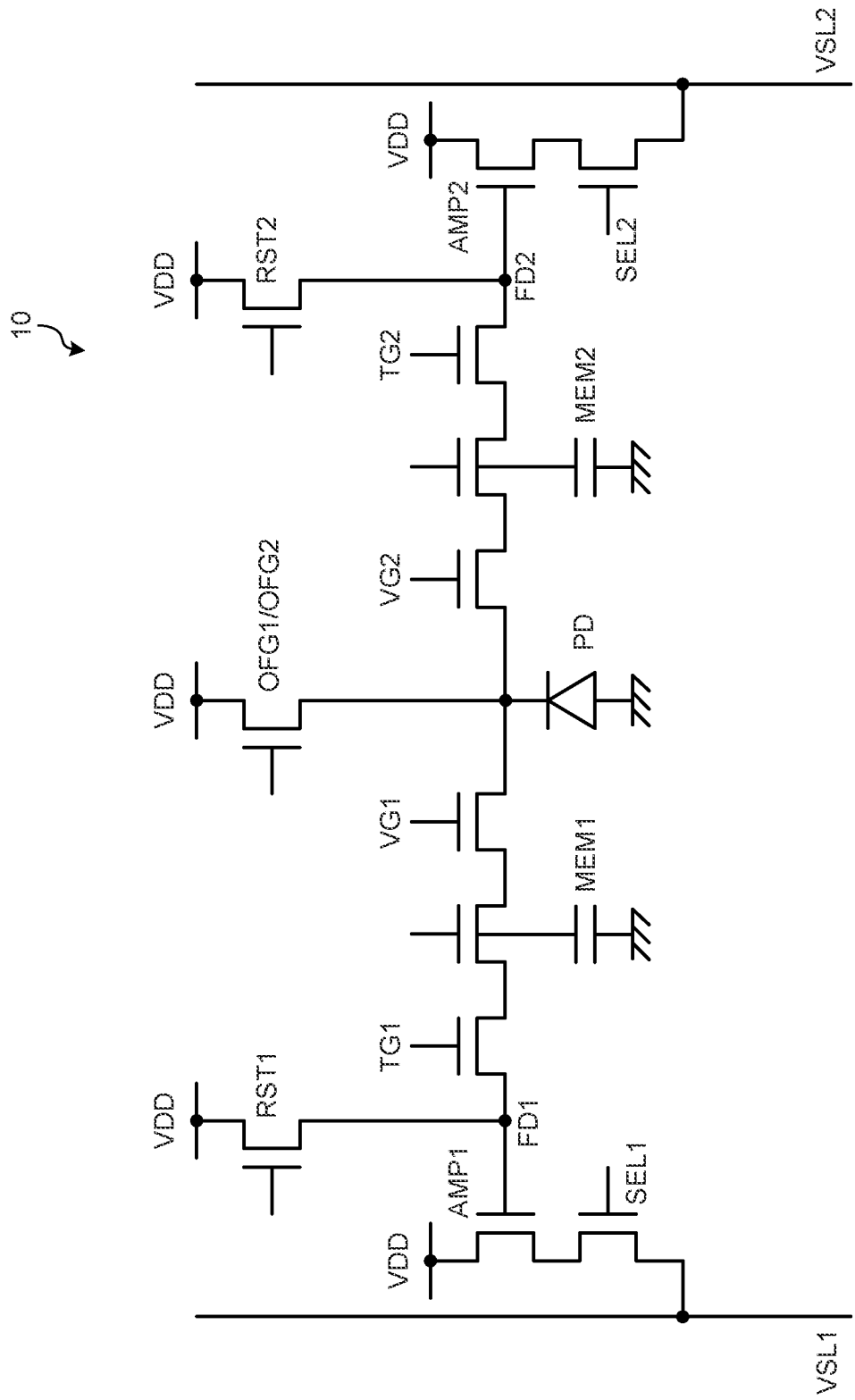
FIG. 3 is an equivalent circuit diagram of a light receiving element 10 according to the embodiment of the present disclosure.

3. Equivalent Circuit of Light Receiving Element 10 According to Embodiment of Present Disclosure Next, the equivalent circuit of the light receiving element 10 according to the embodiment of the present disclosure will be described with reference to FIG. 3. FIG. 3 is an equivalent circuit diagram of the light receiving element 10 according to the embodiment of the present disclosure.

Specifically, as illustrated in FIG. 3, the light receiving element 10 includes the photodiode PD as a photoelectric conversion element (photoelectric conversion unit) that converts light into electric charges, and an electric charge drain transistor OFG (note that, although the electric charge drain transistor OFG is illustrated as one transistor on the equivalent circuit, the electric charge drain transistor OFG may be implemented by a plurality of transistors electrically connected in parallel). Furthermore, the light receiving element 10 includes two distribution transistors VG, two electric charge accumulation units (first and second electric charge accumulation units) MEM, two transfer transistors TG, two floating diffusion regions FD, two reset transistors RST, two amplification transistors AMP, and two selection transistors SEL.

As illustrated in FIG. 3, in the light receiving element 10, one of a source and a drain of the electric charge drain transistor OFG is electrically connected to the photodiode PD that generates electric charges by receiving light. Furthermore, the other one of the source and the drain of the electric charge drain transistor OFG is electrically connected to a power supply circuit (power supply potential VDD). Then, the electric charge drain transistor OFG is brought into a conductive state according to a voltage applied to a gate thereof, and can drain the electric charges accumulated in the photodiode PD to the power supply circuit (power supply potential VDD).

Furthermore, as illustrated in FIG. 3, in the light receiving element 10, one of a source and a drain of a distribution transistor VG1 or VG2 is electrically connected to the photodiode PD, and the other one of the source and the drain of the distribution transistor VG1 or VG2 is electrically connected to an electric charge accumulation unit MEM1 or MEM2. Then, the distribution transistors VG1 and VG2 are brought into a conductive state according to a voltage applied to gates thereof (first and second distribution gates), and can transfer the electric charges accumulated in the photodiodes PD to the electric charge accumulation units MEM1 and MEM2, respectively. That is, in the present embodiment, by changing the voltages applied to the gates of the distribution transistors VG1 and VG2 at different timings, the electric charges accumulated in the photodiode PD can be distributed to one of the two electric charge accumulation units MEM1 and MEM2. In other words, it can be said that the two electric charge accumulation units MEM1 and MEM2 share one photodiode PD.

Furthermore, as illustrated in FIG. 3, in the light receiving element 10, one of a source and a drain of a transfer transistor TG1 or TG2 is electrically connected to the other one of the source and the drain of the distribution transistor VG1 or VG2 and the electric charge accumulation unit MEM1 or MEM2. Furthermore, the other one of the source and the drain of the transfer transistor TG1 or TG2 is electrically connected to a floating diffusion region FD1 or FD2. Then, the transfer transistors TG1 and TG2 are brought into a conductive state according to voltages applied to gates thereof (transfer gates), and can transfer the electric charges accumulated in the electric charge accumulation units MEM1 and MEM2 to the floating diffusion regions FD1 and FD2. Note that, in the embodiment of the present disclosure, since there are two electric charge accumulation units MEM1 and MEM2, the transfer transistors TG1 and TG2 can also share one floating diffusion region FD.

Furthermore, the floating diffusion regions FD1 and FD2 are electrically connected to gates of amplification transistors AMP1 and AMP2 that convert electric charges into a voltage and output the voltage as a signal. In addition, one of the source and the drain of the amplification transistor AMP1 or AMP2 is electrically connected to one of the source and the drain of a selection transistor SEL1 or SEL2 that outputs the signal obtained by conversion to a signal line VSL1 or VSL2 according to a selection signal. Furthermore, the other one of the source and the drain of the amplification transistor AMP1 or AMP2 is electrically connected to the power supply circuit (power supply potential VDD).

In addition, the other one of the source and drain of the selection transistor SEL1 or SEL2 is electrically connected to the signal line VSL1 or VSL2 that transmits the converted voltage as a signal, and is further electrically connected to the column signal processing circuit unit 34 described above. Furthermore, a gate of each of the selection transistors SEL1 and SEL2 is electrically connected to a selection line (not illustrated) that selects a row to output a signal, and is further electrically connected to the vertical drive circuit unit 32 described above. That is, the electric charges accumulated in the floating diffusion regions FD1 and FD2 are converted into voltages by the amplification transistors AMP1 and AMP2 and output to the signal lines VSL1 and VSL2 under the control of the selection transistors SEL1 and SEL2.

Furthermore, as illustrated in FIG. 3, each of the floating diffusion regions FD1 and FD2 is electrically connected to one of a drain and a source of a reset transistor RST1 or RST2 for resetting the accumulated electric charges. A gate of each of the reset transistors RST1 and RST2 is electrically connected to a reset signal line (not illustrated), and is further electrically connected to the vertical drive circuit unit 32 described above. In addition, the other one of the drain and the source of the reset transistor RST1 or RST2 is electrically connected to the power supply circuit (power supply potential VDD). Then, the reset transistors RST1 and RST2 are brought into a conductive state according to voltages applied to the gates thereof, and can reset (drain to the power supply circuit (power supply potential VDD)) the electric charges accumulated in the floating diffusion regions FD1 and FD2.

Note that the equivalent circuit of the light receiving element 10 according to the present embodiment is not limited to the example illustrated in FIG. 3, and may include, for example, other elements and the like, and is not particularly limited.

Here, an operation example of the light receiving element 10 will be briefly described.

First, before light reception is started, a draining operation for draining the electric charges of the photodiode PD is performed. That is, electric charge drain transistors OFG1 and OFG2 are turned on, and the electric charges of the photodiode PD are drained to the power supply circuit (power supply potential VDD).

Next, light reception is started, and the distribution transistors VG1 and VG2 are controlled to be operated at different timings (for example, a differential operation). Specifically, in a first period, the distribution transistor VG1 is turned on, whereby the electric charges of the photodiode PD are transferred to the electric charge accumulation unit MEM1. On the other hand, in a second period, the distribution transistor VG2 is turned on, whereby the electric charges of the photodiode PD are transferred to the electric charge accumulation unit MEM2. That is, the electric charges generated in the photodiode PD are distributed to the electric charge accumulation units MEM1 and MEM2 by the distribution transistors VG1 and VG2.

Next, a draining operation of draining electric charges in the floating diffusion regions FD1 and FD2 is performed. That is, the reset transistors RST1 and RST2 are turned on, and the electric charges in the floating diffusion regions FD1 and FD2 are drained to the power supply circuit (power supply potential VDD). Thereafter, the electric charges (ktc noise) generated in the floating diffusion regions FD1 and FD2 are preferably removed by CDS driving.

Then, the transfer transistors TG1 and TG2 are turned on, and the electric charges accumulated in the electric charge accumulation units MEM1 and MEM2 are transferred to the floating diffusion regions FD1 and FD2. Then, when the light receiving period ends, the respective light receiving elements 10 of the pixel array unit 12 are sequentially selected. In the selected light receiving element 10, the selection transistors SEL1 and SEL2 are turned on. As a result, the electric charges accumulated in the floating diffusion regions FD1 and FD2 are output to the signal lines VSL1 and VSL2 as signals.

Note that the operation of the light receiving element 10 according to the present embodiment is not limited to the above-described example, and for example, the order of the operation may be appropriately changed. Then, in the present embodiment, the distance to the target object 800 can be obtained from a distribution ratio of the electric charges accumulated in the two floating diffusion regions FD1 and FD2. Hereinafter, the principle will be briefly described.

Figure 4:
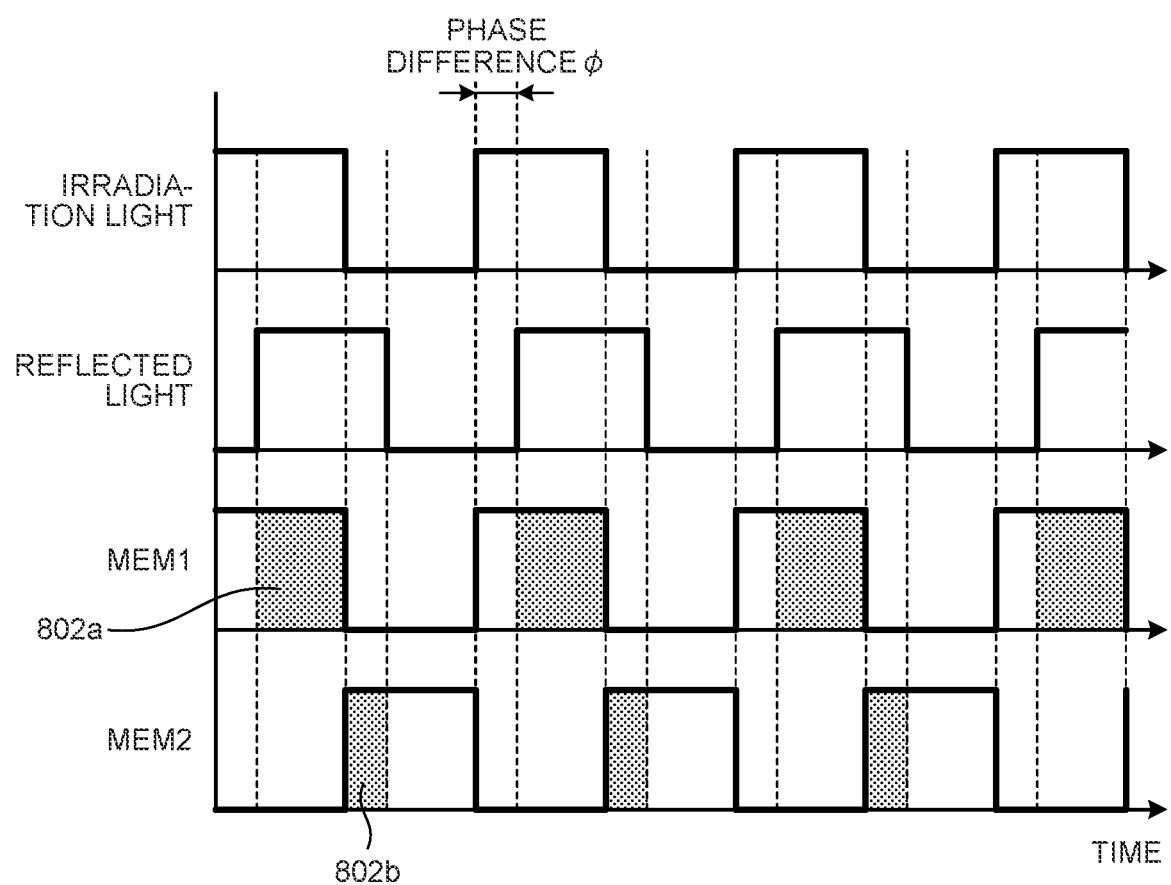
FIG. 4 is an explanatory diagram for describing a principle of a distance calculation method using the distance measurement module 1 according to the embodiment of the present disclosure.

4. Principle of Distance Calculation Method Using Distance Measurement Module 1 According to Embodiment of Present Disclosure Next, the principle of the distance calculation method (indirect method) using the distance measurement module 1 according to the embodiment of the present disclosure will be described with reference to FIG. 4. FIG. 4 is an explanatory diagram for describing the principle of the distance calculation method using the distance measurement module 1 according to the embodiment of the present disclosure. Specifically, FIG. 4 schematically illustrates temporal variation of intensities of the irradiation light and the reflected light in the distance measurement module 1.

As illustrated in FIG. 4, in the distance measurement module 1, the irradiation unit 20 irradiates the target object 800 with light modulated in such a manner that the intensity of light periodically varies. The irradiation light is reflected by the target object 800 and detected as the reflected light by the light receiving unit 30 of the distance measurement module 1. As illustrated in FIG. 4, the detected reflected light (the second stage from the top in FIG. 4) has a phase difference $\phi$ with respect to the irradiation light (the first stage from the top in FIG. 4). The phase difference $\phi$ increases as the distance from the distance measurement module 1 to the target object 800 increases, and the phase difference $\phi$ decreases as the distance from the distance measurement module 1 to the target object 800 decreases.

As described above, the light receiving element 10 according to the present embodiment includes, for example, the distribution transistors VG1 and VG2 that perform differential operations. Therefore, since periods during which the distribution transistors VG1 and VG2 are operated do not overlap, the electric charges accumulated in the photodiode PD are distributed to the electric charge accumulation units MEM1 and MEM2 in periods of regions 802a and 802b indicated by gray shading in FIG. 4, respectively. Specifically, the electric charges distributed to the respective electric charge accumulation units MEM1 and MEM2 are transferred to the floating diffusion regions FD1 and FD2, and are finally converted into signals corresponding to areas that are integral values in the periods of the regions 802a and 802b. Therefore, as is clear from FIG. 4, a difference between the integral value of the region 802a and the integral value of the region 802b changes according to the phase difference $\phi$ of the reflected light. Therefore, in the present embodiment, the distance to the target object 800 can be calculated by calculating the phase difference $\phi$ based on the difference between the integral value of the region 802a and the integral value of the region 802b. Note that, in the present embodiment, it is also possible to calculate the phase difference $\phi$ by using a ratio between the integral values rather than the difference between the integral values, to calculate the distance.

5. Background to Creation of Present Embodiment

The distance measurement module 1, the light receiving unit 30, the light receiving element 10, and the principle of the distance calculation method according to the embodiment of the present disclosure have been described above. Here, before further describing the details of the present embodiment, a background leading to the creation of the present embodiment by the present inventors will be briefly described.

As described above, the light receiving unit 30 of the distance measurement module 1 repeatedly performs light reception a plurality of times at short intervals, thereby increasing the signal amount to increase the S/N ratio, which enables highly accurate distance measurement. For example, the light receiving unit 30 is required to perform an operation of receiving light and distributing generated electric charges at a frequency of, for example, several hundred MHz or more. Therefore, the distribution transistors VG1 and VG2 of the light receiving element 10 of the light receiving unit 30 are required to transfer (distribute) the electric charges generated in the photodiode PD to the electric charge accumulation units MEM1 and MEM2 at a high speed with low power consumption.

Therefore, the present inventors have created embodiments of the present disclosure in view of the above-described requirements. Specifically, in the embodiments of the present disclosure created by the present inventors, the gate of the distribution transistor VG has a pair of buried gate portions buried in the semiconductor substrate 200. Since the buried gate portion is buried in the semiconductor substrate 200, a potential around the buried gate portion is effectively modulated. Therefore, with the buried gate portion, the electric charges generated in the photodiode PD positioned at a deep portion of the semiconductor substrate 200 can be transferred to the electric charge accumulation unit MEM. Furthermore, in the embodiments of the present disclosure created by the present inventors, the gate of the distribution transistor VG has two buried gate portions. Therefore, according to the present embodiment, it is possible to more effectively modulate a potential of the periphery with low power consumption by the two buried gate portions, and as a result, it is possible to transfer the electric charges to the electric charge accumulation unit MEM at a higher speed. Although the power consumption increases because a parasitic capacitance increases due to the buried gate portion, low power consumption can be realized by design optimization and overall balancing. Hereinafter, details of the embodiments of the present disclosure created by the present inventors will be sequentially described.

6. First Embodiment

6.1 Planar Structure

Figure 5:
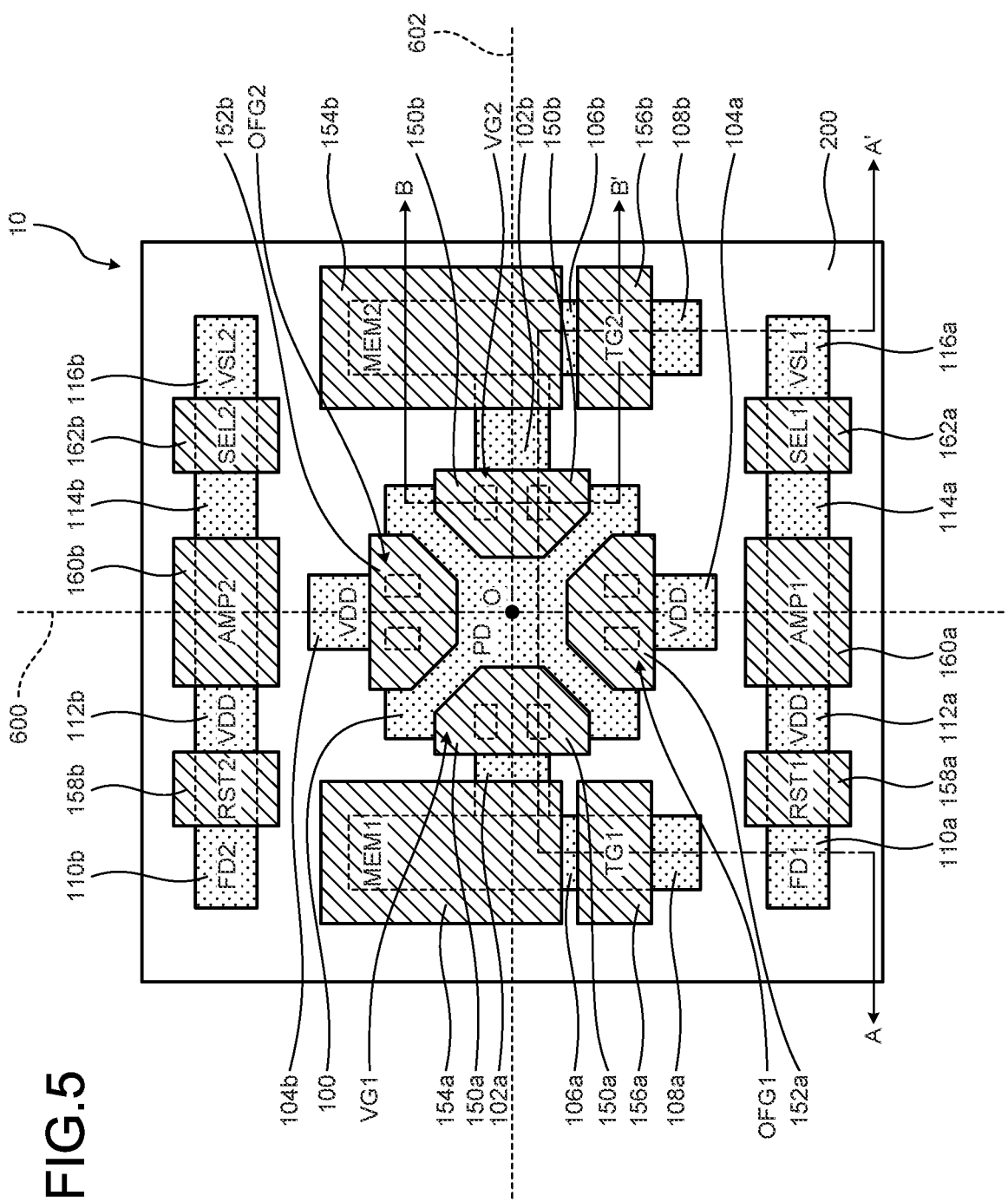
FIG. 5 is an explanatory diagram illustrating a planar configuration example of a light receiving element 10 according to a first embodiment of the present disclosure.

First, a planar structure example of the light receiving element 10 according to a first embodiment of the present disclosure will be described with reference to FIG. 5. FIG. 5 is an explanatory diagram illustrating a planar configuration example of the light receiving element 10 according to the present embodiment, and is a view of the light receiving element 10 when viewed from above the front surface of the semiconductor substrate 200. Note that a left-right direction in FIG. 5 corresponds to the row direction (left-right direction) in FIG. 2A, and a top-bottom direction in FIG. 5 corresponds to the column direction (top-bottom direction) in FIG. 2A.

As illustrated in FIG. 5, an N-type semiconductor region 100 is formed in the P-type semiconductor substrate 200 at a central portion of the light receiving element 10, and the N-type semiconductor region 100 constitutes a part of the photodiode (photoelectric conversion unit) PD. Furthermore, gate electrodes (first and second distribution gates) 150a and 150b of the distribution transistors VG1 and VG2 are arranged so as to be line-symmetric (substantially line-symmetric) with respect to a center line 600 passing through a center point (center) O of the photodiode PD and extending along the light receiving element 10 in the top-bottom direction (column direction). Note that the gate electrodes 150a and 150b of the distribution transistors VG1 and VG2 are provided so as to overlap at least parts of the N-type semiconductor region 100.

Specifically, the distribution transistor VG1 includes the gate electrode 150a, a gate insulating film (not illustrated) positioned between the gate electrode 150a and the semiconductor substrate 200, the N-type semiconductor region 100 as a source region, and an N-type semiconductor region 102a as a drain region. The N-type semiconductor region 100 as the source region is also used as the photodiode PD, and the N-type semiconductor region 102a as the drain region is also used as the electric charge accumulation unit MEM1. Further, the gate electrode 150a has a pair of buried gate portions 170a and 170b (see FIG. 6) buried in the semiconductor substrate 200 as indicated by a broken line in FIG. 5. Note that details of the buried gate portions 170a and 170b will be described later. The distribution transistor VG2 is similar to the distribution transistor VG1.

Furthermore, as illustrated in FIG. 5, gate electrodes 152a and 152b of the electric charge drain transistors OFG1 and OFG2 are arranged so as to be line-symmetric (substantially line-symmetric) with respect to a center line 602 passing through the center point O of the photodiode PD and extending along the light receiving element 10 in the left-right direction (row direction). Note that the gate electrodes 152a and 152b of the electric charge drain transistors OFG1 and OFG2 are provided so as to overlap at least parts of the N-type semiconductor region 100.

Specifically, the electric charge drain transistor OFG1 includes the gate electrode 152a, a gate insulating film (not illustrated) positioned between the gate electrode 152a and the semiconductor substrate 200, the N-type semiconductor region 100 as a source region, and an N-type semiconductor region 104a as a drain region. The N-type semiconductor region 100 as the source region is also used as the photodiode PD. Further, the gate electrode 152a has a pair of buried gate portions buried in the semiconductor substrate 200 as indicated by a broken line in FIG. 5. Note that details of the buried gate portion will be described later. In addition, the electric charge drain transistor OFG2 is similar to the electric charge drain transistor OFG1.

In addition, the electric charge accumulation units MEM1 and MEM2 and the transfer transistors TG1 and TG2 are provided so as to be line-symmetric with respect to the center line 600 and to sandwich the N-type semiconductor regions 102 and the distribution transistors VG1 and VG2 therebetween. Note that the electric charge accumulation unit MEM1 is arranged adjacent to the transfer transistor TG1 in the top-bottom direction (column direction) in FIG. 5, and the electric charge accumulation unit MEM2 is arranged adjacent to the transfer transistor TG2 in the top-bottom direction (column direction) in FIG. 5.

Specifically, the electric charge accumulation unit (first electric charge accumulation unit) MEM1 includes, for example, an electrode 154a, an insulating film (not illustrated) provided under the electrode 154a, and the N-type semiconductor region 102a provided under the insulating film. Furthermore, the transfer transistor TG1 includes a gate electrode 156a, a gate insulating film (not illustrated) positioned between the gate electrode 156a and the semiconductor substrate 200, an N-type semiconductor region 106a as a source region, and an N-type semiconductor region 108a as a drain region. The electric charge accumulation unit (second electric charge accumulation unit) MEM2 and the transfer transistor TG2 are similar to the electric charge accumulation unit MEM1 and the transfer transistor TG1.

Further, the reset transistors RST1 and RST2, the amplification transistors AMP1 and AMP2, and the selection transistors SEL1 and SEL2 are disposed so as to be line-symmetric with respect to the center line 602 and to sandwich the N-type semiconductor regions 102 and the electric charge drain transistors OFG1 and OFG2 therebetween. Note that the reset transistor RST1, the amplification transistor AMP1, and the selection transistor SEL1 are arranged adjacent to each other in the left-right direction (row direction) in FIG. 5, and the reset transistor RST2, the amplification transistor AMP2, and the selection transistor SEL2 are also arranged adjacent to each other in the left-right direction (row direction) in FIG. 5.

Specifically, the reset transistor RST1 includes a gate electrode 158a, a gate insulating film (not illustrated) positioned between the gate electrode 158a and the semiconductor substrate 200, an N-type semiconductor region 110a as a source region, and an N-type semiconductor region 112a as a drain region. The N-type semiconductor region 110a as the source region is also used as the floating diffusion region FD1, and the N-type semiconductor region 112a as the drain region is also used as the amplification transistor AMP1. The reset transistor RST2 is similar to the reset transistor RST1.

In addition, the amplification transistor AMP1 includes a gate electrode 160a, a gate insulating film (not illustrated) positioned between the gate electrode 160a and the semiconductor substrate 200, the N-type semiconductor region 112a as a drain region, and an N-type semiconductor region 114a as a source region. The N-type semiconductor region 112a as the drain region is also used as the drain region of the reset transistor RST1. The amplification transistor AMP2 is similar to the amplification transistor AMP1.

Further, the selection transistor SEL1 includes a gate electrode 162a, a gate insulating film (not illustrated) positioned between the gate electrode 162a and the semiconductor substrate 200, the N-type semiconductor region 114a as a drain region, and an N-type semiconductor region 116a as a source region. The N-type semiconductor region 114a as the drain region is also used as the source region of the amplification transistor AMP1. The selection transistor SEL2 is similar to the selection transistor SEL1.

Note that the planar structure of the light receiving element 10 according to the present embodiment is not limited to the example illustrated in FIG. 5, and may include, for example, other elements and the like, and is not particularly limited.

6.2 Cross-Sectional Structure

Figure 6:
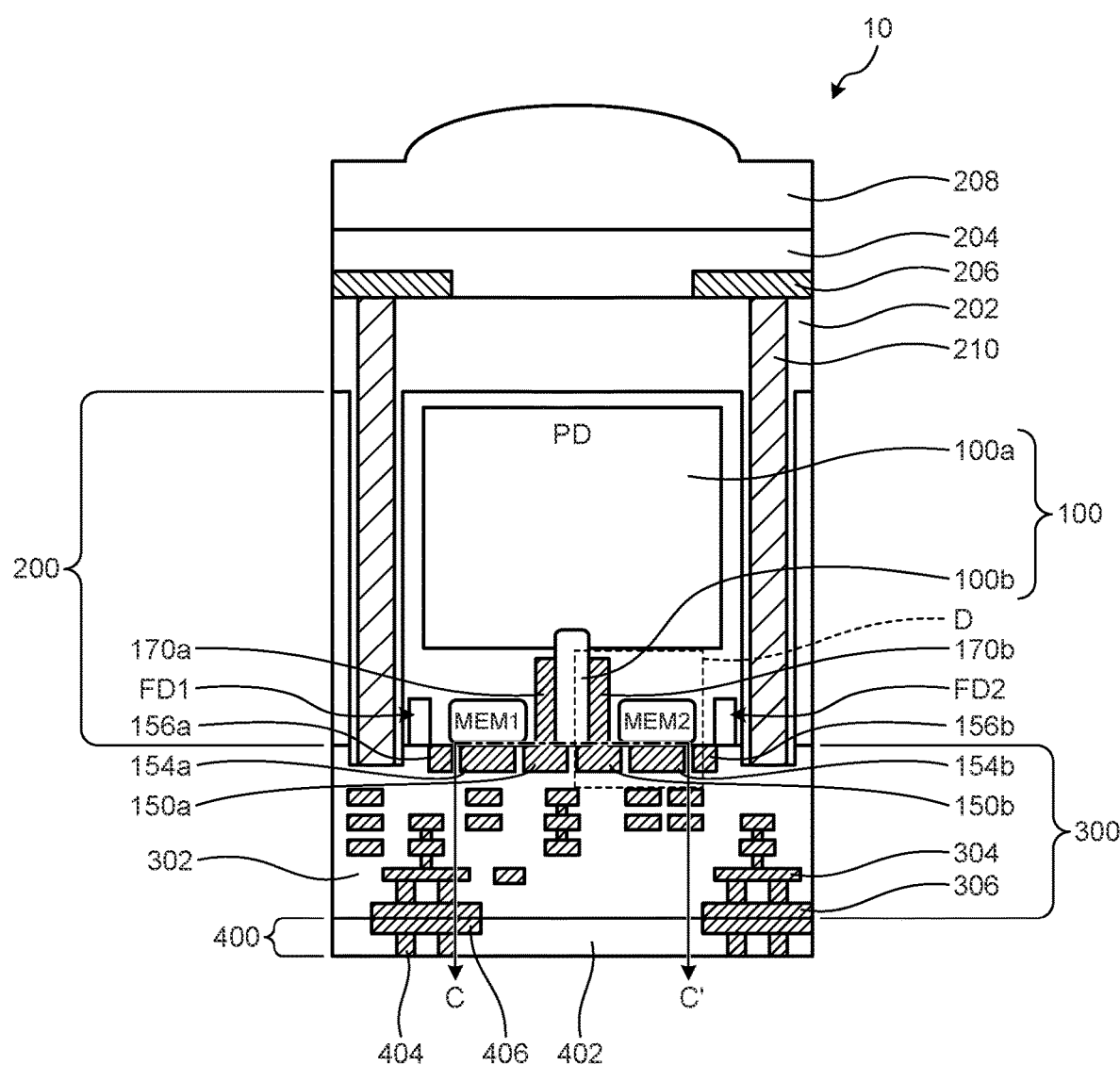
FIG. 6 is a cross-sectional view of the light receiving element 10 taken along line A-A' of FIG. 5.
Figure 7:
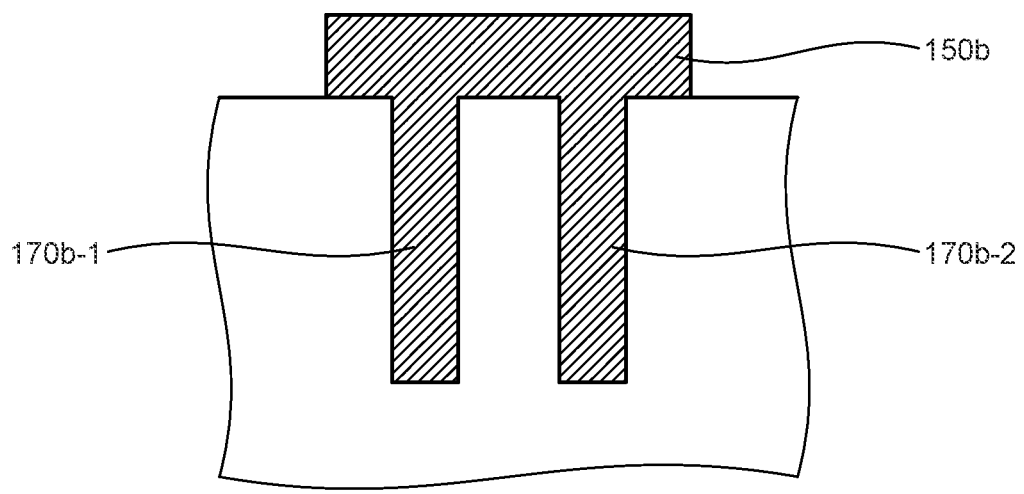
FIG. 7 is a cross-sectional view of the light receiving element 10 taken along line B-B' of FIG. 5.
Figure 8:
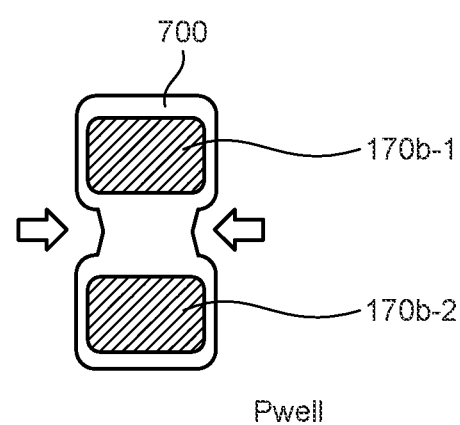
FIG. 8 is an explanatory diagram for describing the first embodiment.
Figure 9:
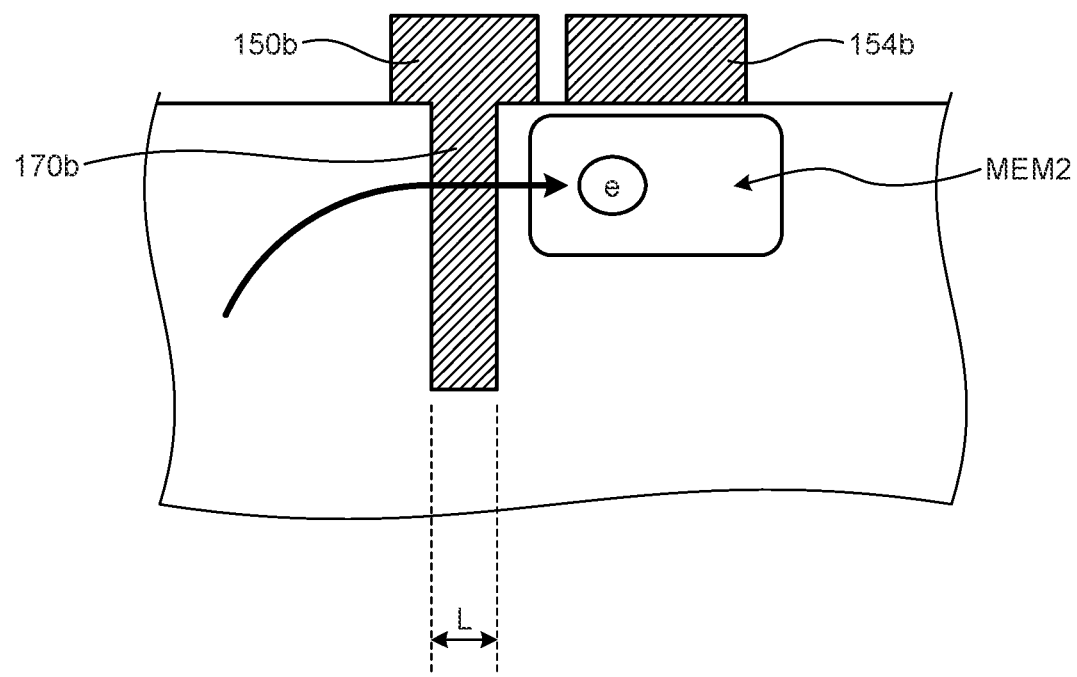
FIG. 9 is an enlarged view of a region D of FIG. 6.

Next, a cross-sectional structure example of the light receiving element 10 according to the first embodiment of the present disclosure will be described with reference to FIGS. 6 to 9. FIG. 6 is a cross-sectional view of the light receiving element 10 taken along line A-A' of FIG. 5. Specifically, the upper side of FIG. 6 is the back surface side of the semiconductor substrate 200, and the lower side of FIG. 6 is the front surface side of the semiconductor substrate 200. FIG. 7 is a cross-sectional view of the light receiving element 10 taken along line B-B' of FIG. 5, in which the upper side of FIG. 7 is the front surface side of the semiconductor substrate 200, and the lower side of FIG. 7 is the back surface side of the semiconductor substrate 200. FIG. 8 is an explanatory diagram for describing the present embodiment. FIG. 9 is an enlarged view of a region D of FIG. 6, and the upper side of FIG. 9 is the front surface side of the semiconductor substrate 200, and the lower side of FIG. 9 is the back surface side of the semiconductor substrate 200.

First, as illustrated in FIG. 6, the light receiving element 10 includes the semiconductor substrate 200 formed of a silicon substrate or the like. Specifically, the photodiode PD is formed in the semiconductor substrate 200 by forming N-type semiconductor regions 100a and 100b in the P-type semiconductor substrate 200.

Next, the upper side of FIG. 6, that is, the back surface side of the semiconductor substrate 200 will be described. An on-chip lens 208 which is formed of a styrene-based resin, an acrylic resin, a styrene-acrylic copolymer resin, a siloxane-based resin, or the like, and on which the reflected light from the target object 800 is incident is provided above the back surface of the semiconductor substrate 200. A planarization film 204 formed of, for example, silicon oxide ($SiO_2$), silicon nitride (SiN), silicon oxynitride (SiON), or the like is provided under the on-chip lens 208. Furthermore, an antireflection film 202 formed of an insulating film is provided under the planarization film 204. For example, the antireflection film 202 can be formed of hafnium oxide ($HfO_2$), aluminum oxide ($Al_2O_3$), titanium oxide ($TiO_2$), silicon oxide, or the like, or a stack thereof.

A light shielding film 206 that prevents the reflected light from the target object 800 from being incident on an adjacent light receiving element 10 is provided in a boundary region between each light receiving element and the adjacent light receiving element 10 on the antireflection film 202. The light shielding film 206 can be formed of a material that shields light, for example, a metal material such as tungsten (W), aluminum (Al), or copper (Cu).

Furthermore, a pixel isolation portion (first pixel isolation portion) 210 (FFTI) penetrating through the semiconductor substrate 200 is provided under the light shielding film 206 to prevent incident light from entering the adjacent light receiving element 10. The pixel isolation portion 210 includes, for example, a trench penetrating from the back surface to the front surface of the semiconductor substrate 200, and an insulating film formed of silicon oxide or the like or a metal film formed of aluminum or the like buried in the trench.

Next, the lower side of FIG. 6, that is, the front surface side of the semiconductor substrate 200 will be described. Two distribution transistors VG1 and VG2 which are vertical transistors are formed so as to sandwich the N-type semiconductor region 100b therebetween. Specifically, the distribution transistors VG1 and VG2 respectively include the gate electrodes 150a and 150b formed of, for example, a polysilicon film and provided on the front surface of the semiconductor substrate 200. Furthermore, the gate electrodes 150a and 150b each have the buried gate portions 170a and 170b, which extend into the semiconductor substrate 200 in a thickness direction of the semiconductor substrate 200 and are formed of, for example, a polysilicon film. In other words, it can be said that the buried gate portions 170a and 170b are buried in the semiconductor substrate 200 and are in contact with the semiconductor substrate 200 via the gate insulating film (not illustrated). For example, the buried gate portions 170a and 170b of the distribution transistors VG1 and VG2 can be formed by forming a trench on the front surface side of the semiconductor substrate 200 by dry etching, forming the gate insulating film, and burying a polysilicon film or the like in the trench. Note that details of the buried gate portions 170a and 170b according to the present embodiment will be described later.

Note that an impurity concentration of the N-type semiconductor region 100b sandwiched between the buried gate portions 170a and 170b is preferably higher than that of the N-type semiconductor region 100a constituting the photodiode PD, and furthermore, the impurity concentration of the N-type semiconductor region 100b preferably increases as distance from the front surface side of the semiconductor substrate 200 decreases.

Moreover, the electric charge accumulation units MEM1 and MEM2 are provided in the semiconductor substrate 200 so as to sandwich the distribution transistors VG1 and VG2 therebetween in the left-right direction. For example, the electric charge accumulation units MEM1 and MEM2 can be metal-oxide-semiconductor (MOS) capacitors in which the electrodes 154a and 154b formed of a metal film or a polysilicon film, the insulating film (not illustrated) formed of an oxide film, and the N-type semiconductor regions 102a and 102b (MEM1 and MEM2 in FIG. 6) are stacked.

Then, the gate electrodes 156a and 156b of the transfer transistors TG1 and TG2 are provided on the front surface of the semiconductor substrate 200 so as to be adjacent to the electric charge accumulation units MEM1 and MEM2. Furthermore, the N-type semiconductor regions 110a and 110b illustrated as the floating diffusion regions FD1 and FD2 are formed in the semiconductor substrate 200 close to the gate electrodes 156a and 156b of the transfer transistors TG1 and TG2.

Further, a wiring layer 300 is provided on the front surface of the semiconductor substrate 200. The wiring layer 300 includes an insulating film 302 and a metal film 304. Furthermore, an electrode 306 is provided on a surface of the wiring layer 300 opposite from the semiconductor substrate 200.

In addition, a substrate 400 is provided on the surface of the wiring layer 300 opposite from the semiconductor substrate 200. The substrate 400 also includes an insulating film 402 and a metal film 404, and an electrode 406 is provided on a surface of the substrate 400 on a side adjacent to the wiring layer 300. For example, the electrode 306 of the wiring layer 300 and the electrode 406 of the substrate 400 are formed of copper (Cu) or the like, and can be in contact with each other to bond the wiring layer 300 and the substrate 400 to each other.

Note that the cross-sectional structure of the light receiving element 10 according to the present embodiment is not limited to the example illustrated in FIG. 6, and may include, for example, other elements and the like, and is not particularly limited.

Next, details of the buried gate portions 170a and 170b according to the present embodiment will be described with reference to FIG. 7. FIG. 7 is a cross-sectional view of the light receiving element 10 taken along line B-B' of FIG. 5 as described above. Specifically, FIG. 7 is a cross-sectional view of the gate electrode 150b of the distribution transistor VG2 and buried gate portions 170b-1 and 170b-2 (the gate insulating film is omitted in FIG. 7). As illustrated in FIG. 7, in the present embodiment, the gate electrode 150b of the distribution transistor VG2 has a pair of buried gate portions 170b-1 and 170b-2 arranged in the top-bottom direction in FIG. 5, that is, in the column direction in FIG. 2A. Furthermore, as indicated by a broken line in FIG. 5, the buried gate portions 170b-1 and 170b-2 preferably have a substantially rectangular shape having a longer side L (see FIG. 9) extending in a direction from the center point O of the photodiode PD toward the electric charge accumulation unit MEM2 in a cross section of the light receiving element 10 taken along the front surface of the semiconductor substrate 200. Similarly to the gate electrode 150b of the distribution transistor VG2, the gate electrode 150a of the distribution transistor VG1 also has a pair of buried gate portions 170 arranged in the top-bottom direction in FIG. 5, that is, in the column direction in FIG. 2A. Furthermore, the buried gate portions 170 of the gate electrode 150a of the distribution transistor VG1 also preferably have a substantially rectangular shape having a longer side L (see FIG. 9) extending in a direction from the center point O of the photodiode PD toward the electric charge accumulation unit MEM2 in a cross section of the light receiving element 10 taken along the front surface of the semiconductor substrate 200, as indicated by a broken line in FIG. 5.

Specifically, in the present embodiment, as illustrated in FIG. 8, a voltage is applied to the buried gate portions 170b-1 and 170b-2 via the gate electrode 150b, thereby modulating a P-type semiconductor region in a periphery 700 of the buried gate portions 170b-1 and 170b-2. Then, as illustrated in FIG. 9, electric charges (electrons) generated in the photodiode PD at a deep portion of the semiconductor substrate 200 pass through the periphery 700 in the semiconductor substrate 200 modulated by the buried gate portion 170b and are transferred to the electric charge accumulation unit MEM2. In the present embodiment, a potential of the periphery 700 can be more effectively modulated with low power consumption by the two buried gate portions 170b-1 and 170b-2, and as a result, the electric charges can be transferred to the electric charge accumulation unit MEM2 at a higher speed.

Furthermore, in the present embodiment, the buried gate portions 170b-1 and 170b-2 are formed in a substantially rectangular shape having the longer side L (see FIG. 9) extending in the direction from the center point O of the photodiode PD toward the electric charge accumulation unit MEM2. In this way, since the direction in which the longer side L extends and a direction in which the electric charges move are the same, the buried gate portion 170b can effectively modulate a region through which the electric charges pass and can guide the electric charges to the electric charge accumulation unit MEM2 along the modulated region.

Furthermore, in the present embodiment, as indicated by a broken line in FIG. 5, the gate electrodes 152a and 152b of the electric charge drain transistors OFG1 and OFG2 may also have a pair of buried gate portions 170 that is buried in the semiconductor substrate 200 and is in contact with the semiconductor substrate 200 via the gate insulating film (not illustrated). As a result, in the present embodiment, the two buried gate portions 170 of the gate electrodes 152a and 152b of the electric charge drain transistors OFG1 and OFG2 can more effectively modulate the potential of the periphery with low power consumption and drain the electric charges at a higher speed.

Furthermore, as indicated by a broken line in FIG. 5, the buried gate portions 170 of the gate electrodes 152a and 152b of the electric charge drain transistors OFG1 and OFG2 also preferably has a substantially rectangular shape having a longer side extending in a direction from the center point O of the photodiode PD toward the N-type semiconductor regions 104a and 104b connected to the power supply circuit (power supply potential VDD) in a cross section of the light receiving element 10 taken along the front surface of the semiconductor substrate 200. In this way, since a region where the electric charges move can be more effectively modulated, the electric charges can be drained at a higher speed.

That is, according to the present embodiment, it is possible to provide the light receiving element 10 capable of transferring electric charges at a high speed.

6.3 Modified Examples

The light receiving element 10 according to the first embodiment of the present disclosure described above can also be modified as follows. Hereinafter, first to seventh modified examples of the present embodiment will be described. Note that in each of the light receiving elements 10 according to the first to seventh modified examples described below, the gate electrode 150 of the distribution transistor VG has a pair of buried gate portions 170.

First Modified Example

Figure 10:
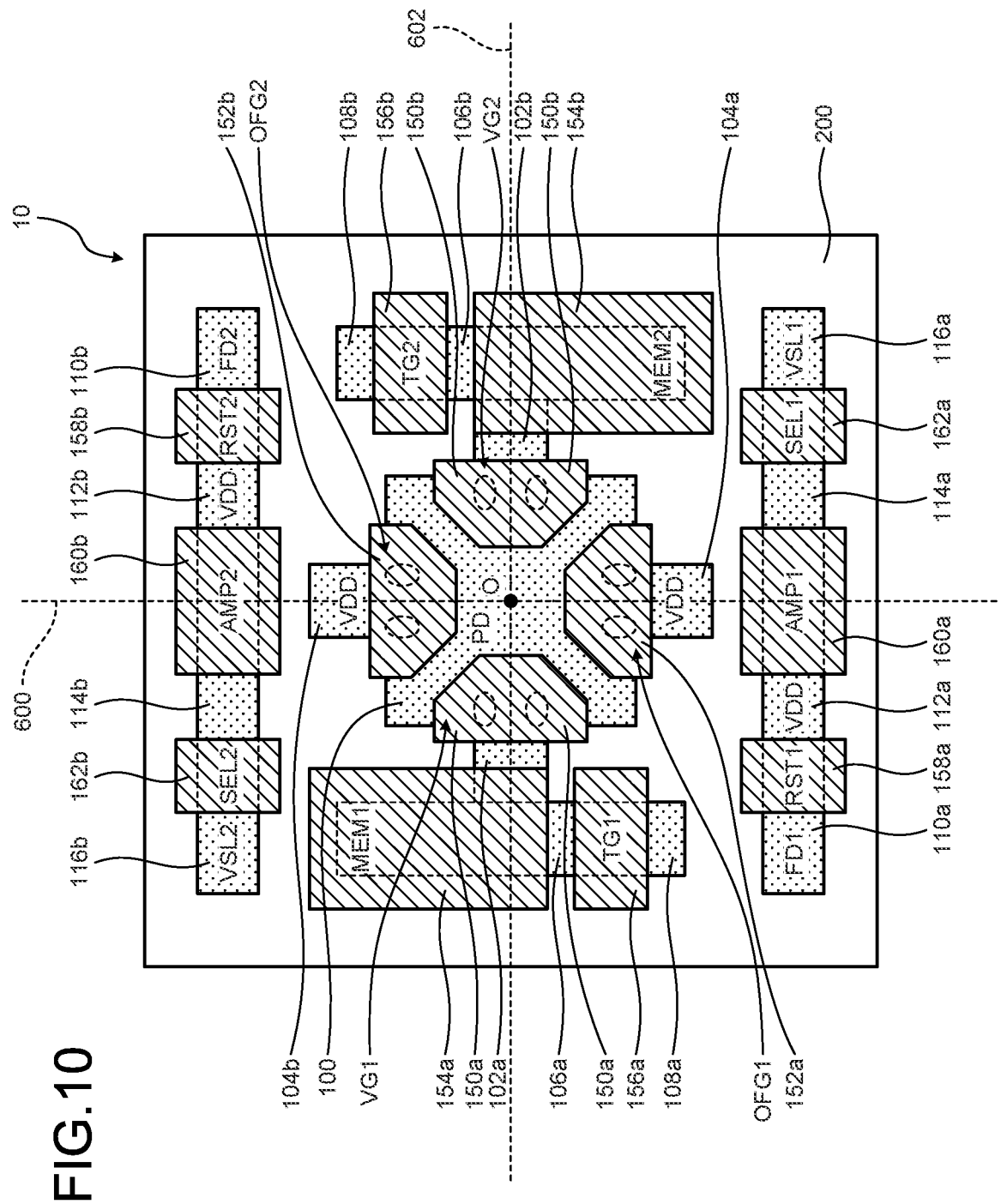
FIG. 10 is an explanatory diagram illustrating a planar configuration example of the light receiving element 10 according to a first modified example of the first embodiment.

First, the first modified example will be described with reference to FIG. 10. FIG. 10 is an explanatory diagram illustrating a planar configuration example of the light receiving element 10 according to the first modified example of the present embodiment. Also in the present modified example, the gate electrodes 150a and 150b of the distribution transistors VG1 and VG2 each have a pair of buried gate portions 170. Furthermore, in the present modified example, as indicated by a broken line in FIG. 10, each buried gate portion 170 has a substantially elliptical shape having a major axis extending in a direction from the center point O of the photodiode PD toward the electric charge accumulation units MEM1 and MEM2 in a cross section of the light receiving element 10 taken along the front surface of the semiconductor substrate 200. In the present modified example, as the buried gate portion 170 is formed in a substantially elliptical shape having a major axis extending in the direction from the center point O of the photodiode PD toward the electric charge accumulation units MEM1 and MEM2, it is possible to guide electric charges to the electric charge accumulation units MEM1 and MEM2 at a higher speed as in the first embodiment described above.

Note that, also in the present modified example, the gate electrodes 152a and 152b of the electric charge drain transistors OFG1 and OFG2 may also have a pair of buried gate portions 170 buried in the semiconductor substrate 200. Furthermore, in the present modified example, the buried gate portions 170 of the gate electrodes 152a and 152b of the electric charge drain transistors OFG1 and OFG2 can also have a substantially elliptical shape having a major axis extending in a direction from the center point O of the photodiode PD toward the N-type semiconductor regions 104a and 104b connected to the power supply circuit (power supply potential VDD) in a cross section of the light receiving element 10 taken along the front surface of the semiconductor substrate 200, as indicated by a broken line in FIG. 10.

In addition, in the first modified example, the electric charge accumulation units MEM1 and MEM2 and the transfer transistors TG1 and TG2 are provided so as to be mirror-symmetric with respect to the center line 600 and to sandwich the N-type semiconductor regions 102 and the distribution transistors VG1 and VG2 therebetween. Note that the electric charge accumulation unit MEM1 is arranged adjacent to the transfer transistor TG1 in the top-bottom direction (column direction) in FIG. 10, and the electric charge accumulation unit MEM2 is arranged adjacent to the transfer transistor TG2 in the top-bottom direction (column direction) in FIG. 10.

Further, in the first modified example, the reset transistors RST1 and RST2, the amplification transistors AMP1 and AMP2, and the selection transistors SEL1 and SEL2 are disposed so as to be mirror-symmetric with respect to the center line 602 and to sandwich the N-type semiconductor regions 102 and the electric charge drain transistors OFG1 and OFG2 therebetween. Note that the reset transistor RST1, the amplification transistor AMP1, and the selection transistor SEL1 are arranged adjacent to each other in the left-right direction (row direction) in FIG. 10, and the reset transistor RST2, the amplification transistor AMP2, and the selection transistor SEL2 are also arranged adjacent to each other in the left-right direction (row direction) in FIG. 10.

Second Modified Example

Figure 11:
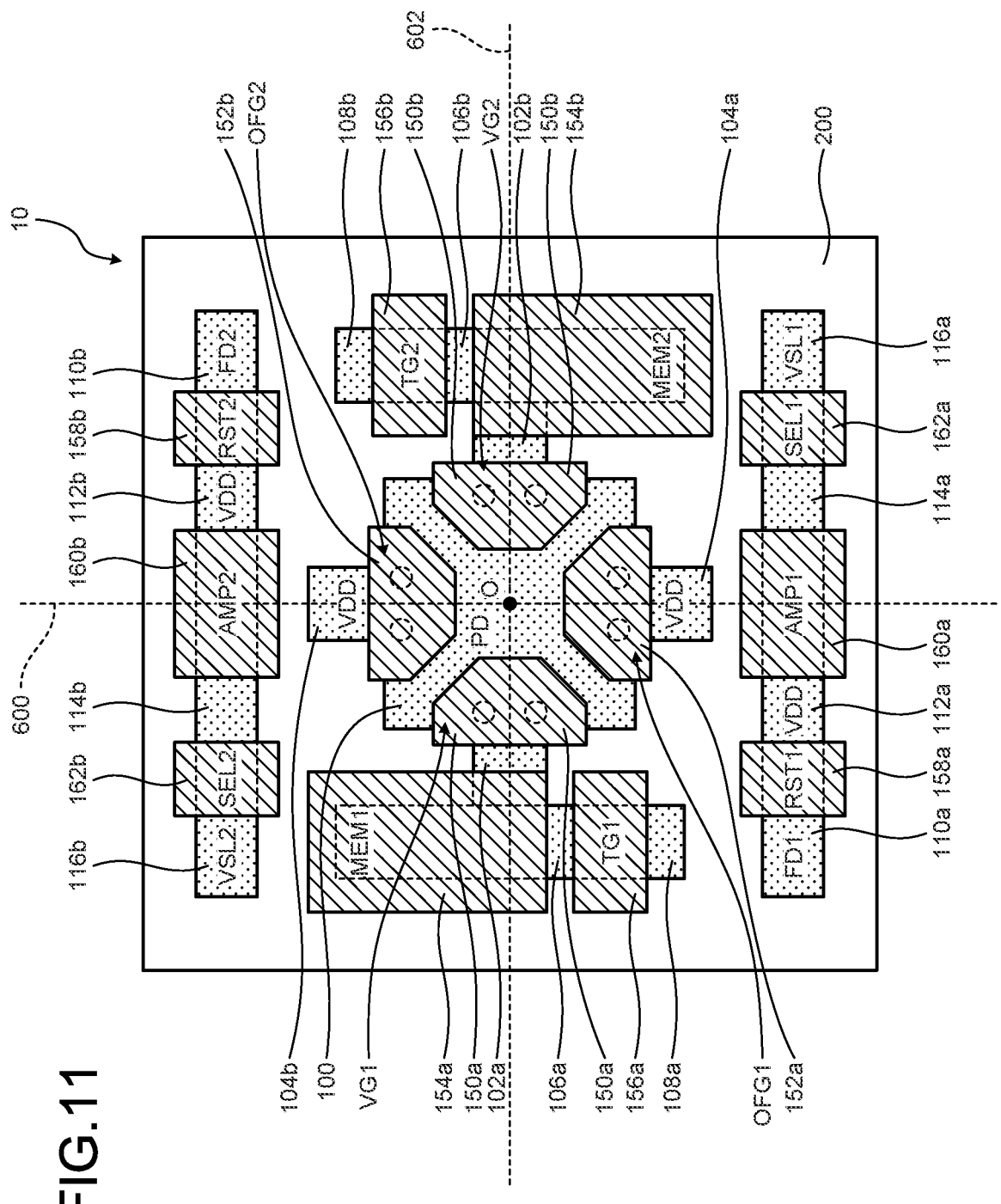
FIG. 11 is an explanatory diagram illustrating a planar configuration example of the light receiving element 10 according to a second modified example of the first embodiment.

Next, the second modified example will be described with reference to FIG. 11. FIG. 11 is an explanatory diagram illustrating a planar configuration example of the light receiving element 10 according to the second modified example of the present embodiment. Also in the present modified example, the gate electrodes 150a and 150b of the distribution transistors VG1 and VG2 each have a pair of buried gate portions 170. Furthermore, in the present modified example, each buried gate portion 170 has a substantially circular shape in a cross section of the light receiving element 10 taken along the front surface of the semiconductor substrate 200 as indicated by a broken line in FIG. 11. In the present modified example, as the buried gate portion 170 is formed in a substantially circular shape, it is possible to prevent the shape from varying in manufacturing, and thus, it is possible to adjust electric charge distribution performances of the two distribution transistors VG1 and VG2 to be equal to each other.

Note that, also in the present modified example, the gate electrodes 152a and 152b of the electric charge drain transistors OFG1 and OFG2 may also have a pair of buried gate portions 170 buried in the semiconductor substrate 200. Furthermore, in the present modified example, the buried gate portions 170 of the gate electrodes 152a and 152b can also have a substantially circular shape in a cross section of the light receiving element 10 taken along the front surface of the semiconductor substrate 200 as indicated by a broken line in FIG. 11.

Third Modified Example

Figure 12:
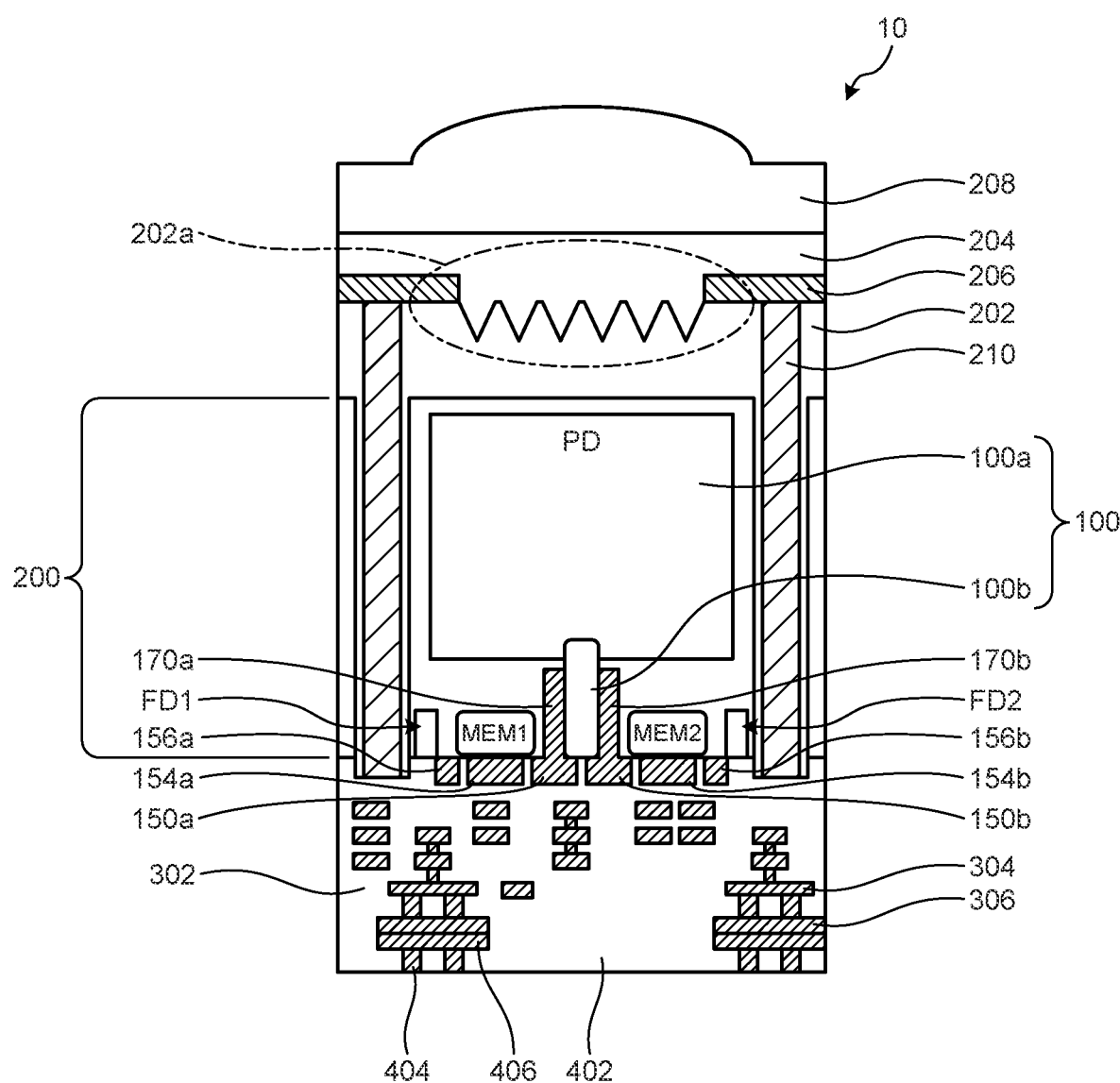
FIG. 12 is an explanatory diagram illustrating a cross-sectional configuration example of the light receiving element 10 according to a third modified example of the first embodiment.

Next, the third modified example will be described with reference to FIG. 12. FIG. 12 is an explanatory diagram illustrating a cross-sectional configuration example of the light receiving element 10 according to the third modified example of the present embodiment. Also in the present modified example, the gate electrodes 150a and 150b of the distribution transistors VG1 and VG2 each have a pair of buried gate portions 170a and 170b. Furthermore, in the present modified example, as illustrated in FIG. 12, the light receiving element 10 includes a moth-eye structure 202a provided on the back surface (a surface opposite to the front surface) of the semiconductor substrate 200 and formed with fine unevenness. Specifically, as illustrated in FIG. 12, in the moth-eye structure 202a, a plurality of substantially quadrangular pyramids having apexes on the semiconductor substrate 200 side are arranged in a matrix pattern. In the present modified example, as the moth-eye structure 202a is provided, it is possible to alleviate a rapid change in refractive index at an interface and to prevent reflection.

Fourth Modified Example

Figure 13:
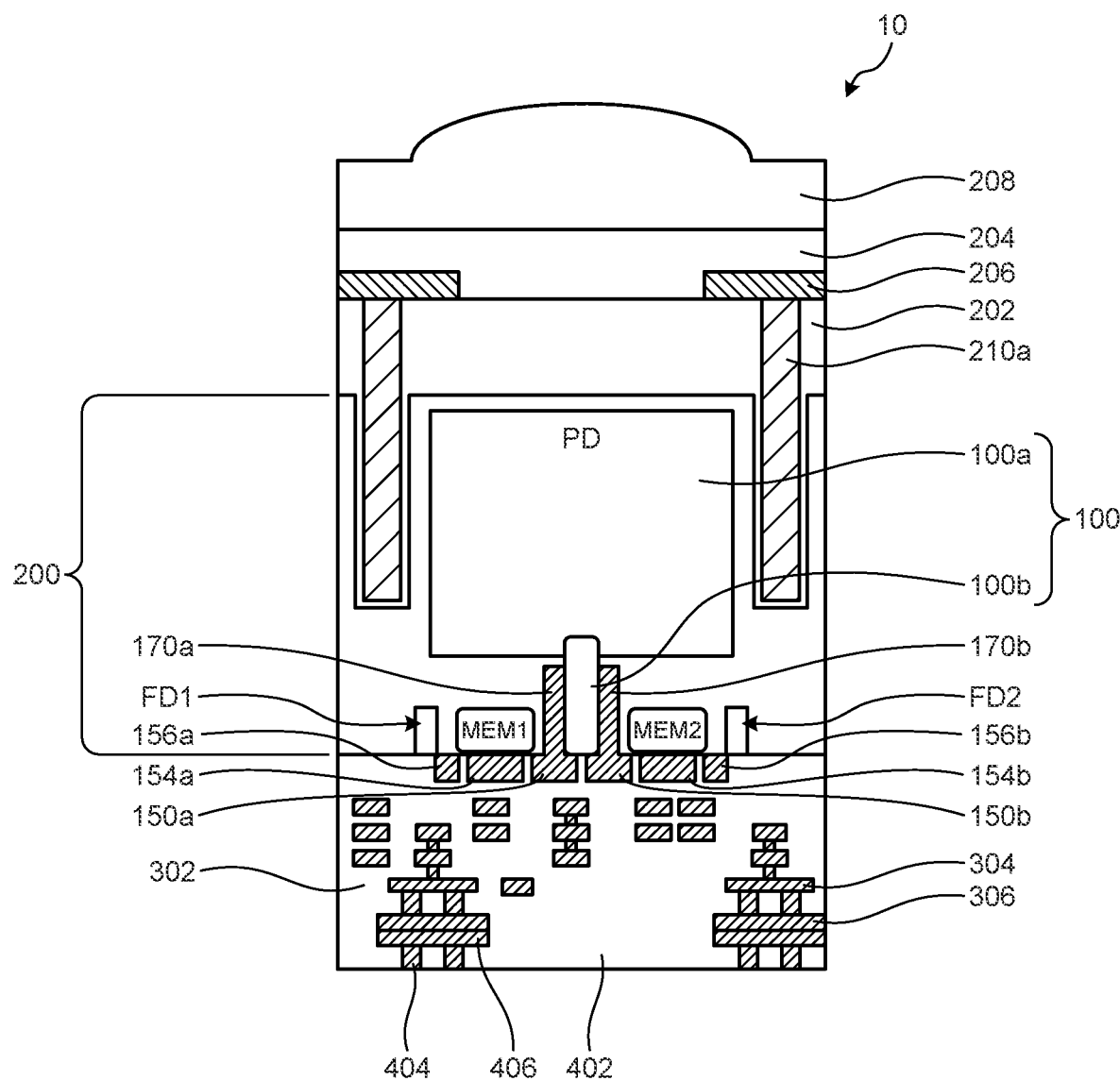
FIG. 13 is an explanatory diagram illustrating a cross-sectional configuration example of the light receiving element 10 according to a fourth modified example of the first embodiment.

Next, the fourth modified example will be described with reference to FIG. 13. FIG. 13 is an explanatory diagram illustrating a cross-sectional configuration example of the light receiving element 10 according to the fourth modified example of the present embodiment. Also in the present modified example, the gate electrodes 150a and 150b of the distribution transistors VG1 and VG2 each have a pair of buried gate portions 170a and 170b. Furthermore, in the present modified example, as illustrated in FIG. 13, the light receiving element 10 includes a pixel isolation portion (second pixel isolation portion) 210a (deep trench isolation (DTI)) penetrating from the back surface (a surface opposite to the front surface) of the semiconductor substrate 200 to the middle of the semiconductor substrate 200 in the thickness direction of the semiconductor substrate 200. With the pixel isolation portion 210a, it is possible to prevent incident light from entering the adjacent light receiving element 10.

Fifth Modified Example

Figure 14:
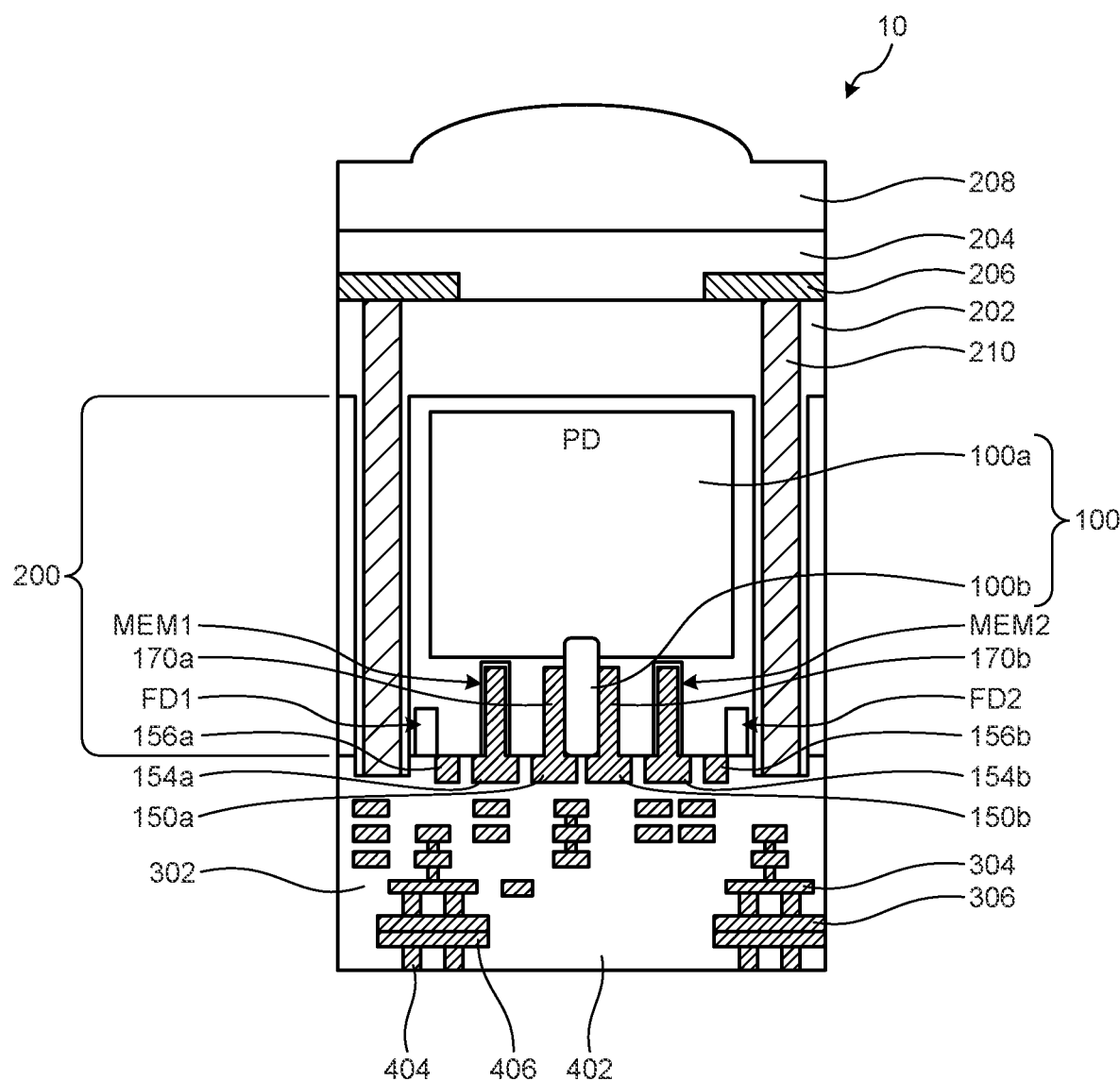
FIG. 14 is an explanatory diagram illustrating a cross-sectional configuration example of the light receiving element 10 according to a fifth modified example of the first embodiment.

Next, the fifth modified example will be described with reference to FIG. 14. FIG. 14 is an explanatory diagram illustrating a cross-sectional configuration example of the light receiving element 10 according to the fifth modified example of the present embodiment. Also in the present modified example, the gate electrodes 150a and 150b of the distribution transistors VG1 and VG2 each have a pair of buried gate portions 170a and 170b. Furthermore, in the present modified example, the electric charge accumulation units MEM1 and MEM2 including the vertical electrodes 154a and 154b buried in the N-type semiconductor regions 102a and 102b in the semiconductor substrate 200 are included. According to the present modified example, since the electric charge accumulation units MEM1 and MEM2 include the vertical electrodes, an area of an insulating film (not illustrated) sandwiched between the vertical electrodes and the N-type semiconductor regions 102a and 102b facing the electrodes can be increased. As a result, according to the present modified example, since the area increases, capacitances of the electric charge accumulation units MEM1 and MEM2 can further increase, and eventually, a wide dynamic range of the light receiving element 10 can be secured.

Sixth Modified Example

Figure 15:
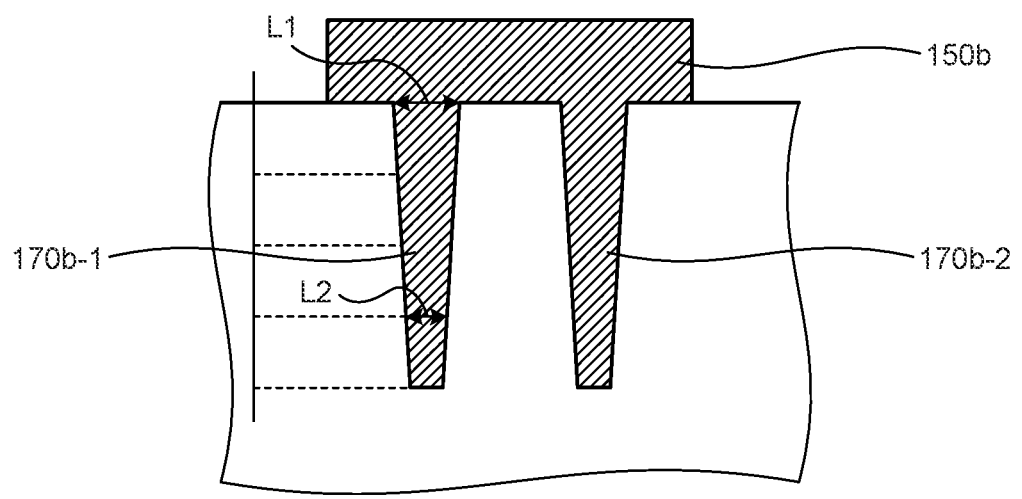
FIG. 15 is an explanatory diagram illustrating a cross-sectional configuration example of a part of the light receiving element 10 according to a sixth modified example of the first embodiment.

Next, the sixth modified example will be described with reference to FIG. 15. FIG. 15 is an explanatory diagram illustrating a cross-sectional configuration example of a part of the light receiving element 10 according to the sixth modified example of the present embodiment, and corresponds to the cross-sectional view of FIG. 7. Also in the present modified example, the gate electrode 150b of the distribution transistor VG2 includes the pair of buried gate portions 170b-1 and 170b-2. Furthermore, in the present modified example, as illustrated in FIG. 15, each of the buried gate portions 170b-1 and 170b-2 has a tapered shape that gradually narrows in the thickness direction of the semiconductor substrate 200 from the front surface of the semiconductor substrate 200 toward the back surface opposite to the front surface. In other words, in the present modified example, a distance (width) between side surfaces of the pair of buried gate portions 170b-1 and 170b-2 that face each other gradually increases in the thickness direction of the semiconductor substrate 200 from the front surface of the semiconductor substrate 200 toward the back surface opposite to the front surface.

In the present modified example, as the distance between the side surfaces of the pair of buried gate portions 170b-1 and 170b-2 that face each other increases from the front surface of the semiconductor substrate 200 in the thickness direction of the semiconductor substrate 200, a suitable potential gradient is generated in the thickness direction of the semiconductor substrate 200, and electric charges to be transferred are easily collected in the vicinity of the front surface of the semiconductor substrate 200. Then, in the present modified example, as the electric charges are collected in the vicinity of the front surface of the semiconductor substrate 200 and transferred, a stable electric charge distribution operation can be performed, and distance measurement accuracy can be improved.

For example, as illustrated in FIG. 15, in each of the buried gate portions 170b-1 and 170b-2, a diameter L2 at a position corresponding to ¾ of a length (depth) of each of the buried gate portions 170b-1 and 170b-2 from the front surface of the semiconductor substrate 200 in the thickness direction of the semiconductor substrate 200 is preferably about ¾ of a diameter L1 at the front surface of the semiconductor substrate 200. In this way, when the buried gate portions 170b-1 and 170b-2 are formed, generation of a void in the buried gate portions 170b-1 and 170b-2 can be prevented and a favorable burying property can be maintained.

Seventh Modified Example

Figure 16:
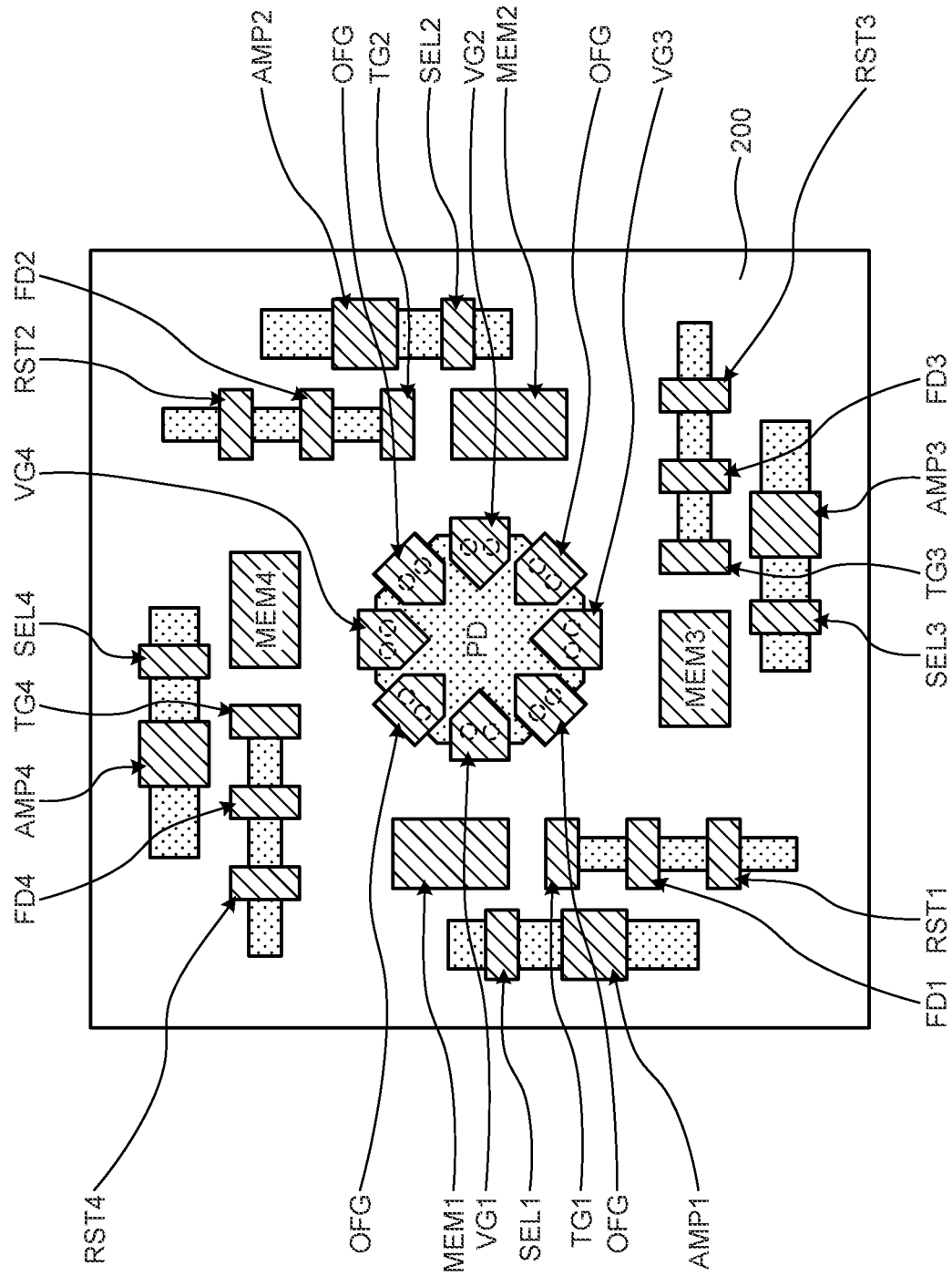
FIG. 16 is an explanatory diagram illustrating a cross-sectional configuration example of the light receiving element 10 according to a seventh modified example of the first embodiment.

Next, the seventh modified example will be described with reference to FIG. 16. FIG. 16 is an explanatory diagram illustrating a cross-sectional configuration example of the light receiving element 10 according to the seventh modified example of the present embodiment. In the present modified example, as illustrated in FIG. 16, the light receiving element 10 may include a plurality of distribution transistors VG, more specifically, four distribution transistors VG. Also in the present modified example, the gate electrode (third distribution gate) 150 of each distribution transistor VG has a pair of buried gate portions 170, and can distribute electric charges to the electric charge accumulation unit (third electric charge accumulation unit) MEM. Note that, also in the present modified example, the gate electrode 152 of the electric charge drain transistor OFG may also have a pair of buried gate portions buried in the semiconductor substrate 200.

7. Second Embodiment

By the way, in the first embodiment of the present disclosure described above, a large parasitic capacitance is generated in the distribution transistor VG as the pair of buried gate portions 170 buried in the semiconductor substrate 200 is provided. Then, due to such a large parasitic capacitance, a speed at which electric charges are transferred by the distribution transistor VG may decrease. Therefore, in a second embodiment of the present disclosure described below, in order to reduce a parasitic capacitance of a gate electrode 150 of a distribution transistor VG, a low dielectric layer is provided so as to be in contact with a portion of a buried gate portion 170 other than a portion functioning at the time of transferring electric charges. Hereinafter, details of the present embodiment will be sequentially described.

7.1 Embodiment

Figure 17:
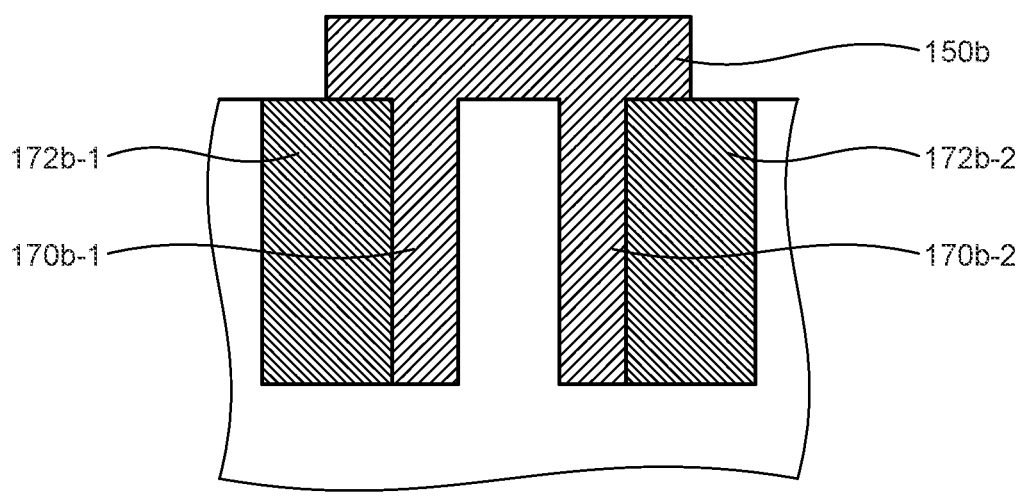
FIG. 17 is an explanatory diagram for describing a light receiving element 10 according to a second embodiment of the present disclosure.
Figure 18:
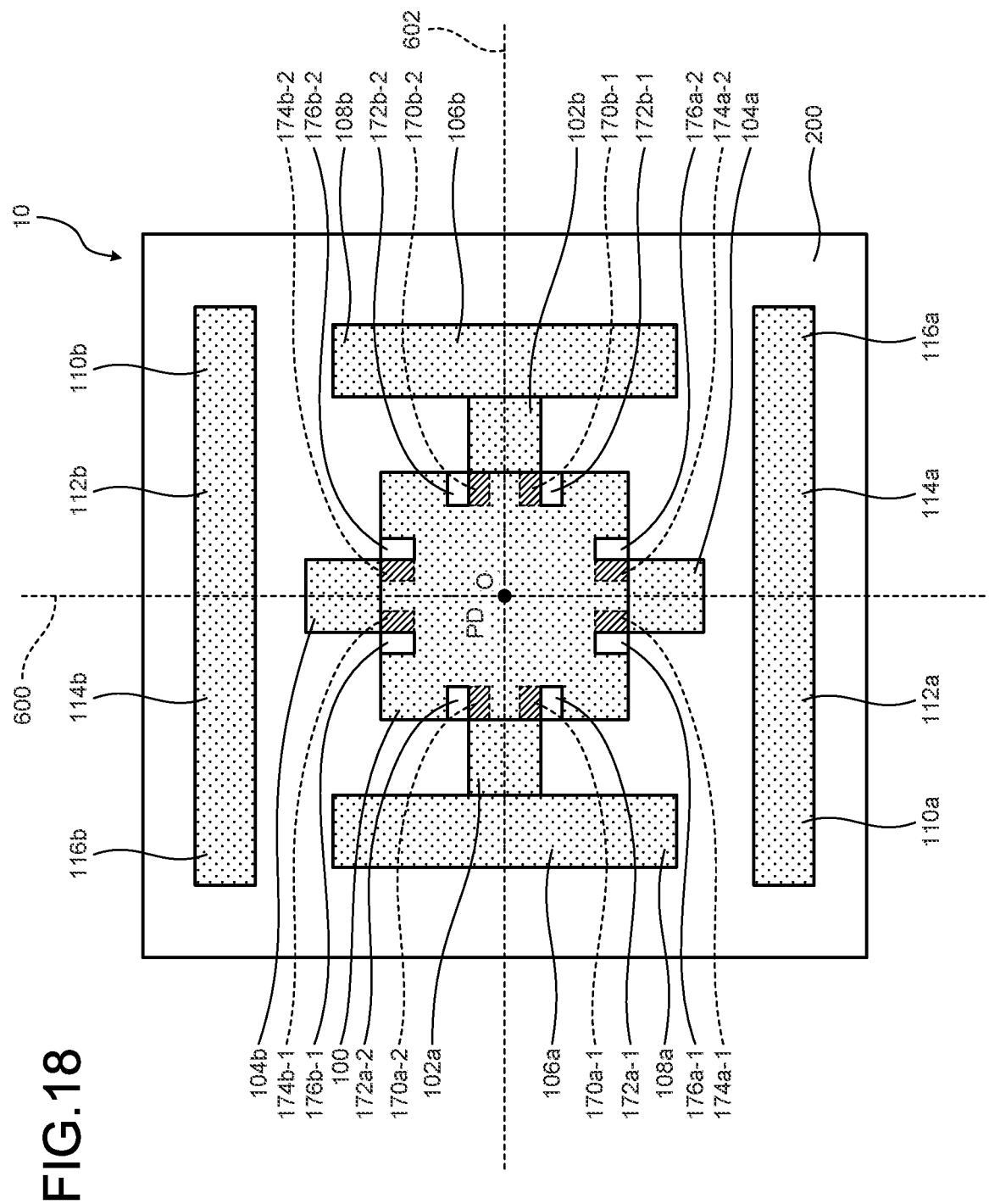
FIG. 18 is an explanatory diagram illustrating a planar configuration example of the light receiving element 10 according to the second embodiment.

First, the buried gate portion 170 of the distribution transistor VG according to the present embodiment will be described with reference to FIGS. 17 and 18. FIG. 17 is an explanatory diagram for describing a light receiving element 10 according to the present embodiment, and corresponds to the cross-sectional view of FIG. 7. FIG. 18 is an explanatory diagram illustrating a planar configuration example of the light receiving element 10 according to the present embodiment, and specifically, is a view in which illustration of the gate electrode 150 and the like is omitted on a front surface of a semiconductor substrate 200 for convenience of description.

In the present embodiment, as illustrated in FIGS. 17 and 18, among a pair of buried gate portions 170b-1 and 170b-2, a side surface of one buried gate portion 170b-1 that is opposite to a side surface facing the other buried gate portion 170b-2 is in contact with a low dielectric layer 172b-1 or 172b-2. The low dielectric layer 172b can be formed of, for example, an oxide film (for example, $SiO_2$) or a nitride film (for example, SiN). As described above, in the present embodiment, as the low dielectric layer 172 is provided so as to be in contact with a portion of the buried gate portion 170 other than a portion functioning at the time of transferring electric charges, an increase in parasitic capacitance of the gate electrode 150 can be suppressed. As a result, in the present embodiment, it is possible to avoid a decrease in speed at which electric charges are transferred by the distribution transistor VG.

Note that, in the present embodiment, as illustrated in FIG. 18, a gate electrode 152 of an electric charge drain transistor OFG may also have a pair of buried gate portions 174 buried in the semiconductor substrate 200. Furthermore, among a pair of buried gate portions 174a and 174b of the gate electrode 152 of the electric charge drain transistor OFG, a side surface of one buried gate portion 174b-1 that is opposite to a side surface facing the other buried gate portion 174b-2 may be in contact with a low dielectric layer 176b-1 or 176b-2. The low dielectric layer 176b can also be formed of, for example, an oxide film or a nitride film. In this way, it is possible to suppress an increase in parasitic capacitance of the gate electrode 152 of the electric charge drain transistor OFG and to avoid a decrease in speed at which electric charges are drained by the electric charge drain transistor OFG.

7.2 Modified Examples

Figure 19:
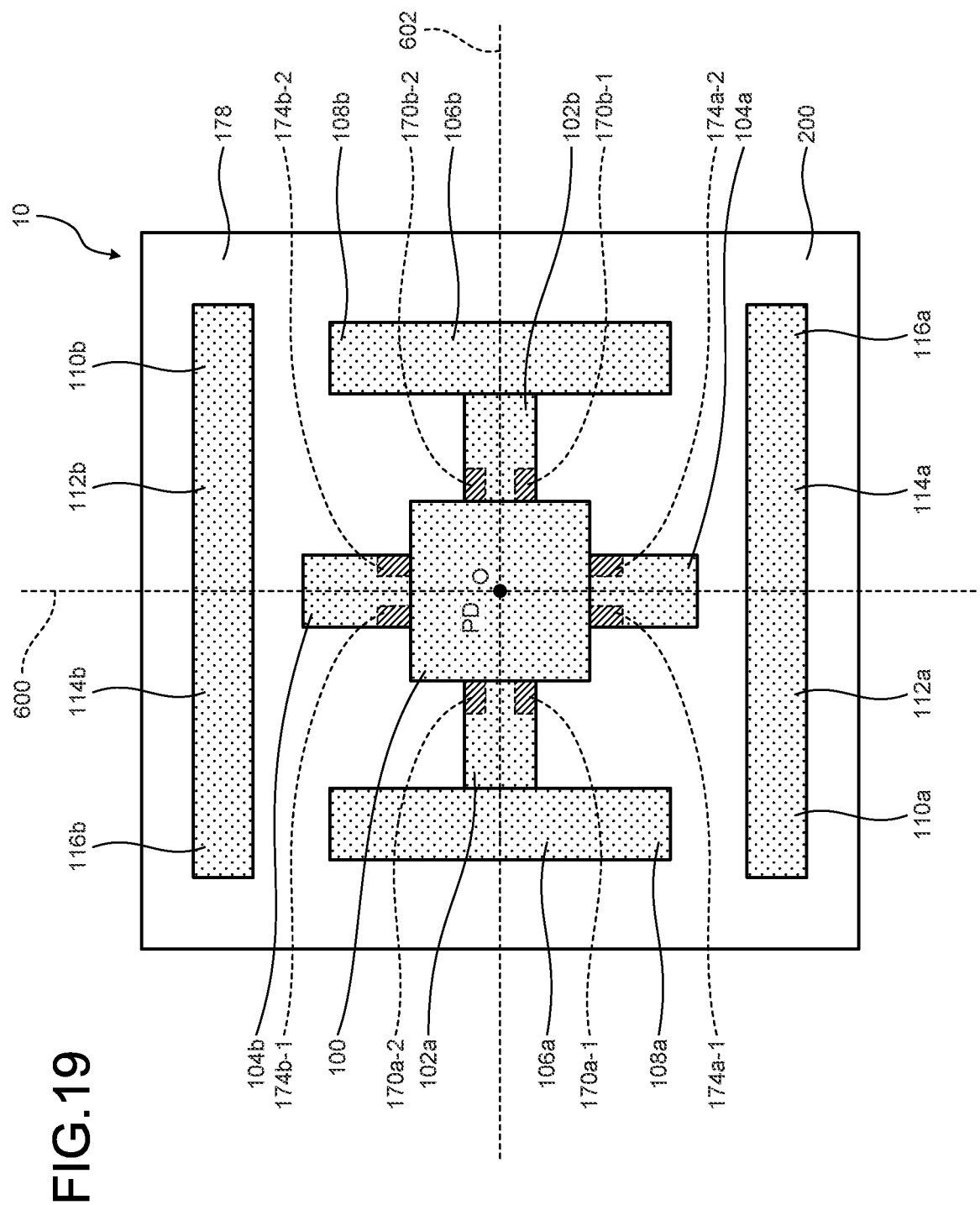
FIG. 19 is an explanatory diagram illustrating a planar configuration example of the light receiving element 10 according to a first modified example of the second embodiment.
Figure 20:
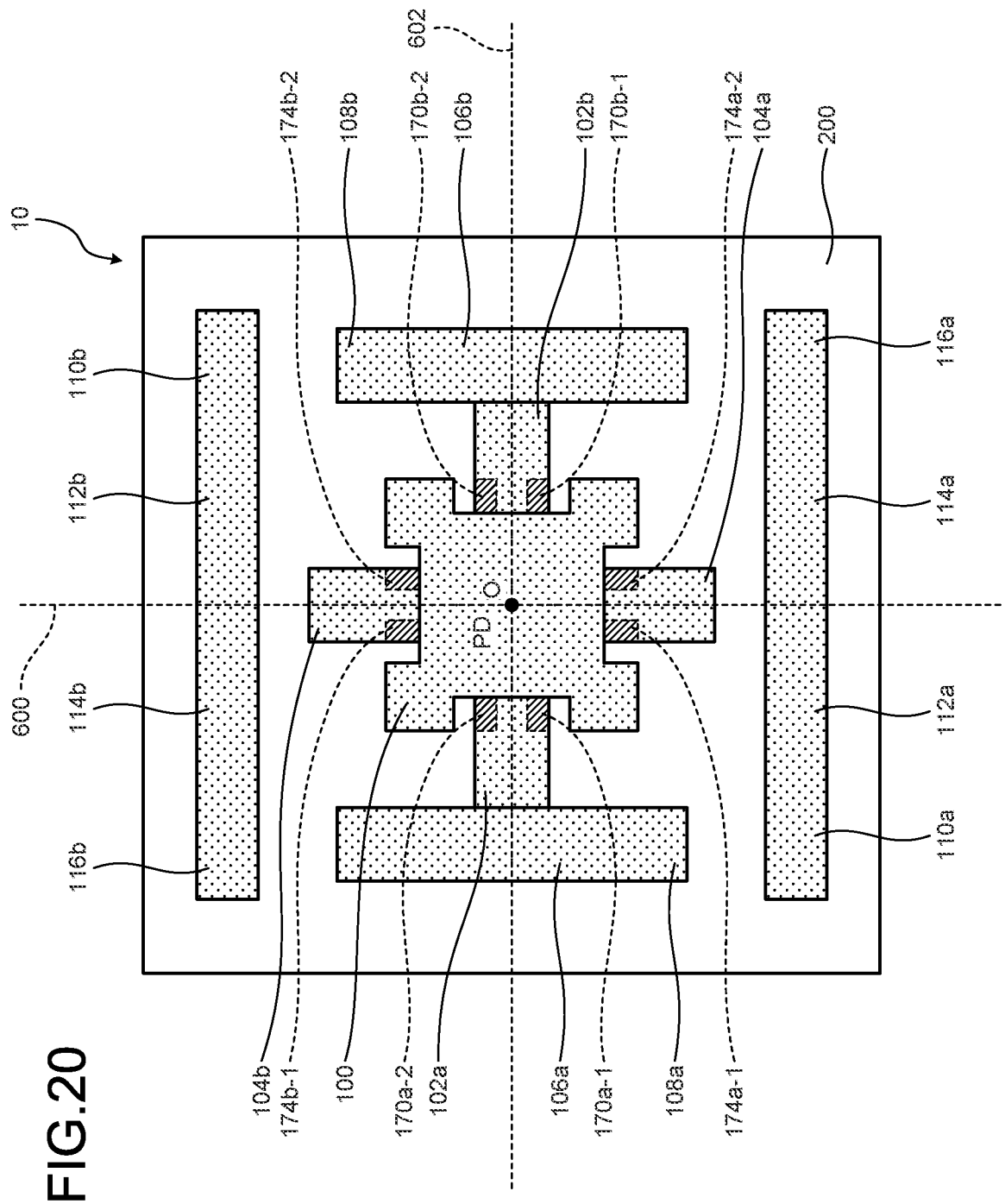
FIG. 20 is an explanatory diagram illustrating a planar configuration example of the light receiving element 10 according to a second modified example of the second embodiment.

Note that the light receiving element 10 according to the second embodiment of the present disclosure described above can also be modified as follows. First and second modified examples of the present embodiment will be described below with reference to FIGS. 19 and 20. FIG. 19 is an explanatory diagram illustrating a planar configuration example of the light receiving element 10 according to the first modified example of the present embodiment, and FIG. 20 is an explanatory diagram illustrating a planar configuration example of the light receiving element 10 according to the second modified example of the present embodiment. Note that, similarly to FIG. 18, FIGS. 19 and 20 are views in which illustration of the gate electrode 150 and the like is omitted on the front surface of the semiconductor substrate 200 for convenience of description.

As illustrated in FIGS. 19 and 20, in these modified examples, one side surface of the buried gate portion 170 is in contact with a low dielectric layer 178, and the low dielectric layer 178 includes an element isolation portion for electrically isolating each element on the semiconductor substrate 200. Furthermore, in these modified examples, as illustrated in FIGS. 19 and 20, one side surface of each of the pair of buried gate portions 174*a* and 174*b* of the gate electrode 152 of the electric charge drain transistor OFG is also in contact with the low dielectric layer 178, and the low dielectric layer 178 includes an element isolation portion for electrically isolating each element on the semiconductor substrate 200.

7.3 Manufacturing Method

Next, an example of a method for manufacturing the buried gate portion 170 and the low dielectric layer 178 according to the present embodiment will be described with reference to FIGS. 21A to 21F. FIGS. 21A to 21F are explanatory diagrams for describing the method for manufacturing the light receiving element 10 according to the present embodiment.

Figure 21A:
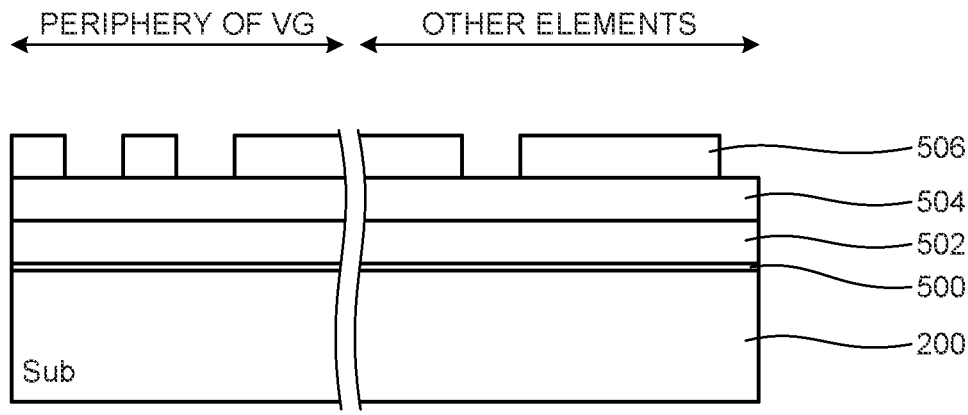
FIG. 21A is an explanatory diagram (part 1) for describing a method for manufacturing the light receiving element 10 according to the second embodiment.

First, as illustrated in FIG. 21A, a thermally oxidized silicon layer 500 is formed on the front surface of the semiconductor substrate 200. Further, a silicon nitride layer 502, a silicon oxide layer 504, and a patterned resist 506 are formed on the thermally oxidized silicon layer 500.

Figure 21B:
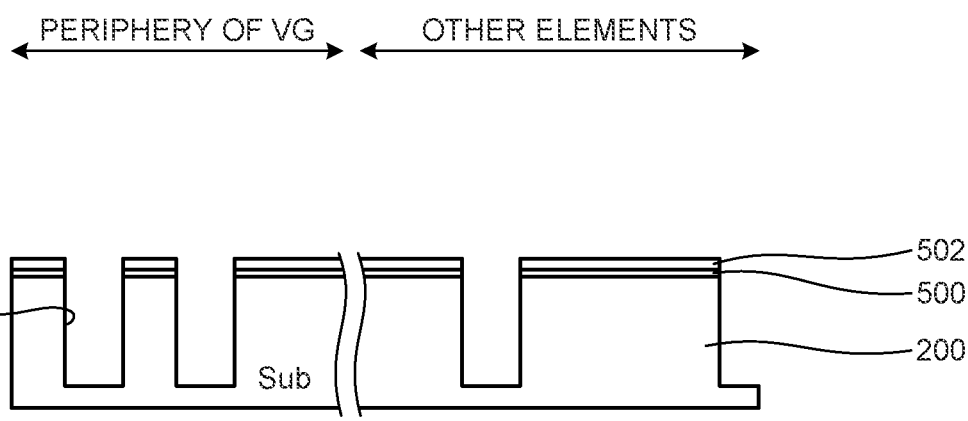
FIG. 21B is an explanatory diagram (part 2) for describing the method for manufacturing the light receiving element 10 according to the second embodiment.

Next, dry etching is performed along the pattern of the resist 506 to remove the silicon oxide layer 504, so that a trench 510 as illustrated in FIG. 21B is formed.

Figure 21C:
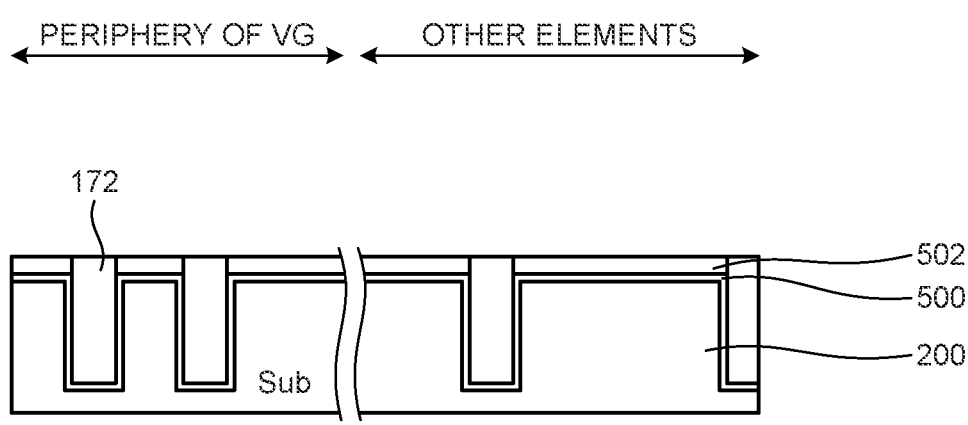
FIG. 21C is an explanatory diagram (part 3) for describing the method for manufacturing the light receiving element 10 according to the second embodiment.

Then, thermal oxidation is performed to form the thermally oxidized silicon layer 500 on a bottom surface and a side surface in the trench 510, and further, as illustrated in FIG. 21C, a silicon oxide film (low dielectric layer) 172 is buried in the trench 510.

Figure 21D:
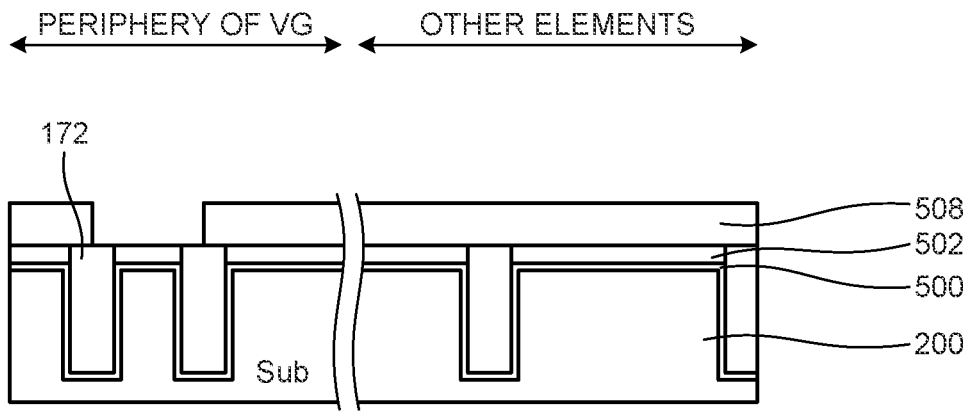
FIG. 21D is an explanatory diagram (part 4) for describing the method for manufacturing the light receiving element 10 according to the second embodiment.

Furthermore, a patterned resist 508 is formed as illustrated in FIG. 21D.

Figure 21E:
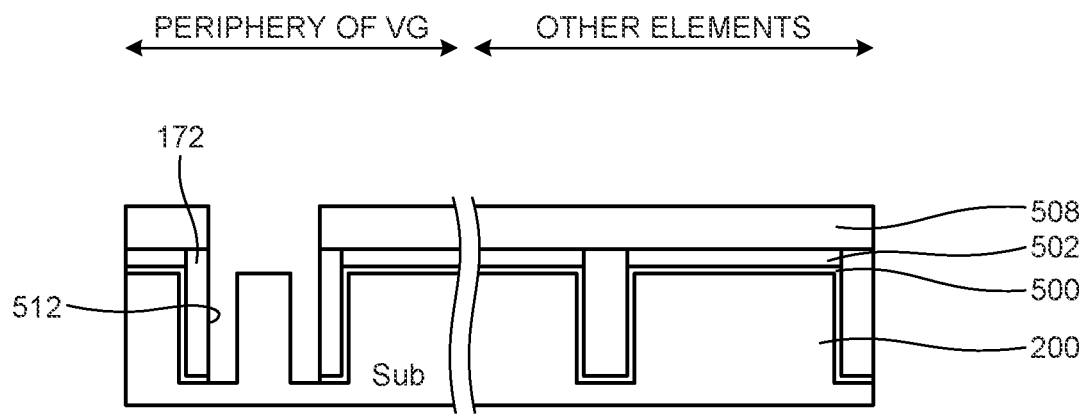
FIG. 21E is an explanatory diagram (part 5) for describing the method for manufacturing the light receiving element 10 according to the second embodiment.

Next, as illustrated in FIG. 21E, dry etching is performed on the silicon oxide film 172 along the pattern of the resist 508 to form a trench 512.

Figure 21F:
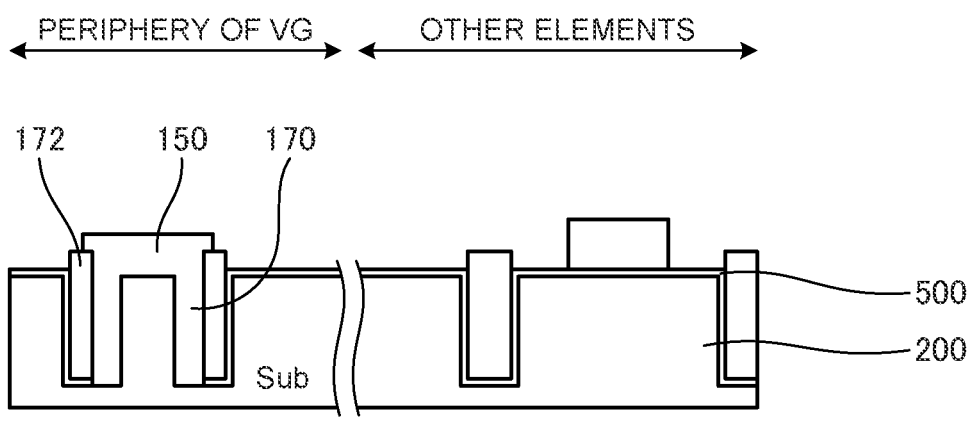
FIG. 21F is an explanatory diagram (part 6) for describing the method for manufacturing the light receiving element 10 according to the second embodiment.

Then, by burying a polysilicon film (buried gate portions) 170 (150) in the trench 512, and removing the resist 508 and the silicon nitride layer 502, a structure as illustrated in FIG. 21F can be obtained.

As described above, according to the present embodiment, as the low dielectric layer 178 is formed so as to be in contact with a side surface of one buried gate portion 170 that is opposite to a side surface facing the other buried gate portion 170, the parasitic capacitance of the gate electrode 150 of the distribution transistor VG can be reduced.

8. Third Embodiment

Furthermore, in the first and second embodiments and the modified examples thereof described above, the insulating films (not illustrated) of the electric charge accumulation units MEM1 and MEM2, the gate insulating films (not illustrated) of the amplification transistors AMP1 and AMP2, and the like may be thinned. In this way, the capacitances of the electric charge accumulation units MEM1 and MEM2 can be increased without increasing the size. Furthermore, since the number of crystal defects in the gate insulating film decreases, an influence of the crystal defects decreases due to an increase in transconductance gm of the transistor, or an interface state decreases due to a reduction in heat treatment time or heat treatment temperature, random noise of the amplification transistors AMP1 and AMP2 can be reduced.

Figure 22:
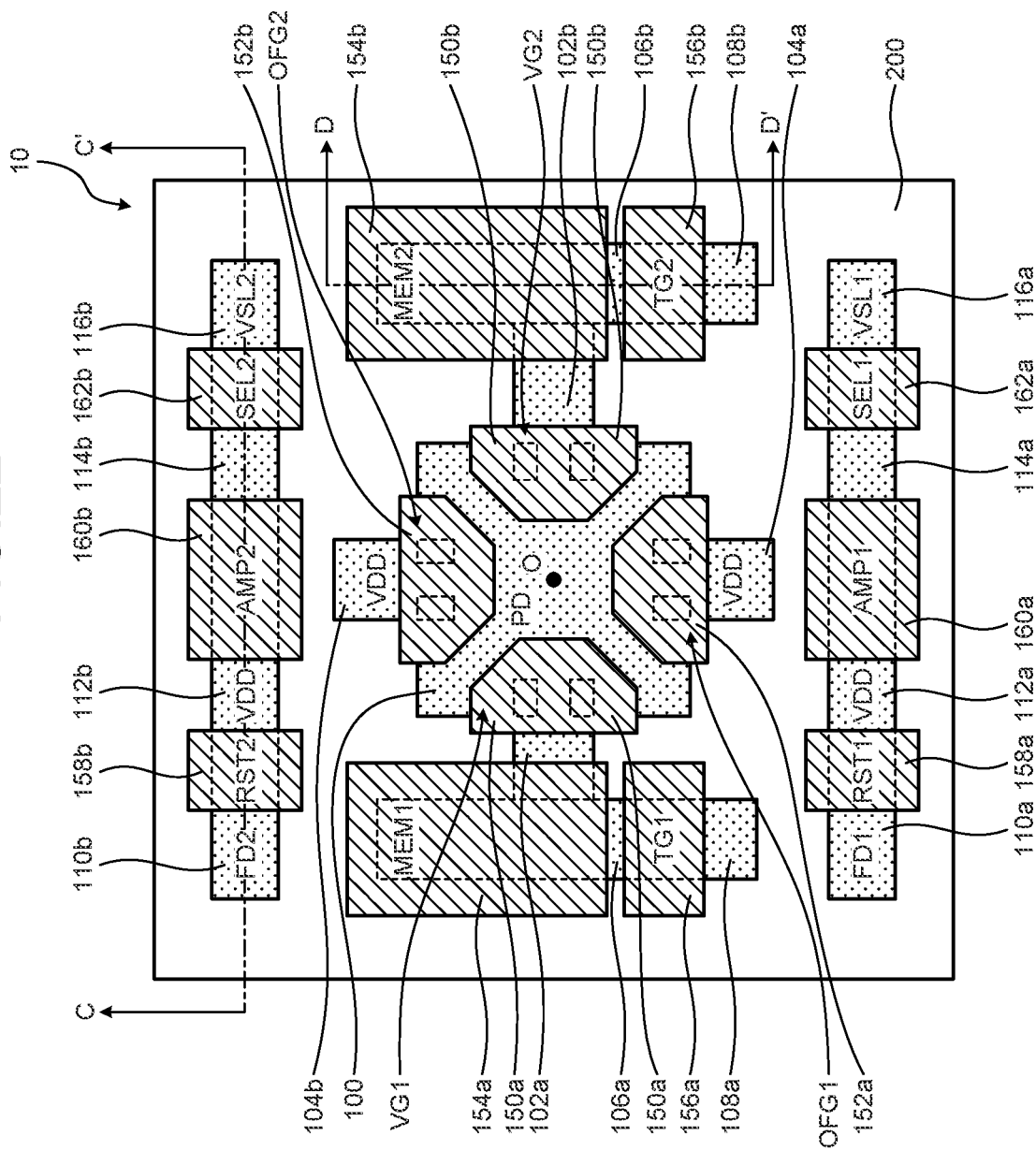
FIG. 22 is an explanatory diagram illustrating a planar configuration example of a light receiving element 10 according to a third embodiment of the present disclosure.
Figure 23A:
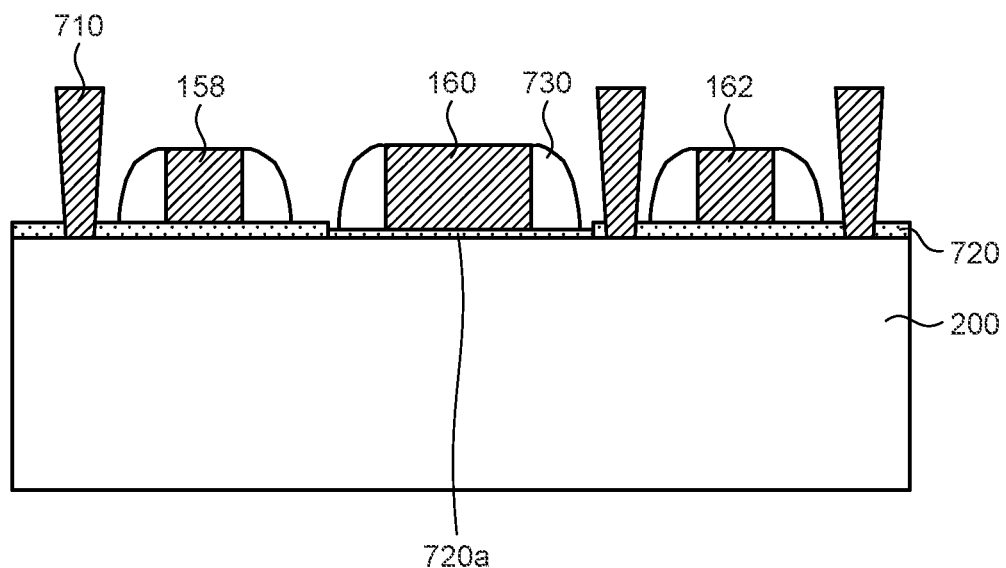
FIG. 23A is a cross-sectional view of the light receiving element 10 taken along line C-C' of FIG. 22.
Figure 23B:
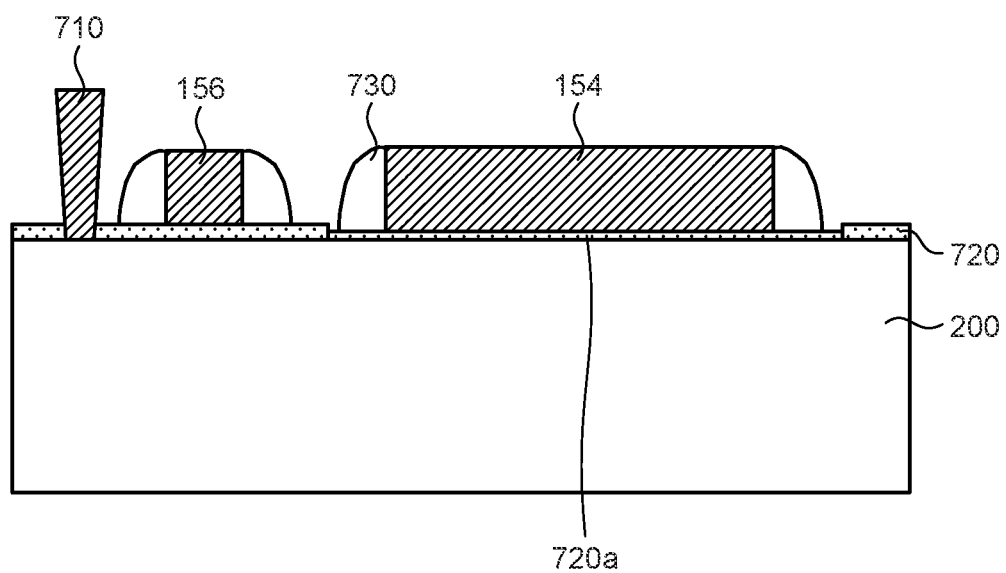
FIG. 23B is a cross-sectional view of the light receiving element 10 taken along line D-D' of FIG. 22.

Here, a third embodiment of the present disclosure for electric charge accumulation units MEM1 and MEM2 and amplification transistors AMP1 and AMP2 having thinned insulating films will be described with reference to FIGS. 22, 23A, and 23B. Note that FIG. 22 is an explanatory diagram illustrating a planar configuration example of a light receiving element 10 according to the present embodiment, and is a view of the light receiving element 10 when viewed from above a front surface of a semiconductor substrate 200. The light receiving element 10 of the present embodiment is similar to the light receiving element 10 of the first embodiment. FIG. 23A is a cross-sectional view of the light receiving element 10 taken along line C-C' of FIG. 22, and FIG. 23B is a cross-sectional view of the light receiving element 10 taken along line D-D' of FIG. 22. Specifically, in FIGS. 23A and 23B, the upper side of the drawing is the front surface side of the semiconductor substrate 200, and the lower side of the drawing is the back surface side of the semiconductor substrate 200.

Specifically, in the present embodiment, for example, as illustrated in FIG. 23A, an insulating film 720*a* of the amplification transistor AMP1 that is positioned under a gate electrode 160 covered with a sidewall 730 is formed of, for example, an oxide film (third oxide film), and a thickness of the insulating film 720*a* is smaller than that of an insulating film 720 formed of an oxide film (third oxide film) and positioned under a gate electrode 158 of a reset transistor RST1 and a gate electrode 162 of a selection transistor SEL1.

Furthermore, in the present embodiment, for example, as illustrated in FIG. 23B, an insulating film 720*a* of the electric charge accumulation unit MEM1 that is positioned under an electrode 154 covered with a sidewall 730 is formed of, for example, an oxide film (first oxide film), and a thickness of the insulating film 720*a* is smaller than that of an insulating film 720 formed of an oxide film (second oxide film) and positioned under a gate electrode 156 of a transfer transistor TG1.

In the present embodiment, the insulating film 720*a* positioned under the gate electrode 160 of the amplification transistor AMP1 and the insulating film 720*a* positioned under the electrode 154 of the electric charge accumulation unit MEM1 may be oxide films formed of the same material, or may have substantially the same thickness.

More specifically, in the present embodiment, the insulating film 720*a* positioned under the gate electrode 160 of the amplification transistor AMP1 and the insulating film 720*a* positioned under the electrode 154 of the electric charge accumulation unit MEM1 include oxide films formed of silicon oxide ($SiO_2$), silicon nitride (SiN), or the like. In addition, in the present embodiment, the thicknesses of the insulating film 720*a* positioned under the gate electrode 160 of the amplification transistor AMP1 and the insulating film 720*a* positioned under the electrode 154 of the electric charge accumulation unit MEM1 are preferably about half of the thicknesses of the insulating film 720 positioned under the gate electrodes 156, 158, and 162 of other elements (transfer transistor TG, reset transistor RST, and selection transistor SEL), and more preferably, for example, 1.0 nm or more and 5.0 nm or less, in view of the effect of reducing random noise caused by a reduction in thickness, and an increase in power consumption caused by an increase in leakage current.

Furthermore, in the present embodiment, the insulating film 720a positioned under the gate electrode 160 of the amplification transistor AMP1 and the insulating film 720a positioned under the electrode 154 of the electric charge accumulation unit MEM1 are preferably wider than the gate electrode 160 and the electrode 154 to the extent that adjacent elements do not interfere when viewed from above the semiconductor substrate 200.

Note that the present embodiment is not limited to thinning only the insulating films 720a of the electric charge accumulation units MEM1 and MEM2 and the gate insulating films 720a of the amplification transistors AMP1 and AMP2. In the present embodiment, only the insulating films 720a of the electric charge accumulation units MEM1 and MEM2 may be thinned, or the insulating films 720 that are in contact with the gate electrodes 150, 152, 154, 156, 158, 160, and 162 and the electrode 154 of the elements (electric charge accumulation unit MEM, transfer transistor TG, distribution transistor VG, electric charge drain transistor OFG, amplification transistor AMP, reset transistor RST, and selection transistor SEL) on the light receiving element 10 may be thinned.

As described above, according to the present embodiment, as the insulating film 720a of the electric charge accumulation unit MEM, the gate insulating film 720a of the amplification transistor AMP, and the like are thinned, a capacitance of the electric charge accumulation unit MEM can be increased without increasing the size, and random noise of the transistor can be reduced. Therefore, in the present embodiment, electric charges can be transferred at a high speed by the configuration according to the first embodiment described above, and furthermore, the capacitance of the electric charge accumulation unit MEM for storing the transferred electric charges can be increased by the configuration according to the third embodiment, so that the distance measurement module 1 with a higher distance measurement accuracy can be obtained. In addition, with the configuration according to the third embodiment, the random noise of the transistor can be reduced, so that characteristics of the distance measurement module 1 can be further improved. Note that the present embodiment can be implemented by a combination of the first and second embodiments and the modified examples thereof described above.

9. Fourth Embodiment

In the third embodiment described above, the insulating film 720a of the electric charge accumulation unit MEM, the gate insulating film 720a of the amplification transistor AMP, and the like are thinned to increase the capacitance of the electric charge accumulation unit MEM and reduce the random noise of the amplification transistor AMP. However, in a case where the gate insulating film 720a is thinned, although the above-described effect can be obtained, a leakage current increases. Therefore, there is a limit to the thinning. Therefore, the present inventors have conceived that a high dielectric film that has a high relative permittivity and is capable of increasing the capacitance of the electric charge accumulation unit MEM as compared with the above-described oxide film even with the same thickness is used instead of the insulating film 720a. By using the high dielectric film as the insulating film 720a, it is possible to achieve both an increase in capacitance of the electric charge accumulation unit MEM and a reduction in random noise of the amplification transistor AMP while avoiding an increase in leakage current even when the thickness is reduced.

Figure 24:
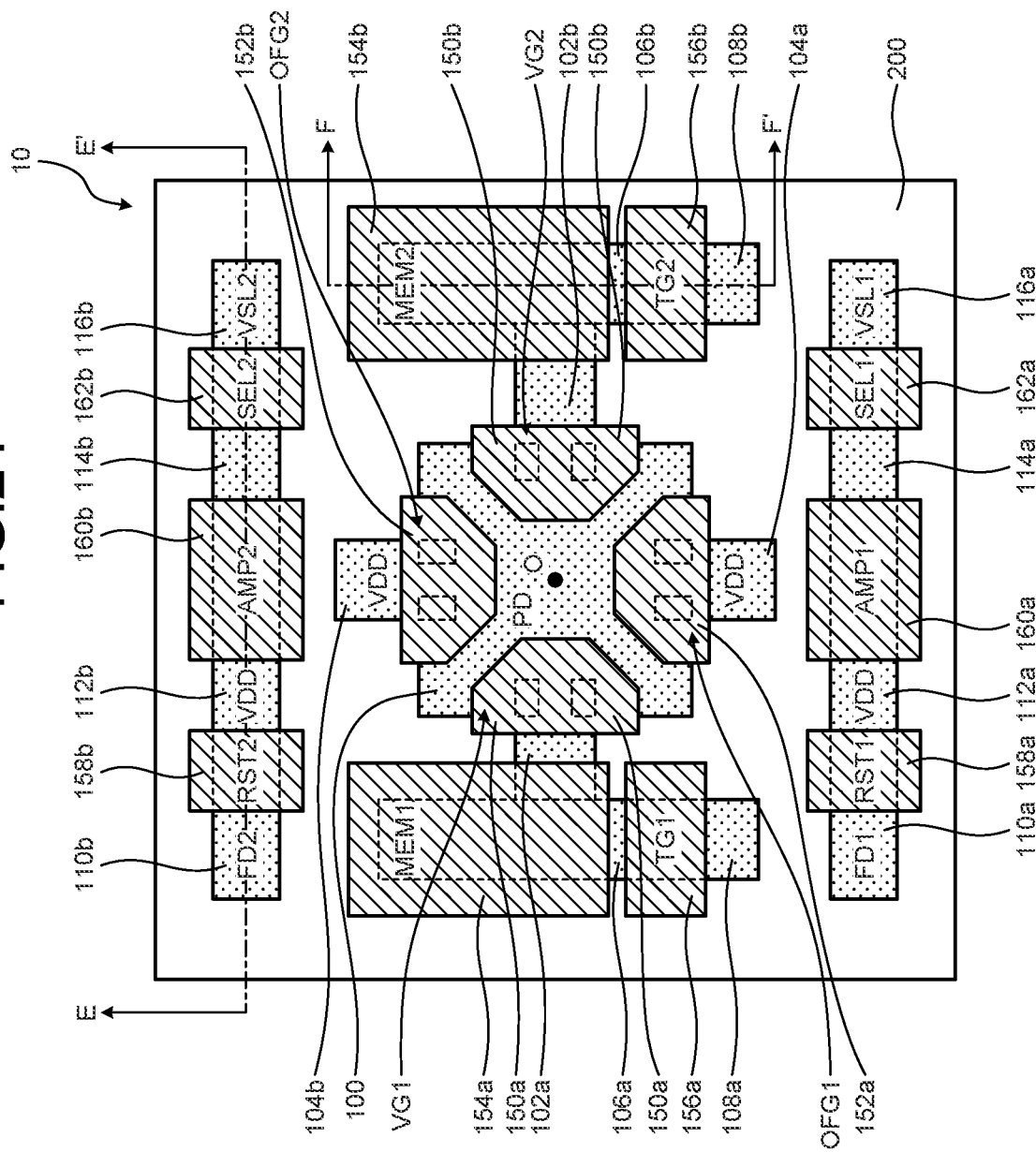
FIG. 24 is an explanatory diagram illustrating a planar configuration example of a light receiving element 10 according to a fourth embodiment of the present disclosure.
Figure 25A:
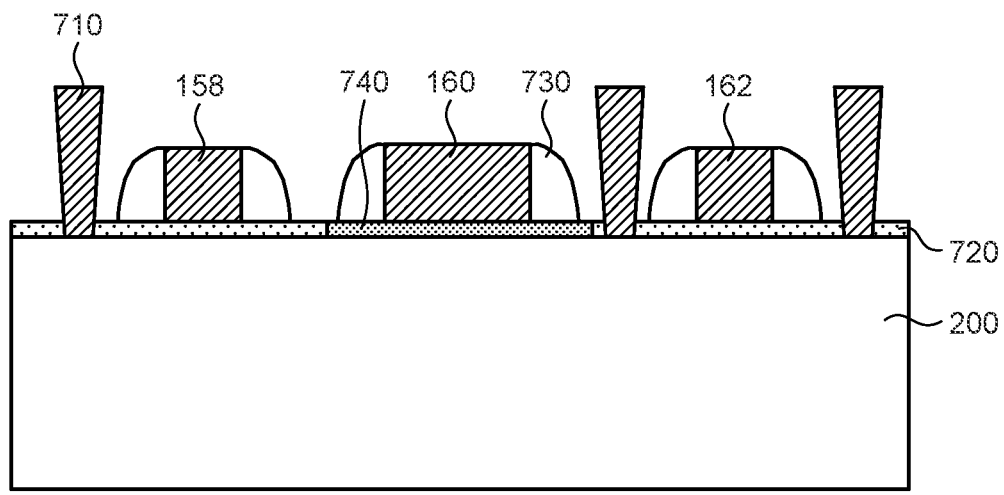
FIG. 25A is a cross-sectional view of the light receiving element 10 taken along line E-E' of FIG. 24.
Figure 25B:
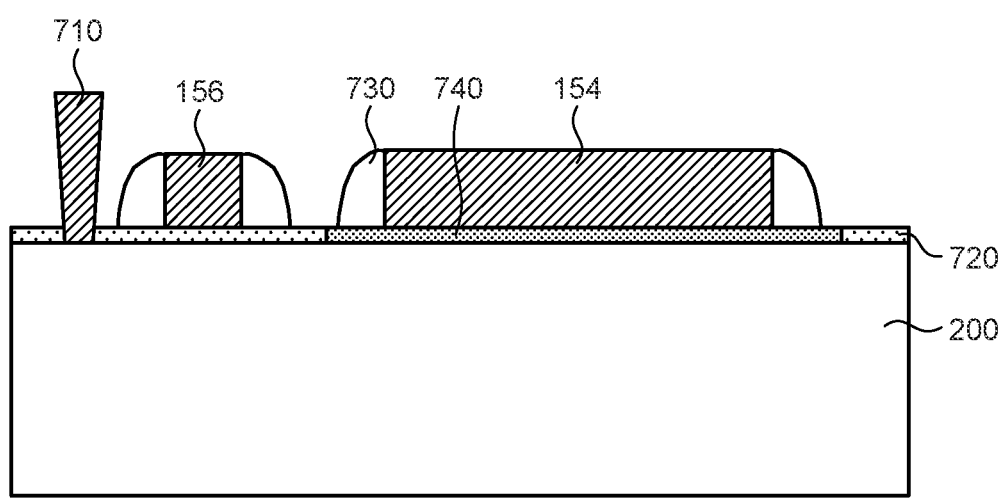
FIG. 25B is a cross-sectional view of the light receiving element 10 taken along line F-F' of FIG. 24.

Here, a fourth embodiment of the present disclosure for electric charge accumulation units MEM1 and MEM2 and amplification transistors AMP1 and AMP2 having insulating films formed of high dielectric films will be described with reference to FIGS. 24, 25A, and 25B. Note that FIG. 24 is an explanatory diagram illustrating a planar configuration example of a light receiving element 10 according to the present embodiment, and is a view of the light receiving element 10 when viewed from above a front surface of a semiconductor substrate 200. The light receiving element 10 of the present embodiment is similar to the light receiving element 10 of the first embodiment. FIG. 25A is a cross-sectional view of the light receiving element 10 taken along line E-E' of FIG. 24, and FIG. 25B is a cross-sectional view of the light receiving element 10 taken along line F-F' of FIG. 24. Specifically, in FIGS. 25A and 25B, the upper side of the drawing is the front surface side of the semiconductor substrate 200, and the lower side of the drawing is the back surface side of the semiconductor substrate 200.

Specifically, in the present embodiment, for example, as illustrated in FIG. 25A, an insulating film (third insulating film) 740 of the amplification transistor AMP1 that is positioned under a gate electrode 160 covered with a sidewall 730 is formed of a high dielectric film. A relative permittivity of the insulating film 740 is higher than that of an insulating film (third insulating film) 720 positioned under a gate electrode 158 of a reset transistor RST1 and a gate electrode 162 of a selection transistor SEL1.

Furthermore, in the present embodiment, for example, as illustrated in FIG. 25B, an insulating film (first insulating film) 740 of the electric charge accumulation unit MEM1 that is positioned under an electrode 154 covered with a sidewall 730 is formed of a high dielectric film. A relative permittivity of the insulating film 740 is higher than that of an insulating film (second insulating film) 720 positioned under a gate electrode 156 of a transfer transistor TG1.

In the present embodiment, the insulating film 740 positioned under the gate electrode 160 of the amplification transistor AMP1 and the insulating film 740 positioned under the electrode 154 of the electric charge accumulation unit MEM1 may be formed of the same material.

More specifically, in the present embodiment, the high dielectric film is a material having a relative permittivity higher than a relative permittivity (3.9) of silicon oxide ($SiO_2$), and is preferably a material having a relative permittivity of 4 or more. In the present embodiment, for example, the high dielectric film is a metal oxide film, and can be formed of a material such as $Al_2O_3$, HfSiON, $Y_2O_3$, $Ta_2O_5$, $La_2O_3$, $TiO_2$, $HfO_2$, $ZrO_2$, or $HfZrO_2$.

In a case where the high dielectric film is used as the insulating film 740, a metal material such as TiN, TaN, or NiSi may be used as a material for forming the gate electrodes 150, 152, 154, 156, 158, 160, and 162 in order to adjust Vth (threshold voltage).

Furthermore, in the present embodiment, the insulating film 740 positioned under the gate electrode 160 of the amplification transistor AMP1 and the insulating film 740 positioned under the electrode 154 of the electric charge accumulation unit MEM1 are preferably wider than the gate electrode 160 and the electrode 154 to the extent that adjacent elements do not interfere when viewed from above the semiconductor substrate 200.

Note that the present embodiment is not limited to forming only the insulating films 740 of the electric charge accumulation units MEM1 and MEM2 and the gate insulating films 740 of the amplification transistors AMP1 and AMP2 by using the high dielectric films. In the present embodiment, only the insulating films 740 of the electric charge accumulation units MEM1 and MEM2 may be formed of the high dielectric films, or the insulating films 720 that are in contact with the gate electrodes 150, 152, 154, 156, 158, 160, and 162 and the electrode 154 of the elements (electric charge accumulation unit MEM, transfer transistor TG, distribution transistor VG, electric charge drain transistor OFG, amplification transistor AMP, reset transistor RST, and selection transistor SEL) on the light receiving element 10 may be formed of the high dielectric films.

As described above, according to the present embodiment, as the insulating film 740 of the electric charge accumulation unit MEM, the gate insulating film 740 of the amplification transistor AMP, and the like are formed of the high dielectric films, it is possible to achieve both an increase in capacitance of the electric charge accumulation unit MEM and a reduction in random noise of the amplification transistor AMP without reducing the thickness as compared with a case of using $SiO_2$. Therefore, in the present embodiment, electric charges can be transferred at a high speed by the configuration according to the first embodiment described above, and furthermore, the capacitance of the electric charge accumulation unit MEM for storing the transferred electric charges can be increased by the configuration according to the fourth embodiment, so that the distance measurement module 1 with a higher distance measurement accuracy can be obtained. In addition, with the configuration according to the fourth embodiment, the random noise of the transistor can be reduced, so that characteristics of the distance measurement module 1 can be further improved. Note that the present embodiment can be implemented by a combination of the first and second embodiments and the modified examples thereof described above.

10. Conclusion

As described above, according to the embodiments and the modified examples of the present disclosure, it is possible to provide the light receiving element 10 and the distance measurement module 1 capable of transferring electric charges at a high speed.

Although the present disclosure has been described with the embodiments, the modified examples thereof, and the application examples, the present disclosure is not limited to the embodiments and the like, and various modifications can be made. Note that the effects described in the present specification are merely examples. The effects of the present disclosure are not limited to the effects described herein. The present disclosure may have effects other than those described herein.

In the embodiments and the modified examples of the present disclosure described above, the conductive type of each semiconductor region described above may be reversed. For example, the present embodiment and the modified examples can be applied to an element using holes as electric charges instead of electrons.

Furthermore, in the embodiments and the modified examples of the present disclosure described above, the semiconductor substrate is not necessarily a silicon substrate, and may be another substrate (for example, a silicon on insulator (SOI) substrate, a SiGe substrate, or the like). The semiconductor substrate may have a semiconductor structure or the like formed on such various substrates.

Furthermore, in the embodiments and the modified examples of the present disclosure described above, the light receiving element 10 may be formed on one chip together with the irradiation unit, the processing circuit, and the like, or may be provided in one package, and is not particularly limited.

Note that, in the embodiments and modified examples of the present disclosure, examples of a method for forming each layer, each film, each element, and the like described above include a physical vapor deposition (PVD) method, a chemical vapor deposition (CVD) method, and the like. Examples of the PVD method include a vacuum vapor deposition method using resistance heating or high-frequency heating, an electron beam (EB) vapor deposition method, various sputtering methods (a magnetron sputtering method, a radio frequency (RF)-direct current (DC) coupled bias sputtering method, an electron cyclotron resonance (ECR) sputtering method, a counter target sputtering method, a high-frequency sputtering method, and the like), an ion plating method, a laser ablation method, and a molecular beam epitaxy (MBE) method, and a laser transfer method. Examples of the CVD method include a plasma CVD method, a thermal CVD method, a metal organic (MO) CVD method, and a photo-CVD method. Further, other methods include: an electrolytic plating method, an electroless plating method, and a spin coating method; an immersion method; a casting method; a microcontact printing method; a drop casting method; various printing methods such as a screen printing method, an inkjet printing method, an offset printing method, a gravure printing method, and a flexographic printing method; a stamping method; a spraying method; and various coating methods such as an air doctor coater method, a blade coater method, a rod coater method, a knife coater method, a squeeze coater method, a reverse roll coater method, a transfer roll coater method, a gravure coater method, a kiss coater method, a cast coater method, a spray coater method, a slit orifice coater method, and a calendar coater method. Examples of a patterning method for each layer include chemical etching such as shadow masking, laser transfer, and photolithography, and physical etching using ultraviolet rays, laser, or the like. In addition, examples of a planarization technology include a chemical mechanical polishing (CMP) method, a laser planarization method, and a reflow method. That is, the elements according to the embodiments and the modified examples of the present disclosure can be easily and inexpensively manufactured using an existing semiconductor device manufacturing process.

Furthermore, the respective steps in the manufacturing method according to the modified examples of the embodiments of the present disclosure described above do not have to necessarily be performed in the described order. For example, the respective steps may be performed in an appropriately changed order. Furthermore, each step does not have to necessarily be performed according to the described method, and may be performed according to other methods.

11. Configuration Example of Electronic Device

Figure 26:
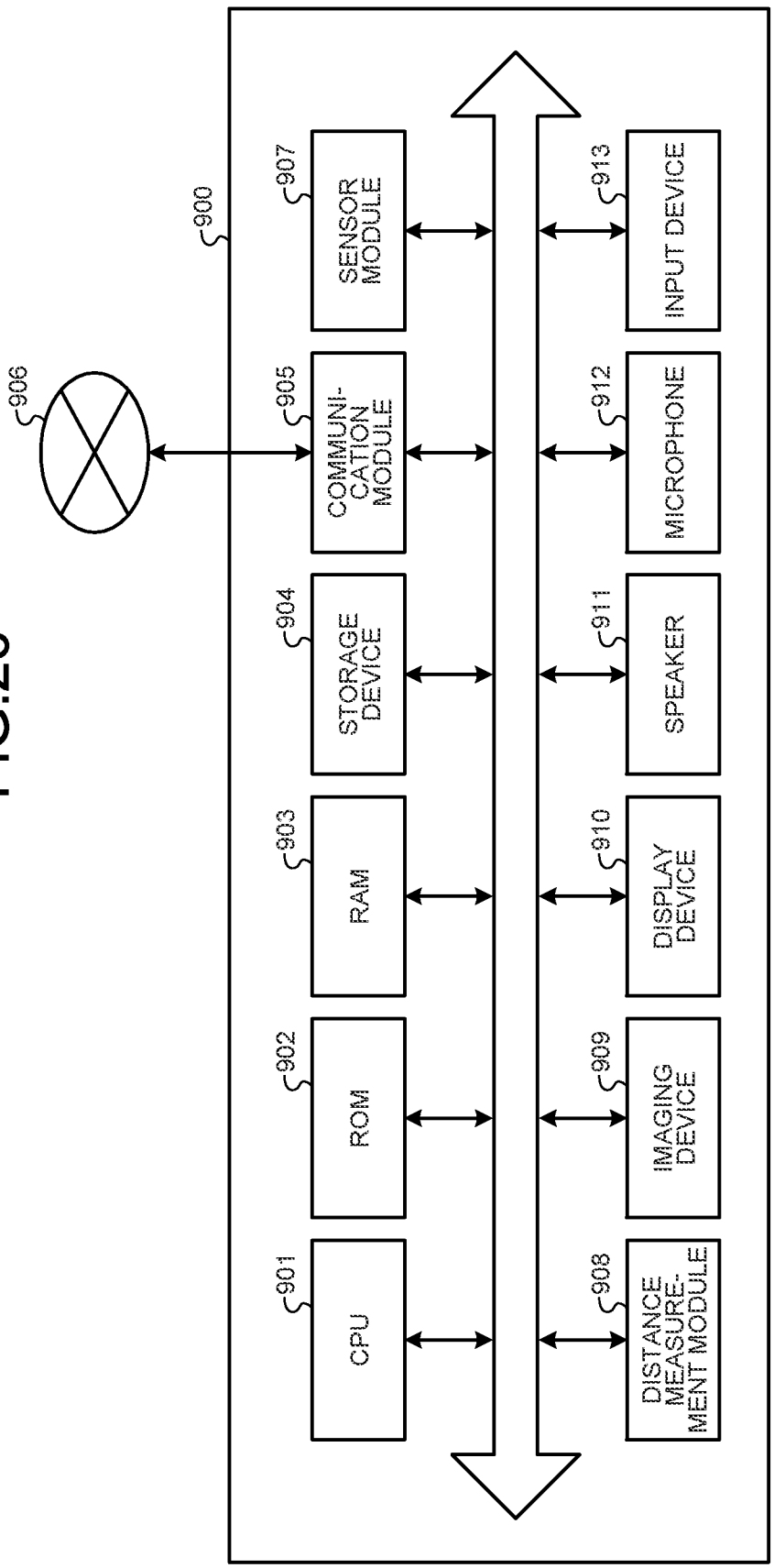
FIG. 26 is a block diagram illustrating a configuration example of a smartphone 900 as an electronic device to which the distance measurement module 1 according to the embodiment of the present disclosure is applied.

Note that the light receiving element 10 can be applied not only to the distance measurement module 1 as described above but also to various electronic devices such as a camera having a distance measurement function and a smartphone having a distance measurement function, for example. Therefore, a configuration example of a smartphone 900 as an electronic device to which the present technology is applied will be described with reference to FIG. 26. FIG. 26 is a block diagram illustrating a configuration example of the smartphone 900 as an electronic device to which the distance measurement module 1 according to the embodiment of the present disclosure is applied.

As illustrated in FIG. 26, the smartphone 900 includes a central processing unit (CPU) 901, a read only memory (ROM) 902, and a random access memory (RAM) 903. In addition, the smartphone 900 includes a storage device 904, a communication module 905, and a sensor module 907. Furthermore, the smartphone 900 includes a distance measurement module 908 to which the above-described distance measurement module 1 can be applied. The smartphone 900 further includes an imaging device 909, a display device 910, a speaker 911, a microphone 912, an input device 913, and a bus 914. Furthermore, the smartphone 900 may include a processing circuit such as a digital signal processor (DSP) instead of or in addition to the CPU 901.

The CPU 901 functions as an arithmetic processing device or a control device, and controls an overall operation in the smartphone 900 or a part thereof according to various programs recorded in the ROM 902, the RAM 903, the storage device 904, or the like. The ROM 902 stores a program, a calculation parameter, and the like used by the CPU 901. The RAM 903 primarily stores a program used in the execution of the CPU 901, a parameter that appropriately changes in the execution, and the like. The CPU 901, the ROM 902, and the RAM 903 are connected to one another by the bus 914. The storage device 904 is a data storage device configured as an example of a storage unit of the smartphone 900. The storage device 904 is implemented by, for example, a magnetic storage device such as a hard disk drive (HDD), a semiconductor storage device, an optical storage device, or the like. The storage device 904 stores a program executed by the CPU 901, various data, various data acquired from the outside, and the like.

The communication module 905 is, for example, a communication interface configured by using a communication device or the like for connection to a communication network 906. The communication module 905 can be, for example, a communication card for a wired or wireless local area network (LAN), Bluetooth (registered trademark), wireless USB (WUSB), or the like. Further, the communication module 905 may be a router for optical communication, a router for asymmetric digital subscriber line (ADSL), a modem for various types of communication, or the like. The communication module 905 transmits and receives a signal or the like to and from the Internet and other communication devices by using a predetermined protocol such as TCP/IP. Furthermore, the communication network 906 connected to the communication module 905 is a network connected in a wired or wireless manner, and is, for example, the Internet, a home LAN, infrared communication, satellite communication, or the like.

The sensor module 907 includes, for example, various sensors such as a motion sensor (for example, an acceleration sensor, a gyro sensor, or a geomagnetic sensor), a biological information sensor (for example, a pulse sensor, a blood pressure sensor, or a fingerprint sensor), or a position sensor (for example, a global navigation satellite system (GNSS) receiver).

The distance measurement module 908 is provided on a surface of the smartphone 900, and can acquire, for example, an uneven shape or movement of a user's fingertip, palm, face, or the like facing the surface as a distance measurement result. Such a distance measurement result can be used for authentication of the user and recognition of a gesture of the user. Furthermore, the distance measurement module 908 can also acquire, for example, a distance from the smartphone 900 to the target object 800 or three-dimensional shape data of a surface of the target object 800.

The imaging device 909 is provided on the surface of the smartphone 900, and can image the target object 800 or the like positioned around the smartphone 900. Specifically, the imaging device 909 can include an imaging element (not illustrated) such as a complementary MOS (CMOS) image sensor, and a signal processing circuit (not illustrated) that performs imaging signal processing on a signal photoelectrically converted by the imaging element. Furthermore, the imaging device 909 can further include an optical system mechanism (not illustrated) implemented by an imaging lens, a diaphragm mechanism, a zoom lens, a focus lens, or the like, and a driving system mechanism (not illustrated) that controls an operation of the optical system mechanism. Then, the imaging element collects incident light from the target object 800 as an optical image, and the signal processing circuit photoelectrically converts the formed optical image in units of pixels, reads a signal of each pixel as an imaging signal, and performs image processing to acquire a captured image.

The display device 910 is provided on the surface of the smartphone 900, and can be, for example, a display device such as a liquid crystal display (LCD) or an organic electro luminescence (EL) display. The display device 910 can display an operation screen, the captured image acquired by the above-described imaging device 909, and the like.

The speaker 911 can output, for example, a call voice, a voice accompanying an image content displayed by the display device 910 described above, and the like to the user.

The microphone 912 can collect, for example, a call voice of the user, a voice including a command to activate a function of the smartphone 900, and a voice in a surrounding environment of the smartphone 900.

The input device 913 is a device operated by the user, such as a button, a keyboard, a touch panel, or a mouse. The input device 913 includes an input control circuit that generates an input signal based on information input by the user and outputs the input signal to the CPU 901. The user can input various data to the smartphone 900 and instruct a processing operation by operating the input device 913.

The configuration example of the smartphone 900 has been described above. Each component described above may be configured by using a general-purpose member, or may be configured by hardware specialized for the function of each component. Such a configuration can be appropriately changed according to a technical level at the time of implementation.

12. Example of Application to Endoscopic Surgery System

The technology (present technology) according to the present disclosure can be applied to various products. For example, the technology according to the present disclosure may be applied to an endoscopic surgical system.

Figure 27:
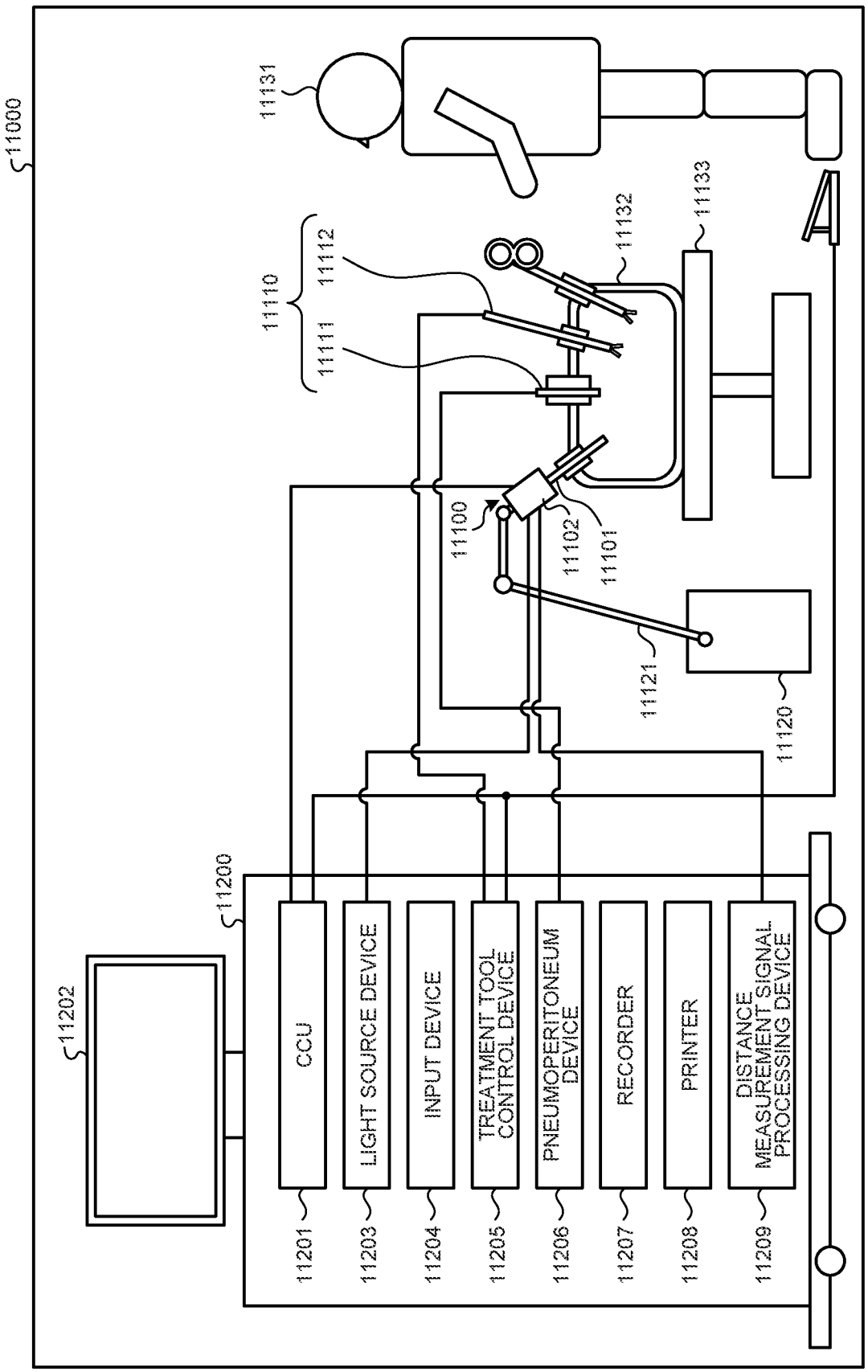
FIG. 27 is a diagram illustrating an example of a schematic configuration of an endoscopic surgery system.

FIG. 27 is a diagram illustrating an example of a schematic configuration of the endoscopic surgery system to which the technology according to the present disclosure (the present technology) can be applied.

FIG. 27 illustrates a state in which an operator (doctor) 11131 is performing surgery on a patient 11132 on a patient bed 11133 by using an endoscopic surgery system 11000. As illustrated, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various devices for endoscopic surgery are mounted.

The endoscope 11100 includes a lens barrel 11101 in which a region corresponding to a predetermined length from a distal end is inserted into the body cavity of the patient 11132, and a camera head 11102 connected to a proximal end of the lens barrel 11101. In the illustrated example, the endoscope 11100 configured as a so-called rigid endoscope including the rigid lens barrel 11101 is illustrated, but the endoscope 11100 may be configured as a so-called flexible endoscope including a flexible lens barrel.

An opening portion into which an objective lens is fitted is provided at the distal end of the lens barrel 11101. A light source device 11203 is connected to the endoscope 11100, and light generated by the light source device 11203 is guided to the distal end of the lens barrel by a light guide extending inside the lens barrel 11101, and is emitted toward an observation target in the body cavity of the patient 11132 via the objective lens. Note that the endoscope 11100 may be a forward-viewing endoscope, an oblique-viewing endoscope, or a side-viewing endoscope. Furthermore, the irradiation unit 20 and the light receiving unit 30 of the distance measurement module 1 according to the embodiment of the present disclosure may be built in the distal end of the lens barrel 11101. Such a part of the distance measurement module 1 is mounted, it is possible to further improve the accuracy of the surgery by referring to distance information obtained using the distance measurement module 1 as well as the surgery viewed by the doctor.

Figure 28:
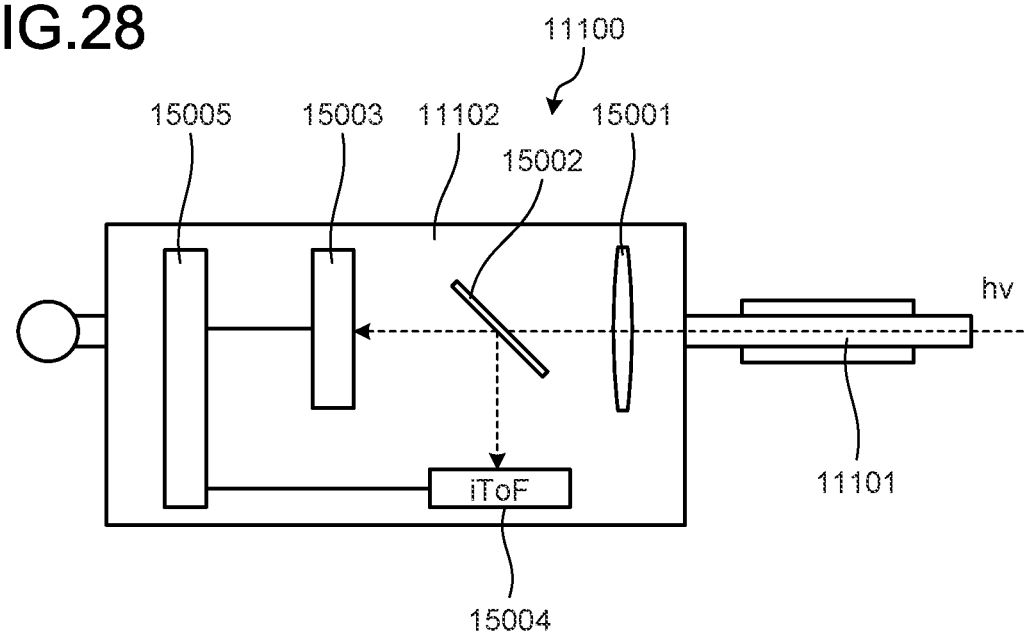
FIG. 28 is a diagram illustrating an example of a configuration of an endoscope.

For example, as in the configuration in FIG. 28 illustrating an example of the configuration of the endoscope 11100, an iToF sensor 15004 that serves as the irradiation unit 20 and the light receiving unit 30 of the distance measurement module 1 according to the embodiment of the present disclosure is provided in the camera head 11102. Specifically, reflected light (observation light) from the observation target passes through the lens barrel 11101, is collected by a lens 15001 in the camera head 11102, is reflected by a half mirror 15002, and is received by the iToF sensor 15004. Further, the observation light is photoelectrically converted by the iToF sensor 15004, an electric signal corresponding to the observation light is generated and stored in a memory 15005, and then transmitted to a distance measurement signal processing device 11209 described later.

Furthermore, as illustrated in FIG. 28, an imaging element 15003 is provided inside the camera head 11102, and reflected light (observation light) from the observation target passes through the lens barrel 11101, is collected by the lens 15001, is reflected by the half mirror 15002, and is received by the imaging element 15003. The observation light is photoelectrically converted by the imaging element 15003, and an electric signal corresponding to the observation light, that is, an image signal corresponding to an observation image, is generated. The image signal is once stored in the memory 15005 and then transmitted as raw data to a camera control unit (CCU) 11201.

The CCU 11201 is implemented by a CPU, a graphics processing unit (GPU), and the like, and integrally controls operations of the endoscope 11100 and a display device 11202. Furthermore, the CCU 11201 receives the image signal from the camera head 11102, and performs various types of image processing for displaying an image based on the image signal, such as development processing (demosaic processing), on the image signal.

The display device 11202 displays an image based on the image signal subjected to the image processing by the CCU 11201 under the control of the CCU 11201.

The light source device 11203 is implemented by a light source such as a light emitting diode (LED), for example, and supplies, to the endoscope 11100, irradiation light for capturing an image of a surgical site or the like.

An input device 11204 is an input interface for the endoscopic surgery system 11000. The user can input various types of information or instructions to the endoscopic surgery system 11000 via the input device 11204. For example, the user inputs an instruction to change imaging conditions (a type of the irradiation light, a magnification, a focal length, and the like) of the endoscope 11100 and the like.

A treatment tool control device 11205 controls driving of the energy treatment tool 11112 for cauterization and incision of tissue, vascular closure, or the like. A pneumoperitoneum device 11206 feeds gas into the body cavity of the patient 11132 via the pneumoperitoneum tube 11111 in order to inflate the body cavity for the purpose of securing a clear view for the endoscope 11100 and securing a working space for the operator. A recorder 11207 is a device capable of recording various types of information regarding surgery. A printer 11208 is a device capable of printing various types of information regarding surgery in various formats such as text, images, or graphs. The distance measurement signal processing device 11209 is a device capable of acquiring the distance information, in which the control unit 40 and the processing unit 60 of the distance measurement module 1 according to the embodiment of the present disclosure are provided.

Note that the light source device 11203 that supplies the irradiation light to the endoscope 11100 at the time of capturing an image of the surgical site can include, for example, a white light source implemented by an LED, a laser light source, or a combination thereof. In a case where the white light source is implemented by a combination of RGB laser light sources, an output intensity and an output timing of each color (each wavelength) can be controlled with high accuracy, and thus, white balance adjustment of the captured image can be performed in the light source device 11203. Furthermore, in this case, the observation target is irradiated with laser light from each of the RGB laser light sources in a time division manner and the driving of the imaging element of the camera head 11102 is controlled in synchronization with a timing of the irradiation, such that it is also possible to capture an image corresponding to each of RGB in a time division manner. With this method, a color image can be obtained without providing a color filter in the imaging element.

Furthermore, the driving of the light source device 11203 may be controlled so as to change the intensity of light to be output every predetermined time. The driving of the imaging element of the camera head 11102 is controlled in synchronization with a timing of the change of the intensity of the light to acquire images in a time division manner, and the images are combined, such that it is possible to generate a high dynamic range image without so-called underexposure and overexposure.

Furthermore, the light source device 11203 may be configured to be able to supply light in a predetermined wavelength band corresponding to special light observation. In the special light observation, for example, so-called narrow band imaging, in which an image of a predetermined tissue such as a blood vessel in a mucosal epithelial layer is captured with high contrast by radiating light in a narrower band than irradiation light (that is, white light) at the time of normal observation, by using wavelength dependency of light absorption in a body tissue, is performed. Alternatively, in the special light observation, fluorescence observation for obtaining an image by fluorescence generated by irradiation with excitation light may be performed. In the fluorescence observation, for example, fluorescence from a body tissue can be observed by irradiating the body tissue with excitation light (autofluorescence observation), or a fluorescent image can be obtained by locally injecting a reagent such as indocyanine green (ICG) into a body tissue and irradiating the body tissue with excitation light corresponding to a fluorescence wavelength of the reagent. The light source device 11203 can be configured to be able to supply narrow band light and/or excitation light corresponding to such special light observation.

Figure 29:
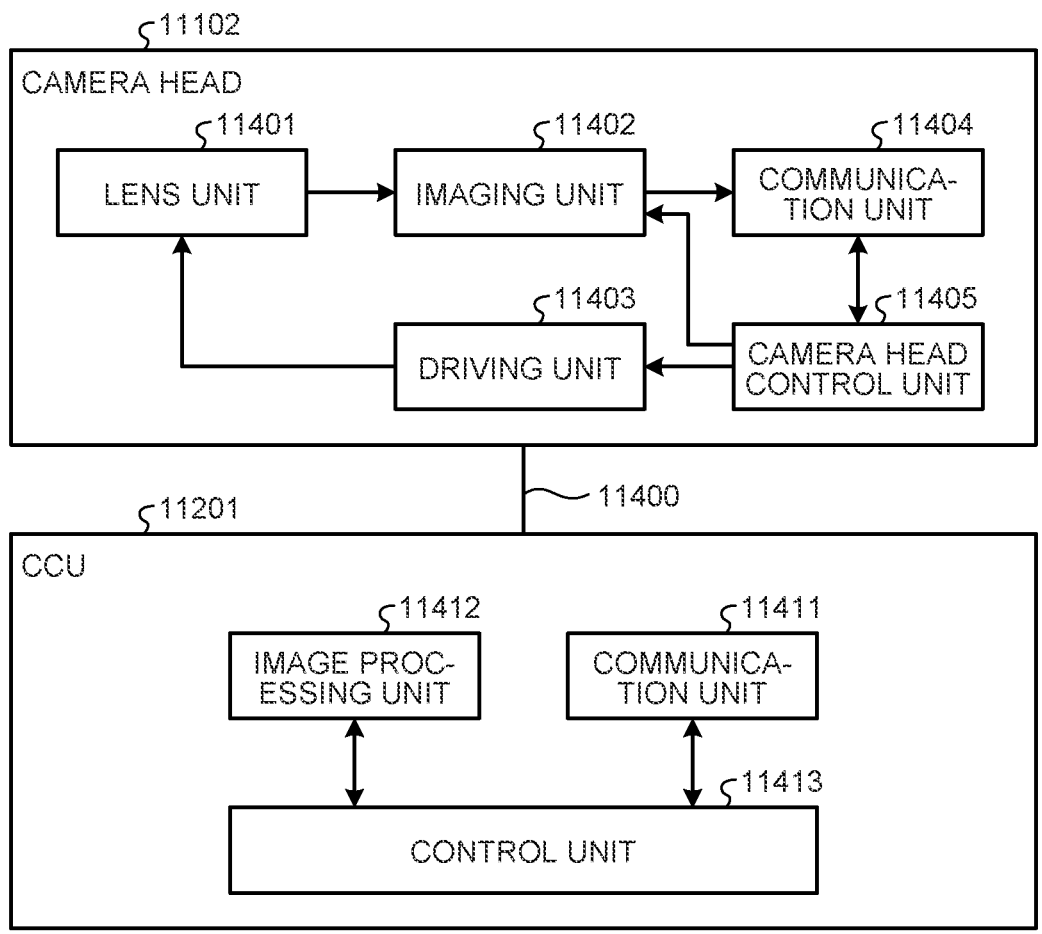
FIG. 29 is a block diagram illustrating an example of a functional configuration of a camera head and a cameral control unit (CCU).

FIG. 29 is a block diagram illustrating an example of functional configurations of the camera head 11102 and the CCU 11201 illustrated in FIG. 27.

The camera head 11102 includes a lens unit 11401, an imaging unit 11402, a driving unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at a portion at which the camera head 11102 is connected to the lens barrel 11101. The observation light taken in from the distal end of the lens barrel 11101 is guided to the camera head 11102 and is incident on the lens unit 11401. The lens unit 11401 is implemented by combining a plurality of lenses including a zoom lens and a focus lens.

The number of imaging elements included in the imaging unit 11402 may be one (so-called single-plate type) or plural (so-called multi-plate type). In a case where the imaging unit 11402 is configured as the multi-plate type, for example, image signals corresponding to RGB, respectively, may be generated by the respective imaging elements, and a color image may be obtained by combining the image signals. Alternatively, the imaging unit 11402 may include a pair of imaging elements for acquiring image signals for the right eye and the left eye corresponding to three-dimensional (3D) display. As the 3D display is performed, the operator 11131 can more accurately grasp a depth of a living tissue in the surgical site. Note that, in a case where the imaging unit 11402 is configured as the multi-plate type, a plurality of lens units 11401 can be provided corresponding to the respective imaging elements.

Furthermore, the imaging unit 11402 does not have to be necessarily provided in the camera head 11102. For example, the imaging unit 11402 may be provided immediately behind the objective lens inside the lens barrel 11101.

The driving unit 11403 is implemented by an actuator, and moves the zoom lens and the focus lens of the lens unit 11401 by a predetermined distance along an optical axis under the control of the camera head control unit 11405. As a result, a magnification and a focal point of the image captured by the imaging unit 11402 can be appropriately adjusted.

The communication unit 11404 is implemented by a communication device for transmitting and receiving various types of information to and from the CCU 11201. The communication unit 11404 transmits the image signal obtained from the imaging unit 11402 as raw data to the CCU 11201 via the transmission cable 11400.

Furthermore, the communication unit 11404 receives a control signal for controlling driving of the camera head 11102 from the CCU 11201, and supplies the control signal to the camera head control unit 11405. The control signal includes, for example, information regarding imaging conditions such as information for specifying a frame rate of the captured image, information for specifying an exposure value at the time of imaging, and/or information for specifying the magnification and the focal point of the captured image.

Note that the imaging conditions such as the frame rate, the exposure value, the magnification, and the focal point may be appropriately specified by the user, or may be automatically set by the control unit 11413 of the CCU 11201 based on the acquired image signal. In the latter case, the endoscope 11100 has a so-called auto exposure (AE) function, an auto focus (AF) function, and an auto white balance (AWB) function.

The camera head control unit 11405 controls the driving of the camera head 11102 based on the control signal received from the CCU 11201 via the communication unit 11404.

The communication unit 11411 is implemented by a communication device for transmitting and receiving various types of information to and from the camera head 11102. The communication unit 11411 receives the image signal transmitted from the camera head 11102 via the transmission cable 11400.

Furthermore, the communication unit 11411 transmits a control signal for controlling the driving of the camera head 11102 to the camera head 11102. The image signal or the control signal can be transmitted by electric communication, optical communication, or the like.

The image processing unit 11412 performs various types of image processing on the image signal that is raw data transmitted from the camera head 11102.

The control unit 11413 performs various types of controls related to capturing of the image of the surgical site or the like performed by the endoscope 11100 and display of the captured image obtained by the capturing of the image of the surgical site or the like. For example, the control unit 11413 generates a control signal for controlling the driving of the camera head 11102.

Furthermore, the control unit 11413 causes the display device 11202 to display the captured image of the surgical site or the like based on the image signal subjected to the image processing by the image processing unit 11412. At this time, the control unit 11413 may recognize various objects in the captured image by using various image recognition technologies. For example, the control unit 11413 can recognize a surgical tool such as forceps, a specific site in the living body, bleeding, mist at the time of using the energy treatment tool 11112, and the like by detecting an edge shape, color, and the like of the object included in the captured image. When displaying the captured image on the display device 11202, the control unit 11413 may superimpose various types of surgery support information on the image of the surgical site by using the recognition result. The surgery support information is superimposed and displayed and presented to the operator 11131, such that a burden on the operator 11131 can be reduced and the operator 11131 can reliably proceed with the surgery.

The transmission cable 11400 connecting the camera head 11102 and the CCU 11201 is an electric signal cable supporting electric signal communication, an optical fiber supporting optical communication, or a composite cable thereof.

Here, in the illustrated example, wired communication is performed using the transmission cable 11400, but wireless communication may be performed between the camera head 11102 and the CCU 11201.

Hereinabove, an example of the endoscopic surgery system to which the technology according to the present disclosure can be applied has been described. The technology according to the present disclosure can be applied to the imaging unit 11402 among the above-described configurations. Specifically, the light receiving element 10 can be applied as a part of the configuration of the imaging unit 11402. By applying the technology according to the present disclosure as a part of the configuration of the imaging unit 11402, the distance to the surgical site can be measured with high accuracy, and a clearer surgical site image can be obtained.

Note that, here, the endoscopic surgery system has been described as an example, but the technology according to the present disclosure may be applied to, for example, a microscopic surgery system or the like.

13. Example of Application to Moving Body

The technology (present technology) according to the present disclosure can be applied to various products. For example, the technology according to the present disclosure may be implemented as a device mounted in any one of moving bodies such as a vehicle, an electric vehicle, a hybrid electric vehicle, a motorcycle, a bicycle, a personal mobility device, a plane, a drone, a ship, and a robot.

Figure 30:
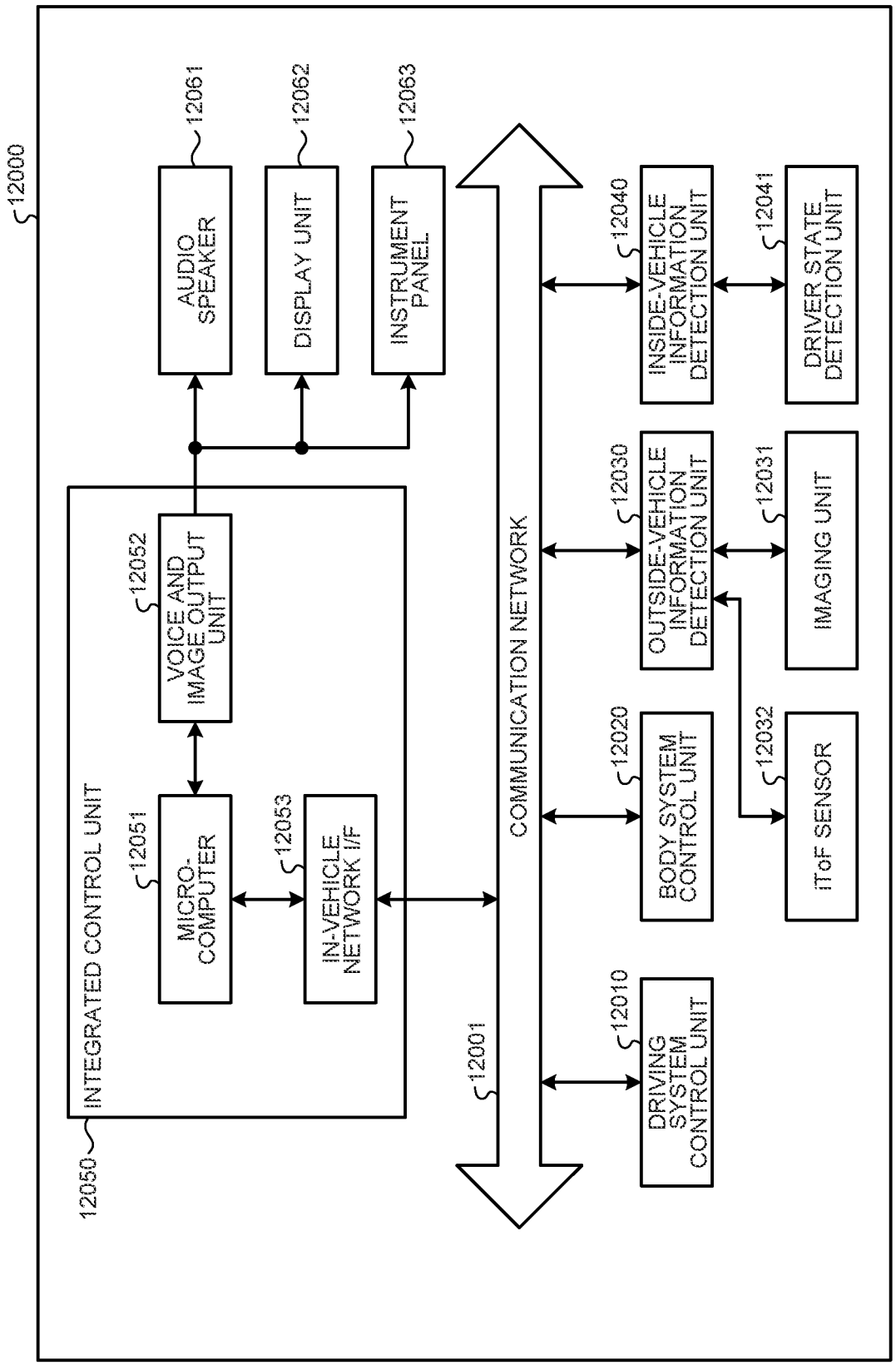
FIG. 30 is a block diagram illustrating an example of a schematic configuration of a vehicle control system.

FIG. 30 is a block diagram illustrating an example of a schematic configuration of a vehicle control system which is an example of a moving body control system to which a technology according to the present disclosure can be applied.

A vehicle control system 12000 includes a plurality of electronic control units connected through a communication network 12001. In the example illustrated in FIG. 30, the vehicle control system 12000 includes a driving system control unit 12010, a body system control unit 12020, an outside-vehicle information detection unit 12030, an inside-vehicle information detection unit 12040, and an integrated control unit 12050. Furthermore, as a functional configuration of the integrated control unit 12050, a microcomputer 12051, a voice and image output unit 12052, and an in-vehicle network interface (I/F) 12053 are illustrated.

The driving system control unit 12010 controls an operation of a device related to a driving system of a vehicle according to various programs. For example, the driving system control unit 12010 functions as a control device such as a driving force generation device for generating a driving force of a vehicle such as an internal combustion engine, a driving motor, or the like, a driving force transmission mechanism for transmitting a driving force to vehicle wheels, a steering mechanism for adjusting a steering angle of the vehicle, a brake device for generating a braking force of the vehicle, or the like.

The body system control unit 12020 controls an operation of various devices mounted in a vehicle body according to various programs. For example, the body system control unit 12020 functions as a keyless entry system, a smart key system, a power window device, or a control device for various lamps such as a headlamp, a back lamp, a brake lamp, a blinker, a fog lamp, and the like. In this case, electric waves sent from a portable machine substituting for a key or a signal of various switches can be input to the body system control unit 12020. The body system control unit 12020 receives the electric waves or the signal to control a door-lock device of a vehicle, a power window device, a lamp, or the like.

The outside-vehicle information detection unit 12030 detects information regarding an outside area of a vehicle on which the vehicle control system 12000 is mounted. For example, an imaging unit 12031 is connected to the outside-vehicle information detection unit 12030. The outside-vehicle information detection unit 12030 causes the imaging unit 12031 to capture an image of an area outside the vehicle, and receives the captured image. The outside-vehicle information detection unit 12030 may perform processing of detecting an object such as a person, a car, an obstacle, a sign, a letter on a road surface, or the like, or perform distance detection processing based on the received image. Furthermore, an iToF sensor 12032 is connected to the outside-vehicle information detection unit 12030. The iToF sensor 12032 can function as the distance measurement module 1 according to the embodiment of the present disclosure.

The imaging unit 12031 is an optical sensor that receives light and outputs an electric signal corresponding to the amount of received light. The imaging unit 12031 can output the electric signal as an image, or can output the electric signal as distance measurement information. Furthermore, the light received by the imaging unit 12031 may be visible light or invisible light such as infrared rays or the like.

The inside-vehicle information detection unit 12040 detects information regarding an inside area of the vehicle. For example, a driver state detection unit 12041 detecting a state of a driver is connected to the inside-vehicle information detection unit 12040. The driver state detection unit 12041 includes, for example, a camera capturing an image of the driver, and the inside-vehicle information detection unit 12040 may calculate a degree of fatigue or a degree of concentration of the driver, or discriminate whether or not the driver is dozing off based on detection information input from the driver state detection unit 12041.

The microcomputer 12051 can calculate a target control value of a driving force generation device, a steering mechanism, or a brake device based on information regarding the inside area and the outside area of the vehicle, the information being acquired by the outside-vehicle information detection unit 12030 or the inside-vehicle information detection unit 12040, and can output a control instruction to the driving system control unit 12010. For example, the microcomputer 12051 can perform a cooperative control for the purpose of implementing functions of an advanced driver assistance system (ADAS) including vehicle collision avoidance, impact alleviation, following traveling based on an inter-vehicle distance, traveling while maintaining a vehicle speed, a vehicle collision warning, a vehicle lane departure warning, or the like.

Furthermore, the microcomputer 12051 can perform a cooperative control for the purpose of an automatic driving in which a vehicle autonomously travels without an operation by a driver by controlling a driving force generation device, a steering mechanism, a brake device, or the like based on information regarding a surrounding area of the vehicle acquired by the outside-vehicle information detection unit 12030 or the inside-vehicle information detection unit 12040, or the like.

Furthermore, the microcomputer 12051 can output a control instruction to the body system control unit 12030 based on outside-vehicle information acquired by the outside-vehicle information detection unit 12030. For example, the microcomputer 12051 can perform a cooperative control for the purpose of preventing glare by controlling a headlamp according to a position of a preceding vehicle or an oncoming vehicle detected by the outside-vehicle information detection unit 12030 to switch a high beam to a low beam, or the like.

The voice and image output unit 12052 transmits an output signal of at least one of voice or an image to an output device which is capable of visually or acoustically notifying a passenger of a vehicle or an outside area of the vehicle of information. In the example in FIG. 26, an audio speaker 12061, a display unit 12062, and an instrument panel 12063 are illustrated as the output devices. The display unit 12062 may include at least one of, for example, an on-board display or a head-up display.

Figure 31:
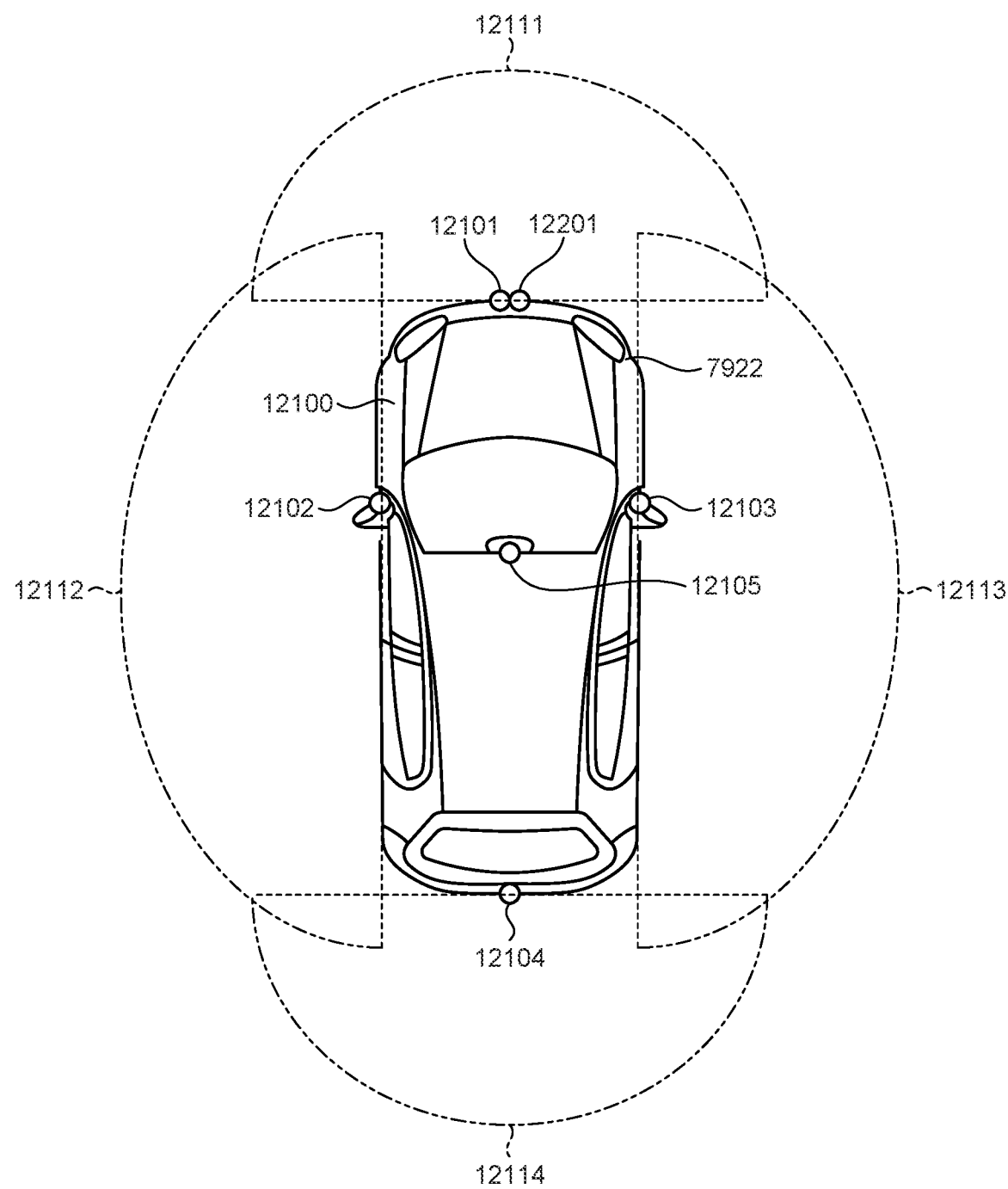
FIG. 31 is an explanatory diagram illustrating an example of installation positions of an outside-vehicle information detection unit and an imaging unit.

FIG. 31 is a diagram illustrating an example of an installation position of the imaging unit 12031.

In FIG. 31, imaging units 12101, 12102, 12103, 12104, and 12105 are included as the imaging unit 12031.

The imaging units 12101, 12102, 12103, 12104, and 12105 are provided at, for example, a front nose, side mirrors, a rear bumper, a back door, an upper portion of a windshield in a compartment, and the like of a vehicle 12100. The imaging unit 12101 provided at the front nose and the imaging unit 12105 provided at the upper portion of the windshield in the compartment mainly acquire an image of an area in front of the vehicle 12100. The imaging units 12102 and 12103 provided at the side mirrors mainly acquire images of areas on sides of the vehicle 12100. The imaging unit 12104 provided at the rear bumper or the back door mainly acquires an image of an area behind the vehicle 12100. The imaging unit 12105 provided at the upper portion of the windshield in the compartment is mainly used to detect a preceding vehicle, a pedestrian, an obstacle, a traffic light, a traffic sign, a lane, or the like. Furthermore, an iToF sensor module 12201 in which the irradiation unit 20 and the light receiving unit 30 of the distance measurement module 1 according to the embodiment of the present disclosure are built is provided, for example, at the front nose of the vehicle 12100.

Note that FIG. 31 illustrates an example of imaging ranges of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 provided at the side mirrors, respectively, and an imaging range 12114 indicates an imaging range of the imaging unit 12104 provided at the rear bumper or the back door. For example, image data captured by the imaging units 12101 to 12104 are superimposed, thereby obtaining a bird's eye view image from above the vehicle 12100.

At least one of the imaging units 12101 to 12104 may have a function of acquiring distance information. For example, at least one of the imaging units 12101 to 12104 may be a stereo camera including a plurality of imaging elements, or may be an imaging element with pixels for phase difference detection.

For example, the microcomputer 12051 can extract a three-dimensional object traveling at a predetermined speed (for example, 0 km/h or higher) in substantially the same direction as that of the vehicle 12100, particularly, the closest three-dimensional object on a traveling path of the vehicle 12100, as a preceding vehicle, by calculating a distance to each three-dimensional object in the imaging ranges 12111 to 12114, and a temporal change (a relative speed with respect to the vehicle 12100) in the distance based on the distance information acquired from the imaging units 12101 to 12104. Moreover, the microcomputer 12051 can set an inter-vehicle distance to be secured in advance for a preceding vehicle, and can perform an automatic brake control (including a following stop control), an automatic acceleration control (including a following start control), and the like. As described above, a cooperative control for the purpose of an automatic driving in which a vehicle autonomously travels without an operation by a driver, or the like, can be performed.

For example, the microcomputer 12051 can classify and extract three-dimensional object data related to a three-dimensional object as a two-wheeled vehicle, an ordinary vehicle, a large vehicle, a pedestrian, and another three-dimensional object such as a power pole, based on the distance information obtained from the imaging units 12101 to 12104, and use a result of the classification and extraction for automatic obstacle avoidance. For example, the microcomputer 12051 identifies an obstacle around the vehicle 12100 as an obstacle that is visible to the driver of the vehicle 12100 or an obstacle that is hardly visible. Then, the microcomputer 12051 determines a collision risk indicating a risk of collision with each obstacle, and in a case where the collision risk is equal to or higher than a set value and there is a possibility of collision, the microcomputer 12051 can output an alarm to the driver through the audio speaker 12061 or the display unit 12062 or perform forced deceleration or avoidance steering through the driving system control unit 12010 to perform driving assistance for collision avoidance.

At least one of the imaging units 12101 to 12104 may be an infrared camera that detects infrared rays. For example, the microcomputer 12051 can recognize a pedestrian by determining whether or not a pedestrian is present in captured images of the imaging units 12101 to 12104. Such a recognition of a pedestrian is performed through a procedure for extracting feature points in the captured images of the imaging units 12101 to 12104 that are, for example, infrared cameras, and a procedure for discriminating whether or not the object is a pedestrian by performing pattern matching processing on a series of feature points indicating an outline of the object. In a case where the microcomputer 12051 determines that a pedestrian is present in the captured images of the imaging units 12101 to 12104 and recognizes the pedestrian, the voice and image output unit 12052 controls the display unit 12062 to superimpose a rectangular contour line for emphasis on the recognized pedestrian. Furthermore, the voice and image output unit 12052 may control the display unit 12062 to display an icon or the like indicating a pedestrian at a desired position.

Hereinabove, an example of the vehicle control system to which the technology according to the present disclosure can be applied has been described. The technology according to the present disclosure can be applied to, for example, the outside-vehicle information detection unit 12030 or the imaging unit 12031 among the above-described configurations. Specifically, the light receiving element 10 or the distance measurement module 1 can be applied to a distance detection processing block of the outside-vehicle information detection unit 12030 or the imaging unit 12031. By applying the technology according to the present disclosure to the outside-vehicle information detection unit 12030 or the imaging unit 12031, a distance to an object such as a person, a car, an obstacle, a sign, or a character on a road surface can be measured with high accuracy, and the fatigue of the driver can be reduced or the safety of the driver or the vehicle can be enhanced using the obtained distance information.

14. Supplementary Description

As described above, the preferred embodiments of the present disclosure have been described in detail with reference to the accompanying drawings, but the technical scope of the present disclosure is not limited to such examples. It will be apparent to those skilled in the art to which the present disclosure pertains that various modified examples or alterations can be conceived within the scope of the technical idea described in the claims and it is naturally understood that these modified examples or alterations fall within the technical scope of the present disclosure.

Furthermore, the effects described in the present specification are merely illustrative or exemplary and are not restrictive. That is, the technology according to the present disclosure can exhibit, in addition to or in place of the above-described effects, other effects obvious to those skilled in the art from the description of the present specification.

Note that the present technology can also have the following configurations.

(1) A light receiving element comprising:
  a semiconductor substrate;
  a photoelectric conversion unit which is provided in the semiconductor substrate and converts light into electric charges;
  a first electric charge accumulation unit which is provided in the semiconductor substrate and to which the electric charges are transferred from the photoelectric conversion unit;
  a first distribution gate which is provided on a front surface of the semiconductor substrate and distributes the electric charges from the photoelectric conversion unit to the first electric charge accumulation unit;
  a second electric charge accumulation unit which is provided in the semiconductor substrate and to which the electric charges are transferred from the photoelectric conversion unit; and
  a second distribution gate which is provided on the front surface of the semiconductor substrate and distributes the electric charges from the photoelectric conversion unit to the second electric charge accumulation unit,
  wherein the first and second distribution gates each have a pair of buried gate portions buried in the semiconductor substrate.

(2) The light receiving element according to (1), wherein predetermined voltages are applied to the first and second distribution gates at different timings, respectively.

(3) The light receiving element according to (1) or (2), wherein the first and second distribution gates are provided so as to be substantially line-symmetric with respect to a center of the photoelectric conversion unit when viewed from above the front surface of the semiconductor substrate, and the first and second electric charge accumulation units are provided so as to sandwich the first and second distribution gates therebetween.

(4) The light receiving element according to (3), wherein each of the buried gate portions has a substantially rectangular shape having a longer side extending in a direction from the center of the photoelectric conversion unit toward the first or second electric charge accumulation unit, in a cross section of the light receiving element taken along the front surface of the semiconductor substrate.

(5) The light receiving element according to (3), wherein each of the buried gate portions has a substantially elliptical shape having a major axis extending in a direction from the center of the photoelectric conversion unit toward the first or second electric charge accumulation unit, in a cross section of the light receiving element taken along the front surface of the semiconductor substrate.

(6) The light receiving element according to (3), wherein each of the buried gate portions has a substantially circular shape in a cross section of the light receiving element taken along the front surface of the semiconductor substrate.

(7) The light receiving element according to (4), wherein a width between side surfaces of the pair of buried gate portions that face each other gradually increases in a thickness direction from the front surface of the semiconductor substrate toward a back surface of the semiconductor substrate that is opposite to the front surface.

(8) The light receiving element according to (4), wherein each of the buried gate portions has a tapered shape that gradually narrows in a thickness direction toward a back surface of the semiconductor substrate that is opposite to the front surface, in a cross section of the light receiving element in a direction in which the pair of buried gate portions is arranged.

(9) The light receiving element according to (4), wherein among the pair of buried gate portions, a side surface of one buried gate portion that is opposite to a side surface facing the other buried gate portion is in contact with a low dielectric layer.

(10) The light receiving element according to (9), wherein the low dielectric layer is formed of an oxide film or a nitride film.

(11) The light receiving element according to (9), wherein the low dielectric layer is an element isolation portion provided in the semiconductor substrate.

(12) The light receiving element according to (1), further comprising:
  a plurality of third electric charge accumulation units which are provided in the semiconductor substrate and to which the electric charges are transferred from the photoelectric conversion unit; and
  a plurality of third distribution gates which are provided on the front surface of the semiconductor substrate and distribute the electric charges from the photoelectric conversion unit to the plurality of third electric charge accumulation units,
  wherein each of the third distribution gates has the pair of buried gate portions buried in the semiconductor substrate.

(13) The light receiving element according to any one of (1) to (12), further comprising a moth-eye structure which is provided on a surface of the semiconductor substrate that is opposite to the front surface, and is formed with fine unevenness.

(14) The light receiving element according to any one of (1) to (13), further comprising a first pixel isolation portion which penetrates through the semiconductor substrate.

(15) The light receiving element according to any one of (1) to (13), further comprising a second pixel isolation portion which penetrates from a surface of the semiconductor substrate that is opposite to the front surface to a middle of the semiconductor substrate in a thickness direction of the semiconductor substrate.

(16) The light receiving element according to any one of (1) to (15), further comprising:
one or more floating diffusion regions which are provided in the semiconductor substrate;
a first transfer gate which is provided on the semiconductor substrate and transfers the electric charges transferred to the first electric charge accumulation unit to the one or more floating diffusion regions;
a second transfer gate which is provided on the semiconductor substrate and transfers the electric charges transferred to the second electric charge accumulation unit to the one or more floating diffusion regions;
one or more amplification transistors which amplify the electric charges transferred to the floating diffusion regions and output the amplified electric charges as a pixel signal;
one or more selection transistors which output the pixel signal according to a selection signal; and
one or more reset transistors which reset the electric charges accumulated in the floating diffusion regions.
(17) The light receiving element according to (16), wherein each of the first and second electric charge accumulation units includes a stack of an electrode, a first oxide film, and a semiconductor layer,
each of the first and second transfer gates includes a second oxide film provided between each of the first and second transfer gates and the semiconductor substrate, and
the first oxide film is thinner than the second oxide film.
(18) The light receiving element according to (17), wherein each of the amplification transistor, the selection transistor, and the reset transistor includes a third oxide film provided on the semiconductor substrate, and
the third oxide film of the amplification transistor is thinner than the third oxide films of the selection transistor and the reset transistor.
(19) The light receiving element according to any one of (1) to (15), wherein each of the first and second electric charge accumulation units includes a stack of an electrode, a first oxide film, and a semiconductor layer, and
a thickness of the first oxide film is 5.0 nm or less.
(20) The light receiving element according to (16), wherein each of the first and second electric charge accumulation units includes a stack of an electrode, a first insulating film, and a semiconductor layer,
each of the first and second transfer gates includes a second insulating film provided between each of the first and second transfer gates and the semiconductor substrate, and
a relative permittivity of the first insulating film is higher than a relative permittivity of the second insulating film.
(21) The light receiving element according to (20), wherein each of the amplification transistor, the selection transistor, and the reset transistor includes a third insulating film provided on the semiconductor substrate, and
a relative permittivity of the third insulating film of the amplification transistor is higher than a relative permittivity of each of the third insulating films of the selection transistor and the reset transistor.
(22) The light receiving element according to any one of (1) to (15), wherein each of the first and second electric charge accumulation units includes a stack of an electrode, a first insulating film, and a semiconductor layer, and
a relative permittivity of the first insulating film is 4 or more.
(23) A light receiving device comprising:
one or more light receiving elements,
wherein the light receiving element includes:
a semiconductor substrate;
a photoelectric conversion unit which is provided in the semiconductor substrate and converts light into electric charges;
a first electric charge accumulation unit which is provided in the semiconductor substrate and to which the electric charges are transferred from the photoelectric conversion unit;
a first distribution gate which is provided on a front surface of the semiconductor substrate and distributes the electric charges from the photoelectric conversion unit to the first electric charge accumulation unit;
a second electric charge accumulation unit which is provided in the semiconductor substrate and to which the electric charges are transferred from the photoelectric conversion unit; and
a second distribution gate which is provided on the front surface of the semiconductor substrate and distributes the electric charges from the photoelectric conversion unit to the second electric charge accumulation unit, and
the first and second distribution gates each have a pair of buried gate portions buried in the semiconductor substrate.
(24) The light receiving device according to (23), further comprising:
an irradiation unit which irradiate a target object with light while periodically changing brightness; and
an irradiation control unit which controls the irradiation unit,
wherein the photoelectric conversion unit receives reflected light from the target object.

REFERENCE SIGNS LIST

1 DISTANCE MEASUREMENT MODULE
10 LIGHT RECEIVING ELEMENT
12 PIXEL ARRAY UNIT
20 IRRADIATION UNIT
30 LIGHT RECEIVING UNIT
32 VERTICAL DRIVE CIRCUIT UNIT
34 COLUMN SIGNAL PROCESSING CIRCUIT UNIT
36 HORIZONTAL DRIVE CIRCUIT UNIT
38 OUTPUT CIRCUIT UNIT
40 CONTROL UNIT
42 PIXEL DRIVE WIRING
44 CONTROL CIRCUIT UNIT
46 HORIZONTAL SIGNAL LINE
48 VERTICAL SIGNAL LINE
50 DISTRIBUTION TRANSISTOR DRIVING UNIT
52 SIGNAL PROCESSING UNIT
54 DATA STORAGE UNIT
60 PROCESSING UNIT
100, 102, 102a, 102b, 104a, 104b, 106a, 106b, 108a, 108b, 110a, 110b, 112a, 112b, 114a, 114b, 116a, 116b N-TYPE SEMICONDUCTOR REGION
150a, 150b, 152a, 152b, 156a, 156b, 158a, 158b, 160a, 160b, 162a, 162b GATE ELECTRODE
154a, 154b, 306, 406 ELECTRODE
170a, 170b, 174a, 174b BURIED GATE PORTION
172a, 172b, 176a, 176b, 178 LOW DIELECTRIC LAYER
200 SEMICONDUCTOR SUBSTRATE
202 ANTIREFLECTION FILM
202a MOTH-EYE STRUCTURE
204 PLANARIZATION FILM
206 LIGHT SHIELDING FILM
208 ON-CHIP LENS
210, 210a PIXEL ISOLATION PORTION
300 WIRING LAYER 302, 402, 720, 720a, 740 INSULATING FILM
304, 404 METAL FILM
400 SUBSTRATE
500 THERMALLY OXIDIZED SILICON LAYER
502 SILICON NITRIDE LAYER
504 SILICON OXIDE LAYER
506, 508 RESIST
510, 512 TRENCH
600, 602 CENTER LINE
700 PERIPHERY
710 VIA
730 SIDEWALL
800 TARGET OBJECT
802a, 802b REGION
900 SMARTPHONE
901 CPU
902 ROM
903 RAM
904 STORAGE DEVICE
905 COMMUNICATION MODULE
907 SENSOR MODULE
908 DISTANCE MEASUREMENT MODULE
909 IMAGING DEVICE
910 DISPLAY DEVICE
911 SPEAKER
912 MICROPHONE
913 INPUT DEVICE
AMP, AMP1, AMP2 AMPLIFICATION TRANSISTOR
FD, FD1, FD2 FLOATING DIFFUSION REGION
MEM, MEM1, MEM2 ELECTRIC CHARGE ACCUMULATION UNIT
O CENTER POINT
OFG, OFG1, OFG2 ELECTRIC CHARGE DRAIN TRANSISTOR
PD PHOTODIODE
RST, RST1, RST2 RESET TRANSISTOR
SEL, SEL1, SEL2 SELECTION TRANSISTOR
TG, TG1, TG2 TRANSFER TRANSISTOR
VDD POWER SUPPLY POTENTIAL
VG, VG1, VG2 DISTRIBUTION TRANSISTOR
VSL, VSL1, VSL2 SIGNAL LINE

The invention claimed is:

1. A light receiving element, comprising:
a semiconductor substrate;
a photoelectric conversion unit that is provided in the semiconductor substrate and that converts light into electric charges;
a first electric charge accumulation unit that is provided in the semiconductor substrate and to which the electric charges are transferred from the photoelectric conversion unit to the first charge accumulation unit;
a first distribution gate that is provided on a front surface of the semiconductor substrate and that distributes the electric charges from the photoelectric conversion unit to the first electric charge accumulation unit;
a second electric charge accumulation unit that is provided in the semiconductor substrate and to which the electric charges are transferred from the photoelectric conversion unit; and
a second distribution gate that is provided on the front surface of the semiconductor substrate and that distributes the electric charges from the photoelectric conversion unit to the second electric charge accumulation unit,
wherein the first and second distribution gates each have a pair of buried gate portions buried in the semiconductor substrate,
wherein the first and second distribution gates are provided so as to be substantially line-symmetric with respect to a center of the photoelectric conversion unit when viewed from above the front surface of the semiconductor substrate,
wherein the first and second electric charge accumulation units are provided so as to sandwich the first and second distribution gates therebetween,
wherein each of the buried gate portions has a substantially rectangular shape having a longer side extending in a direction from the center of the photoelectric conversion unit toward the first or second electric charge accumulation unit, in a cross section of the light receiving element taken along the front surface of the semiconductor substrate, and
wherein among the pair of buried gate portions, a side surface of one buried gate portion that is opposite to a side surface facing the other buried gate portion is in contact with a low dielectric layer.

2. The light receiving element according to claim 1, wherein predetermined voltages are applied to the first and second distribution gates at different timings, respectively.

3. The light receiving element according to claim 1, further comprising:
a plurality of third electric charge accumulation units which are provided in the semiconductor substrate and to which the electric charges are transferred from the photoelectric conversion unit; and
a plurality of third distribution gates which are provided on the front surface of the semiconductor substrate and distribute the electric charges from the photoelectric conversion unit to the plurality of third electric charge accumulation units,
wherein each of the third distribution gates has the pair of buried gate portions buried in the semiconductor substrate.

4. The light receiving element according to claim 1, further comprising a moth-eye structure that is provided on a surface of the semiconductor substrate that is opposite to the front surface, and that is formed with fine unevenness.

5. The light receiving element according to claim 1, further comprising a first pixel isolation portion which penetrates through the semiconductor substrate.

6. The light receiving element according to claim 1, further comprising a second pixel isolation portion which penetrates from a surface of the semiconductor substrate that is opposite to the front surface to a middle of the semiconductor substrate in a thickness direction of the semiconductor substrate.

7. The light receiving element according to claim 1, further comprising:
one or more floating diffusion regions which are provided in the semiconductor substrate;
a first transfer gate which is provided on the semiconductor substrate and transfers the electric charges transferred to the first electric charge accumulation unit to the one or more floating diffusion regions;
a second transfer gate which is provided on the semiconductor substrate and transfers the electric charges transferred to the second electric charge accumulation unit to the one or more floating diffusion regions;
one or more amplification transistors which amplify the electric charges transferred to the floating diffusion regions and output the amplified electric charges as a pixel signal;
one or more selection transistors which output the pixel signal according to a selection signal; and one or more reset transistors which reset the electric charges accumulated in the floating diffusion regions.

8. The light receiving element according to claim 1, wherein each of the first and second electric charge accumulation units includes a stack of an electrode, a first oxide film, and a semiconductor layer, and
wherein a thickness of the first oxide film is 5.0 nm or less.

9. The light receiving element according to claim 1, wherein each of the first and second electric charge accumulation units includes a stack of an electrode, a first insulating film, and a semiconductor layer, and
wherein a relative permittivity of the first insulating film is 4 or more.

10. The light receiving element according to claim 1, wherein the low dielectric layer is formed of an oxide film or a nitride film.

11. The light receiving element according to claim 1, wherein the low dielectric layer is an element isolation portion provided in the semiconductor substrate.

12. A light receiving element, comprising:
a semiconductor substrate;
a photoelectric conversion unit that is provided in the semiconductor substrate and that converts light into electric charges;
a first electric charge accumulation unit that is provided in the semiconductor substrate and to which the electric charges are transferred from the photoelectric conversion unit to the first charge accumulation unit;
a first distribution gate that is provided on a front surface of the semiconductor substrate and that distributes the electric charges from the photoelectric conversion unit to the first electric charge accumulation unit;
a second electric charge accumulation unit that is provided in the semiconductor substrate and to which the electric charges are transferred from the photoelectric conversion unit;
a second distribution gate that is provided on the front surface of the semiconductor substrate and that distributes the electric charges from the photoelectric conversion unit to the second electric charge accumulation unit,
wherein the first and second distribution gates each have a pair of buried gate portions buried in the semiconductor substrate;
one or more floating diffusion regions that are provided in the semiconductor substrate;
a first transfer gate that is provided on the semiconductor substrate and that transfers the electric charges transferred to the first electric charge accumulation unit to the one or more floating diffusion regions;
a second transfer gate that is provided on the semiconductor substrate and that transfers the electric charges transferred to the second electric charge accumulation unit to the one or more floating diffusion regions;
one or more amplification transistors that amplify the electric charges transferred to the floating diffusion regions and that output the amplified electric charges as a pixel signal;
one or more selection transistors that output the pixel signal according to a selection signal; and
one or more reset transistors that reset the electric charges accumulated in the floating diffusion regions,
wherein each of the first and second electric charge accumulation units includes a stack of an electrode, a first oxide film, and a semiconductor layer,
wherein each of the first and second transfer gates includes a second oxide film provided between each of the first and second transfer gates and the semiconductor substrate, and
wherein the first oxide film is thinner than the second oxide film.

13. The light receiving element according to claim 12, wherein each of the amplification transistor, the selection transistor, and the reset transistor includes a third oxide film provided on the semiconductor substrate, and
the third oxide film of the amplification transistor is thinner than the third oxide films of the selection transistor and the reset transistor.

14. The light receiving element according to claim 12, wherein the first and second distribution gates are provided so as to be substantially line-symmetric with respect to a center of the photoelectric conversion unit when viewed from above the front surface of the semiconductor substrate, and
wherein the first and second electric charge accumulation units are provided so as to sandwich the first and second distribution gates therebetween.

15. The light receiving element according to claim 14, wherein each of the buried gate portions has a substantially rectangular shape having a longer side extending in a direction from the center of the photoelectric conversion unit toward the first or second electric charge accumulation unit, in a cross section of the light receiving element taken along the front surface of the semiconductor substrate.

16. The light receiving element according to claim 15, wherein a width between side surfaces of the pair of buried gate portions that face each other gradually increases in a thickness direction from the front surface of the semiconductor substrate toward a back surface of the semiconductor substrate that is opposite to the front surface.

17. The light receiving element according to claim 15, wherein each of the buried gate portions has a tapered shape that gradually narrows in a thickness direction toward a back surface of the semiconductor substrate that is opposite to the front surface, in a cross section of the light receiving element in a direction in which the pair of buried gate portions is arranged.

18. The light receiving element according to claim 15, wherein among the pair of buried gate portions, a side surface of one buried gate portion that is opposite to a side surface facing the other buried gate portion is in contact with a low dielectric layer.

19. The light receiving element according to claim 18, wherein the low dielectric layer is formed of an oxide film or a nitride film.

20. The light receiving element according to claim 18, wherein the low dielectric layer is an element isolation portion provided in the semiconductor substrate.

21. The light receiving element according to claim 14, wherein each of the buried gate portions has a substantially elliptical shape having a major axis extending in a direction from the center of the photoelectric conversion unit toward the first or second electric charge accumulation unit, in a cross section of the light receiving element taken along the front surface of the semiconductor substrate.

22. The light receiving element according to claim 14, wherein each of the buried gate portions has a substantially circular shape in a cross section of the light receiving element taken along the front surface of the semiconductor substrate.

23. The light receiving element according to claim 12, further comprising a moth-eye structure that is provided on a surface of the semiconductor substrate that is opposite to the front surface, and that is formed with fine unevenness.

24. A light receiving element, comprising:
- a semiconductor substrate;
- a photoelectric conversion unit that is provided in the semiconductor substrate and that converts light into electric charges;
- a first electric charge accumulation unit that is provided in the semiconductor substrate and to which the electric charges are transferred from the photoelectric conversion unit to the first charge accumulation unit;
- a first distribution gate that is provided on a front surface of the semiconductor substrate and that distributes the electric charges from the photoelectric conversion unit to the first electric charge accumulation unit;
- a second electric charge accumulation unit that is provided in the semiconductor substrate and to which the electric charges are transferred from the photoelectric conversion unit; and
- a second distribution gate that is provided on the front surface of the semiconductor substrate and that distributes the electric charges from the photoelectric conversion unit to the second electric charge accumulation unit,
- wherein the first and second distribution gates each have a pair of buried gate portions buried in the semiconductor substrate;
- one or more floating diffusion regions that are provided in the semiconductor substrate;
- a first transfer gate that is provided on the semiconductor substrate and that transfers the electric charges transferred to the first electric charge accumulation unit to the one or more floating diffusion regions;
- a second transfer gate that is provided on the semiconductor substrate and that transfers the electric charges transferred to the second electric charge accumulation unit to the one or more floating diffusion regions;
- one or more amplification transistors that amplify the electric charges transferred to the floating diffusion regions and that output the amplified electric charges as a pixel signal;
- one or more selection transistors that output the pixel signal according to a selection signal; and
- one or more reset transistors that reset the electric charges accumulated in the floating diffusion regions,
- wherein each of the first and second electric charge accumulation units includes a stack of an electrode, a first insulating film, and a semiconductor layer,
- wherein each of the first and second transfer gates includes a second insulating film provided between each of the first and second transfer gates and the semiconductor substrate, and
- wherein a relative permittivity of the first insulating film is higher than a relative permittivity of the second insulating film.

25. The light receiving element according to claim 24, wherein each of the amplification transistor, the selection transistor, and the reset transistor includes a third insulating film provided on the semiconductor substrate, and
- wherein a relative permittivity of the third insulating film of the amplification transistor is higher than a relative permittivity of each of the third insulating films of the selection transistor and the reset transistor.

* * * * *